(12) United States Patent
Lee et al.

(10) Patent No.: US 11,711,918 B2
(45) Date of Patent: Jul. 25, 2023

(54) SEMICONDUCTOR MEMORY DEVICE AND METHOD FOR FABRICATING THEREOF

(71) Applicant: Samsung Electronics Co., Ltd., Suwon-si (KR)

(72) Inventors: Kyung Hwan Lee, Hwaseong-si (KR); Yong Seok Kim, Suwon-si (KR); Hyun Cheol Kim, Seoul (KR); Satoru Yamada, Yongin-si (KR); Sung Won Yoo, Hwaseong-si (KR); Jae Ho Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 17/227,793

(22) Filed: Apr. 12, 2021

(65) Prior Publication Data

US 2021/0335798 A1    Oct. 28, 2021

(30) Foreign Application Priority Data

Apr. 28, 2020   (KR) .......................... 10-2020-0051154

(51) Int. Cl.
*H10B 41/70*   (2023.01)
*H10B 41/20*   (2023.01)
(Continued)

(52) U.S. Cl.
CPC ............ *H10B 41/70* (2023.02); *H10B 41/20* (2023.02); *H10B 41/35* (2023.02); *H10B 41/41* (2023.02); *H10B 41/50* (2023.02)

(58) Field of Classification Search
CPC ........... H01L 27/1156; H01L 27/11524; H01L 27/11529; H01L 27/11548; H01L 27/11551; H01L 29/0676; H01L 27/1052; H01L 27/1027; H01L 29/7455; H01L 27/11563; H01L 27/11568; H01L 27/11578; H01L 29/42308; H01L 29/74; H10B 41/70; H10B 41/20; H10B 41/35;
(Continued)

(56) References Cited

U.S. PATENT DOCUMENTS 6,735,113 B2   5/2004   Yoon et al.
7,897,440 B1   3/2011   Horch
(Continued)

*Primary Examiner* — Allison Bernstein
(74) *Attorney, Agent, or Firm* — Harness, Dickey & Pierce, P.L.C.

(57) ABSTRACT

Provided is a semiconductor memory device. The semiconductor memory device comprises a first semiconductor pattern including a first impurity region, a second impurity region, and a channel region, the first impurity region spaced apart from a substrate in a first direction and having a first conductivity type, the second impurity region having a second conductivity type different from the first conductivity type, and the channel region between the first impurity region and the second impurity region, a first conductive connection line connected to the first impurity region and extending in a second direction different from the first direction and a first gate structure extending in the first direction and including a first gate electrode and a first gate insulating film, wherein the first gate electrode penetrates the channel region and the first gate insulating film is between the first gate electrode and the semiconductor pattern.

20 Claims, 78 Drawing Sheets

(51) Int. Cl.
*H10B 41/35* (2023.01)
*H10B 41/41* (2023.01)
*H10B 41/50* (2023.01)

(58) Field of Classification Search
CPC ........ H10B 41/41; H10B 41/50; H10B 99/00; H10B 43/00; H10B 43/20; H10B 43/30
See application file for complete search history.

(56) References Cited

U.S. PATENT DOCUMENTS

| | | |
|---|---|---|
| 8,288,795 B2 | 10/2012 | Tang |
| 8,598,621 B2 | 12/2013 | Tang |
| 8,609,492 B2 | 12/2013 | Beigel et al. |
| 8,962,465 B2 | 2/2015 | Pozzi et al. |
| 9,306,063 B2 | 4/2016 | Doyle et al. |
| 9,691,465 B2 | 6/2017 | Nemati et al. |
| 10,332,886 B2 | 6/2019 | Luan et al. |
| 10,468,414 B2 * | 11/2019 | Kim .................. H01L 29/74 |
| 10,700,069 B2 * | 6/2020 | Luan .................. H01L 29/1012 |
| 2020/0227418 A1 * | 7/2020 | Kim .................. H01L 27/10844 |
| 2022/0139948 A1 * | 5/2022 | Lee .................. H01L 29/40117 |
| | | 257/324 |

* cited by examiner

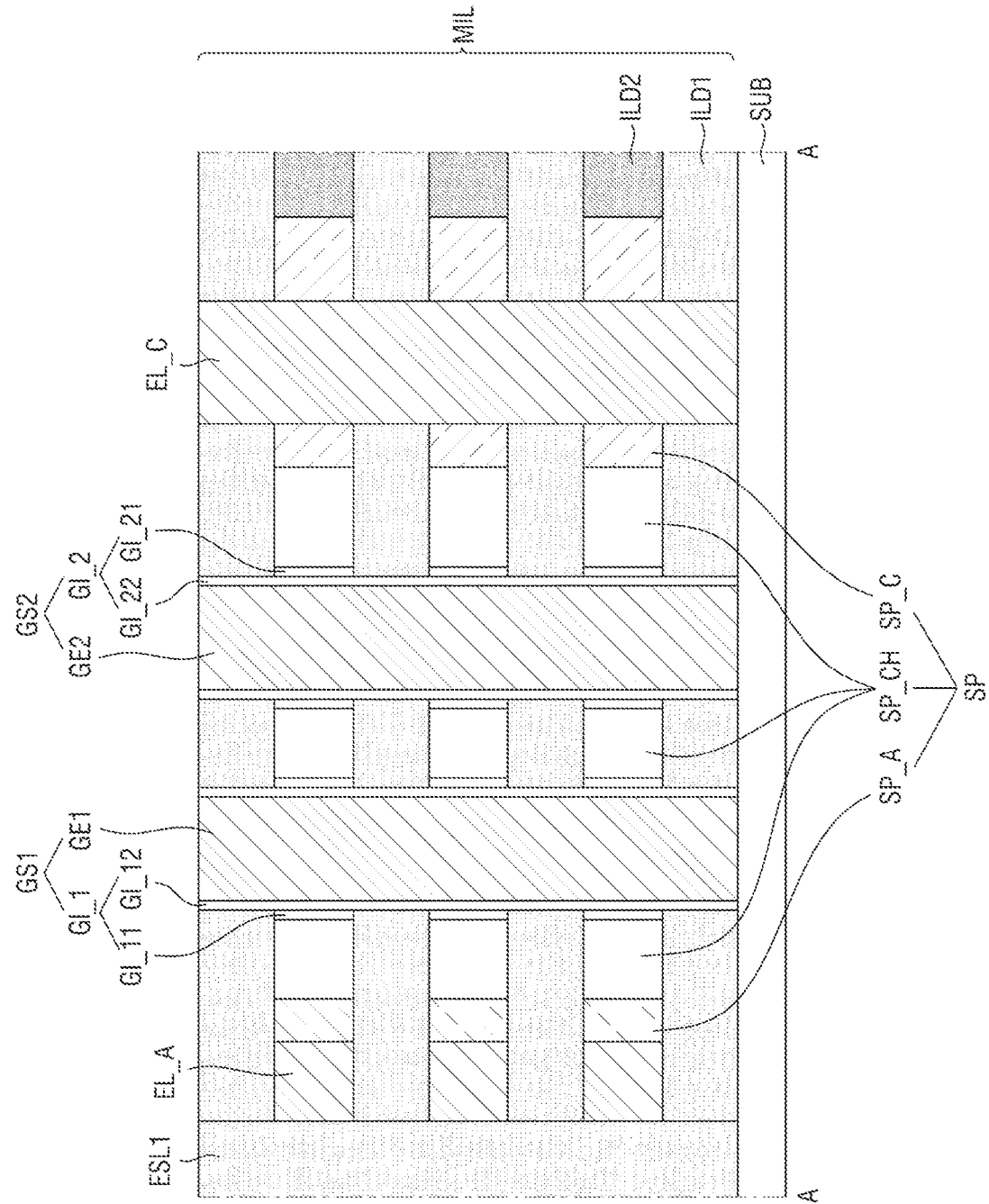

FIG. 39A
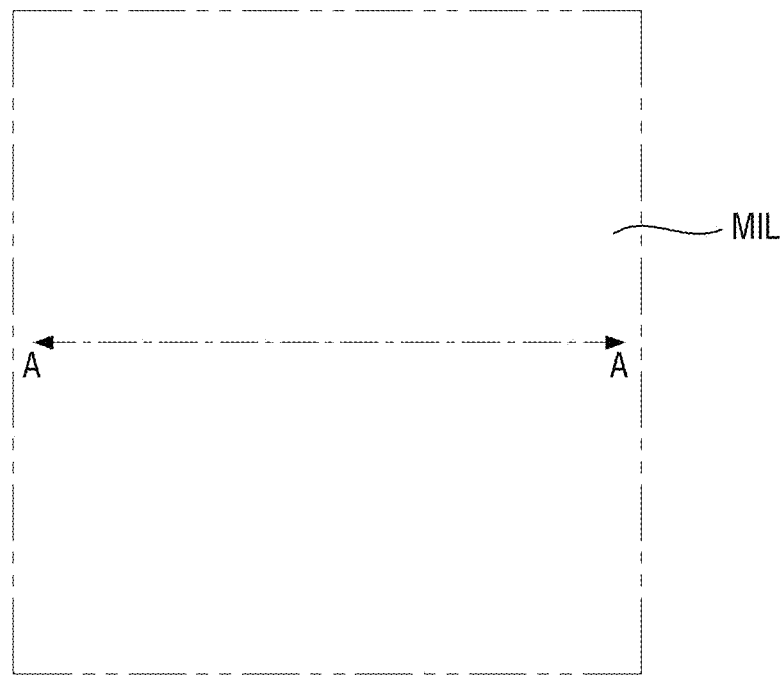
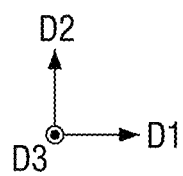

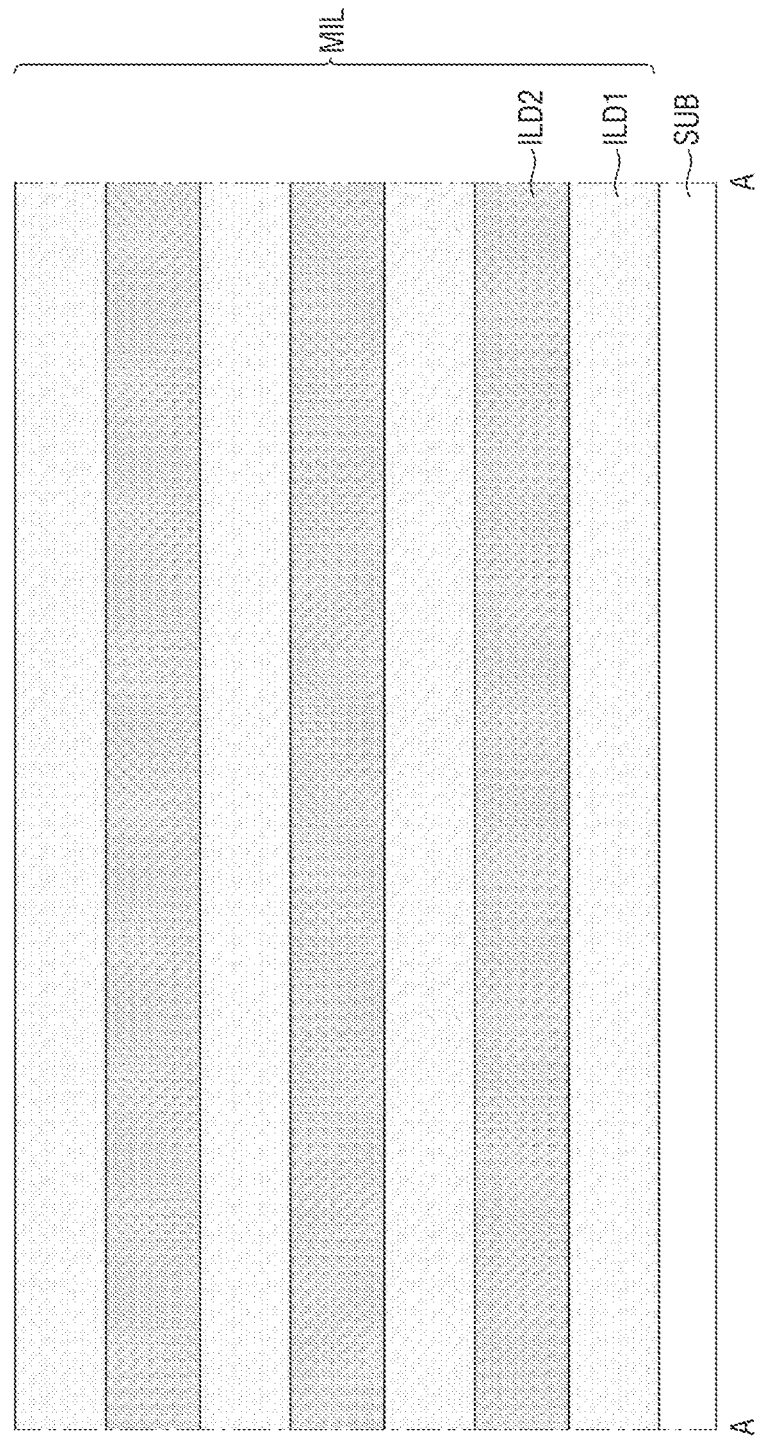

FIG. 40A
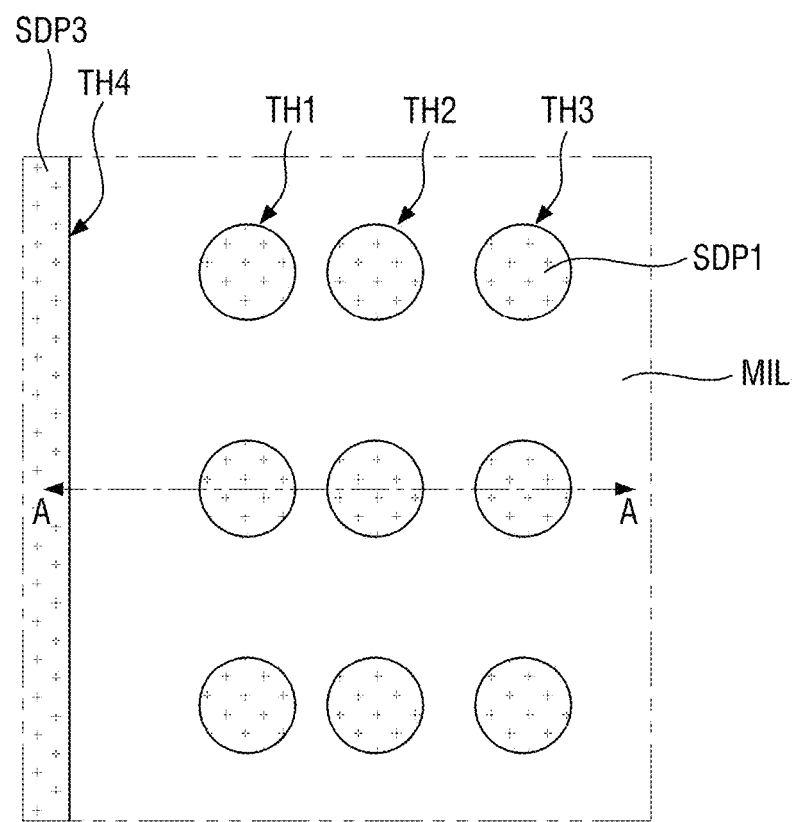
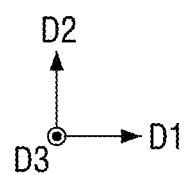

FIG. 49A
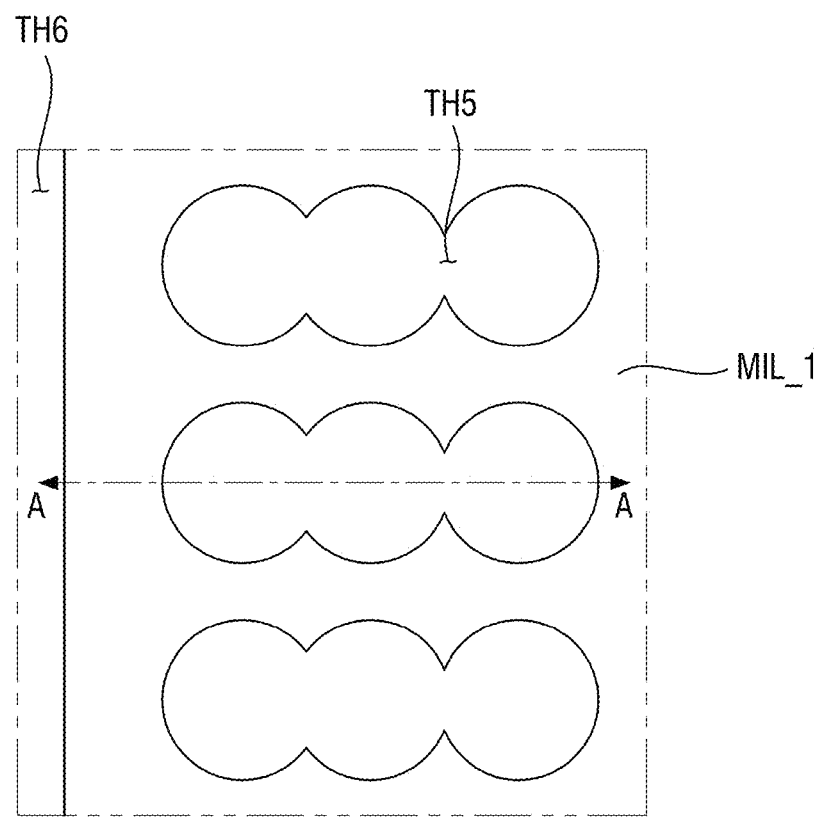
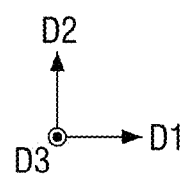

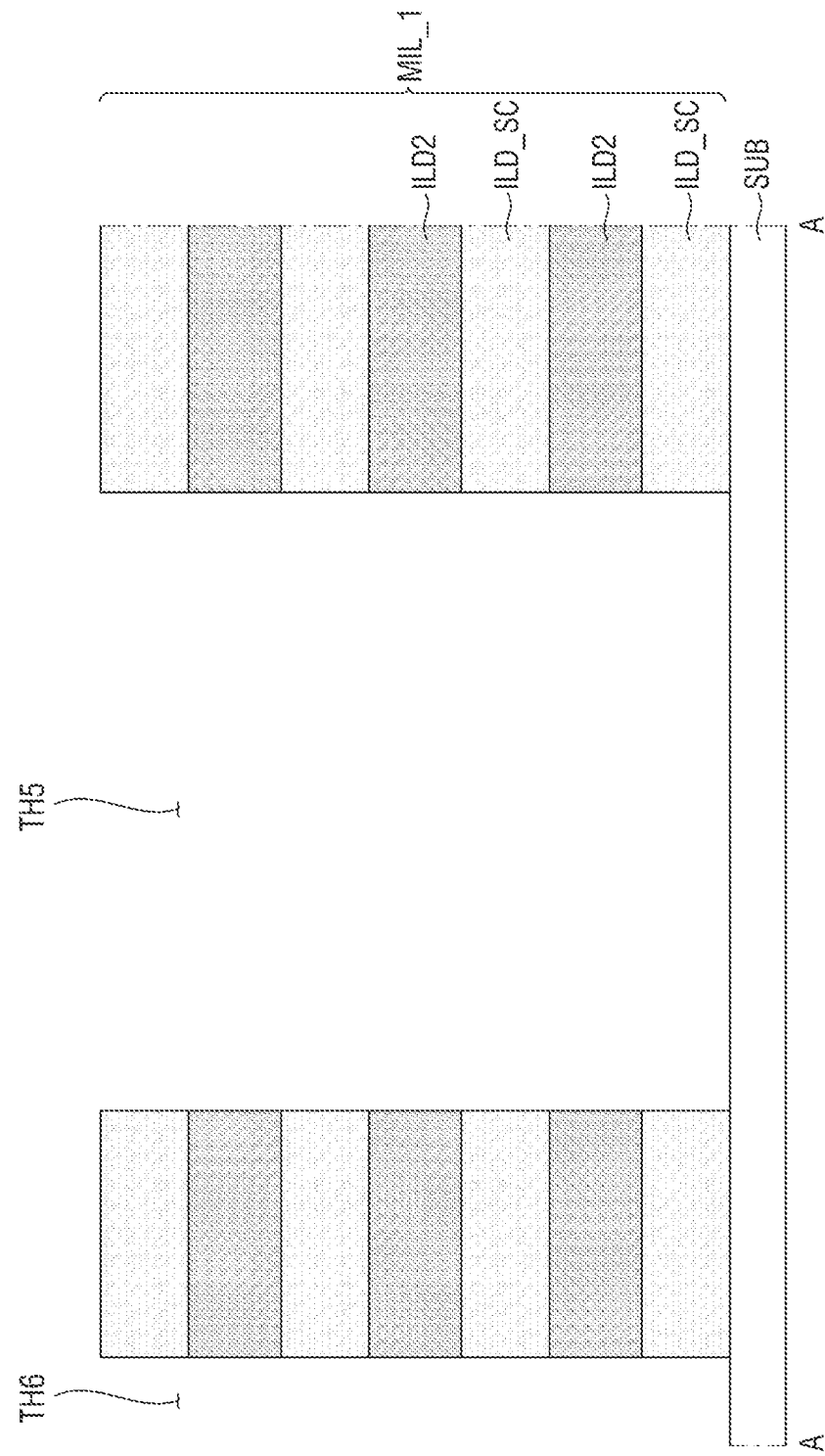

FIG. 52A
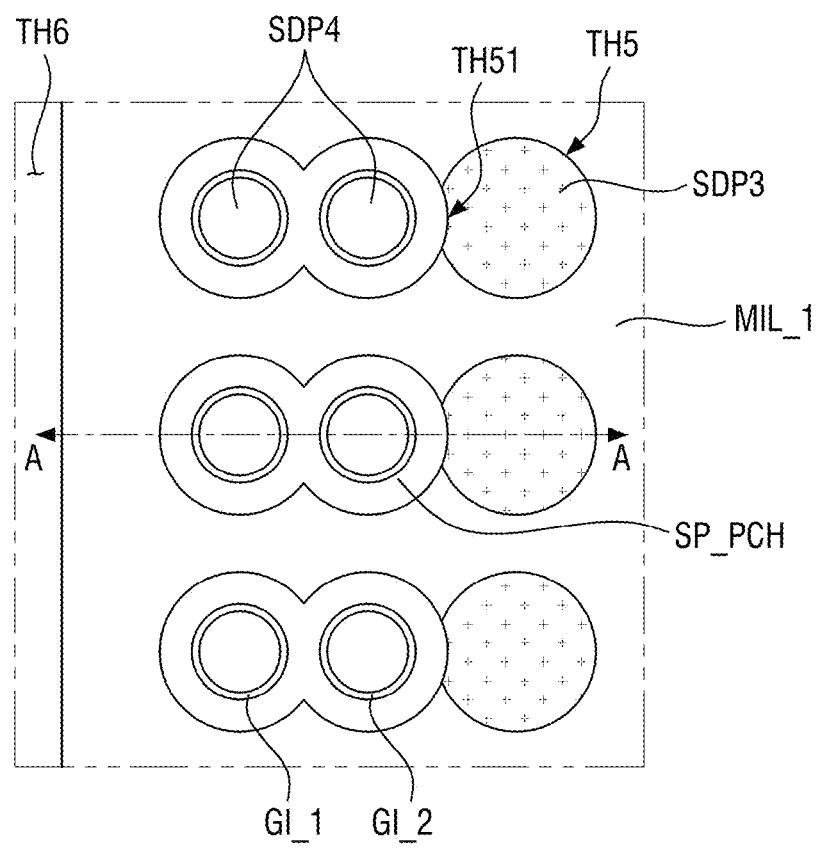
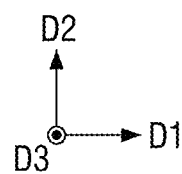

FIG. 55A
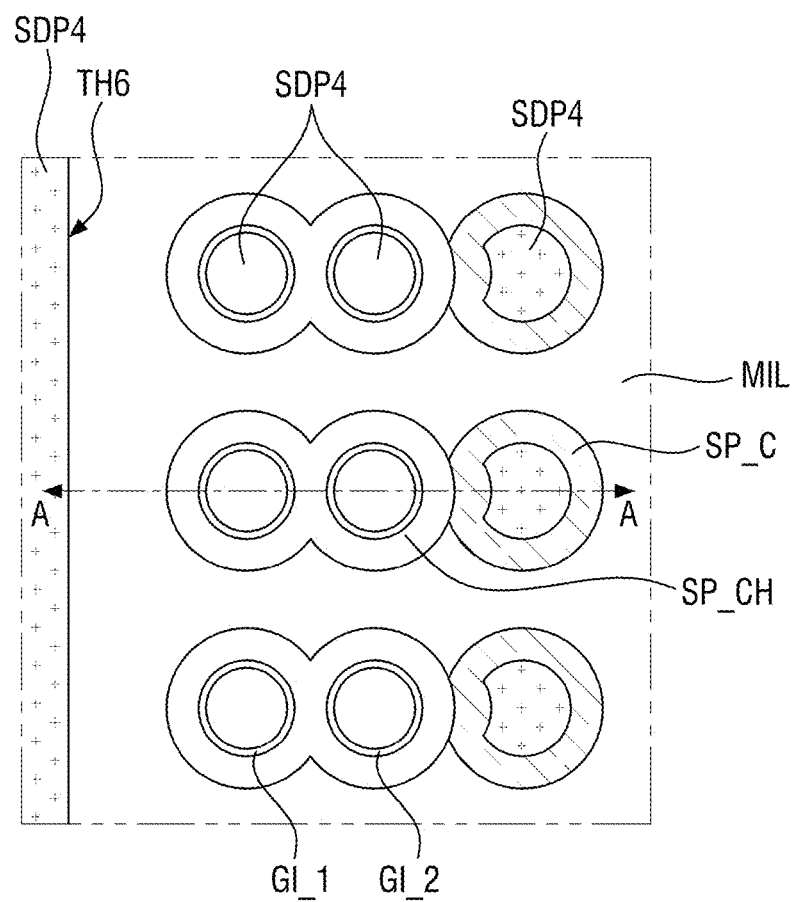
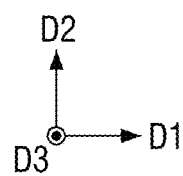

FIG. 56A
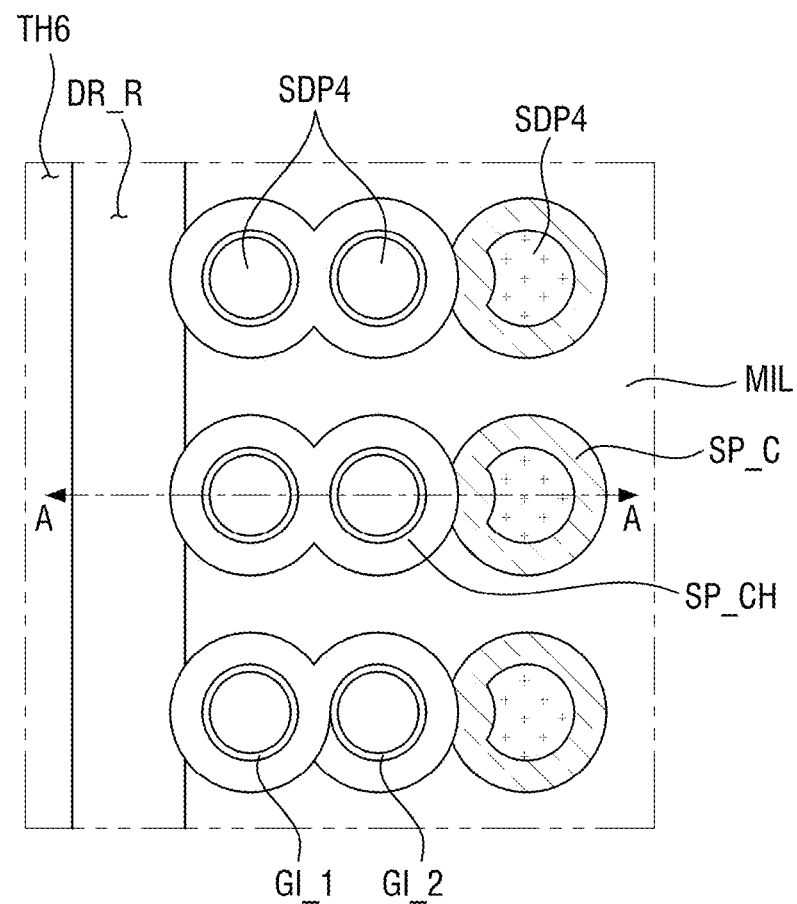
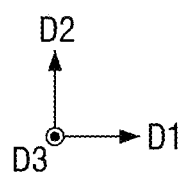

FIG. 58
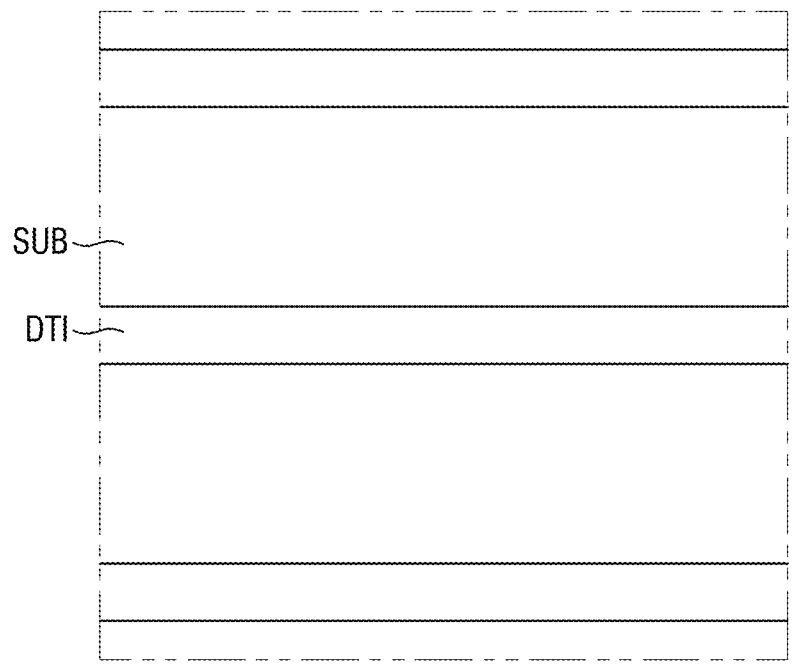
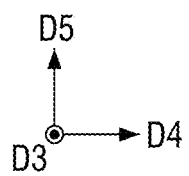

SEMICONDUCTOR MEMORY DEVICE AND METHOD FOR FABRICATING THEREOF

CROSS-REFERENCE TO RELATED APPLICATIONS

This U.S. nonprovisional application claims priority under 35 U.S.C § 119 to Korean Patent Application No. 10-2020-0051154 filed on Apr. 28, 2020 in the Korean Intellectual Property Office, the disclosure of which is hereby incorporated by reference in its entirety.

BACKGROUND

Example embodiments relate to a semiconductor memory device and/or a method for fabricating the same, and more particularly, to a three-dimensional semiconductor memory device having improved electrical characteristics and/or a method for fabricating the same.

In order to fulfill expected performance and low price required by consumers, increasing a degree of integration of semiconductor elements is required/pursued. In the case of semiconductor elements, since the degree of integration is an important factor that determines the price of a product, an especially increased degree of integration is required/pursued.

In the case of a conventional two-dimensional, or planar, semiconductor element, since the degree of integration thereof is mainly determined by an area occupied by a unit memory cell, the degree of integration is greatly affected by a level of fine pattern forming technique. However, since there is a need for very high-priced apparatuses such as photolithography tools for miniaturization of the pattern, the degree of integration of two-dimensional semiconductor elements is increasing, but is still limited. Accordingly, three-dimensional semiconductor memory elements having memory cells arranged three-dimensionally are being proposed.

SUMMARY

Some example embodiments provide a three-dimensional semiconductor memory device having improved electrical characteristics and/or reliability.

Alternatively or additionally, some example embodiments provide a method for fabricating a three-dimensional semiconductor memory device having improved electrical characteristics and/or reliability.

However, example embodiments are not restricted to the one set forth herein. The above and other aspects of example embodiments will become more apparent to one of ordinary skill in the art to which example embodiments pertains by referencing the detailed description of example embodiments given below.

According to some example embodiments, there is provided a semiconductor memory device comprising a first semiconductor pattern including a first impurity region, a second impurity region, and a channel region, the first impurity region spaced apart from a substrate in a first direction and having a first conductivity type, the second impurity region having a second conductivity type different from the first conductivity type, and the channel region between the first impurity region and the second impurity region, a first conductive connection line connected to the first impurity region and extending in a second direction different from the first direction, and a first gate structure extending in the first direction and including a first gate electrode and a first gate insulating film. The first gate electrode penetrates the channel region, and the first gate insulating film is between the first gate electrode and the semiconductor pattern.

According to some example embodiments, there is provided a semiconductor memory device comprising a semiconductor pattern including a first impurity region, a second impurity region, and a channel region, the first impurity region spaced apart from a substrate in a first direction and having a first conductivity type, the second impurity region having a second conductivity type different from the first conductivity type, and the channel region between the first impurity region and the second impurity region, a first conductive connection line connected to the first impurity region and extending in a second direction different from the first direction, and a second conductive connection electrode extending in the first direction, penetrating the second impurity region, and contacting the semiconductor pattern.

According to some example embodiments, there is provided a semiconductor memory device comprising a peripheral circuit region on a substrate, and a cell array region stacked on the peripheral circuit region in a first direction. The peripheral circuit region includes a peripheral circuit configured to control the cell array region. The cell array region includes a plurality of semiconductor patterns stacked on the substrate in the first direction, each of the semiconductor patterns includes a first impurity region having a first conductivity type, a second impurity region having a second conductivity type different from the first conductivity type, and a channel region between the first impurity region and the second impurity region, a first conductive connection line connected to the first impurity region and extending in a second direction different from the first direction, and a first gate structure extending in the first direction and including a gate electrode and a gate insulating film. Each of the first conductive connection line and the gate electrode contacting peripheral circuit, and the gate electrode penetrating the channel region.

According to some example embodiments, there is provided a semiconductor memory device comprising a first impurity region having a first conductivity type, a second impurity region having a second conductivity type different from the first conductivity type, a channel region defined between the first impurity region and the second impurity region, a first gate structure including a first gate electrode and a first gate insulating film, and extending long in a first direction, the first gate structure between the first impurity region and the second impurity region, the first gate insulating film wrapping a periphery of the first gate electrode between the channel region and the first gate electrode, and a first conductive connection line extending in a second direction different from the first direction, and being in contact with the first impurity region. The channel region surrounds at least a part of the first gate structure.

According to some example embodiments, there is provided a method for fabricating a semiconductor memory device, the method comprising forming a mold structure including a plurality of vertically stacked mold layers on a substrate, each mold layer including a first insulating film and a second insulating film, forming first to third holes having a contact form, the first to third holes penetrating the mold structure and sequentially arranged in the first direction, and a fourth hole having a line form extending long in a second direction different from the first direction, the fourth hole being adjacent to the first hole, partially etching the second insulating film exposed by the first hole and the second hole to form a channel recess, forming a gate insulating film and a channel region which fill the channel recess and include a semiconductor material, partially etching the second insulating film exposed by the third hole to form a source recess, forming a first impurity region which fills the source recess and includes a semiconductor material having a first conductivity type, partially etching the second insulating film exposed by the fourth hole to form a drain recess for exposing the channel region, forming a second impurity region which fills a part of the drain recess and includes a semiconductor material having a second conductivity type different from the first conductivity type, and forming a gate electrode which fills the first hole and the second hole, a first conductive connection line which contacts the first impurity region and fills the third hole, and a second conductive connection line which contacts the second impurity region and fills the rest of the drain recess.

BRIEF DESCRIPTION OF THE DRAWINGS

The above and other aspects and features of example embodiments will become more apparent by describing in detail embodiments thereof with reference to the attached drawings, in which:

FIGS. 8A and 8B are diagrams for explaining the semiconductor memory device according to some example embodiments;

FIGS. 39A to 48 are intermediate stage diagrams for explaining a method for fabricating a semiconductor memory device according to some example embodiments;

FIGS. 49A to 57B are intermediate stage diagrams for explaining the method for fabricating a semiconductor memory device according to some example embodiments; and FIGS. 58 to 63 are intermediate stage diagrams for explaining the method for fabricating a semiconductor memory device according to some example embodiments.

DETAILED DESCRIPTION OF EXAMPLE EMBODIMENTS

Figure 1A:
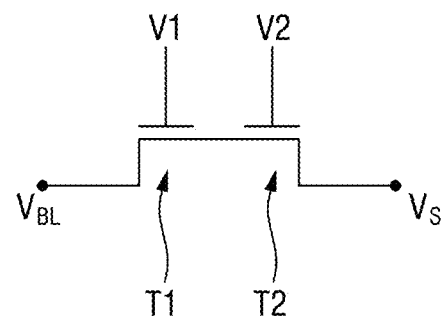
FIGS. 1A and 1B are circuit diagrams of unit cells of a semiconductor memory device according to some example embodiments.
Figure 1B:
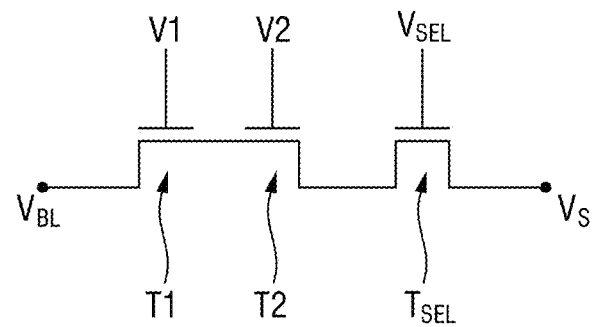
Figure 2:
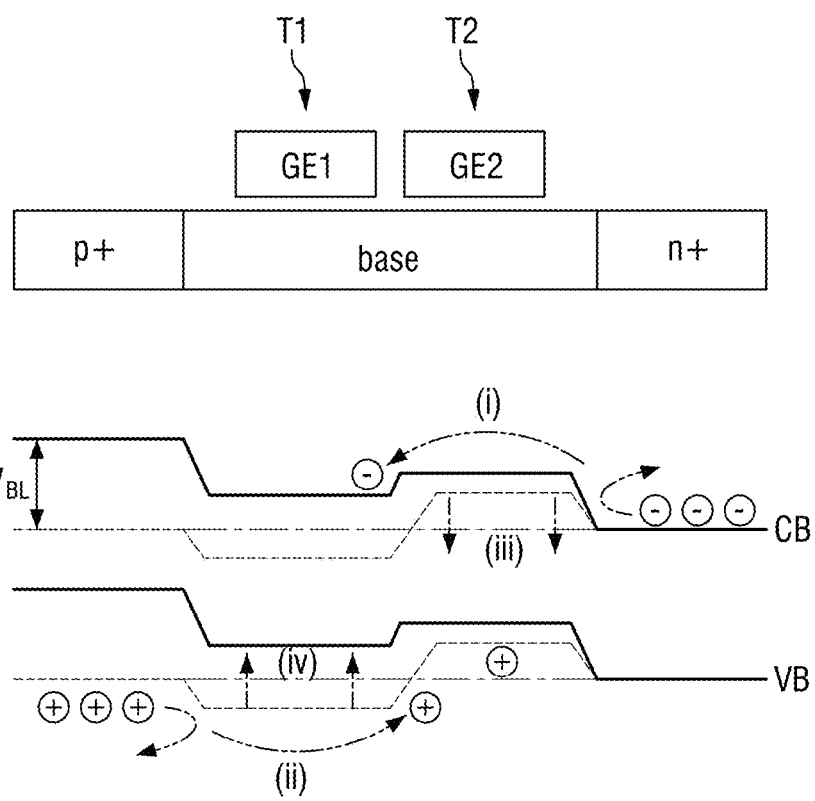
FIG. 2 is a diagram for explaining the operation of the unit cells of FIG. 1A.

FIGS. 1A and 1B are circuit diagrams of unit cells of a semiconductor memory device according to some example embodiments. FIG. 2 is a diagram for explaining the operation of the unit cells of FIG. 1A.

Referring to FIGS. 1A and 2, the semiconductor memory device according to some example embodiments may include a semiconductor region including a p-type impurity region (p+), an n-type impurity region (n+), and a base region (base) between the p-type impurity region (p+) and the n-type impurity region (n+).

The semiconductor memory device may include, for example, a first gate electrode GE1 and a second gate electrode GE2 placed on the base region (base). The first gate electrode GE1 may be closer to the p-type impurity region (p+) than the second gate electrode GE2 is to the p-type impurity region (p+). A first control transistor T1 may be defined by the first gate electrode GE1 and the base region (base). A second control transistor T2 may be defined by the second gate electrode GE2 and the base region (base).

For example, the p-type impurity region (p+) may be or correspond to an anode region, and the n-type impurity region (n+) may be or correspond to a cathode region. The base region (base) may be or correspond to a channel region in which charges move. The p-type impurity region (p+) may be connected to, for example, a bit line, and a bit line voltage $V_{BL}$ may be applied thereto. The n-type impurity region (n+) may be connected to the common source region, and a source voltage $V_S$ may be applied thereto. For example, the source voltage $V_S$ may be or correspond to a ground voltage.

The p-type impurity region (p+) may be formed of a semiconductor material such as silicon doped with p-type impurities such as boron, and the n-type impurity region (n+) may be formed of a semiconductor material such as silicon doped with n-type impurities such as phosphorus and/or arsenic. As an example, the base region (base) may be formed of an intrinsic semiconductor material that is not doped with or only lightly doped with impurities. The base region (base) may be formed of, e.g. may include, an undoped semiconductor material such as undoped silicon. As another example, the base region (base) may be formed of a semiconductor material that is doped with the p-type impurities at a low concentration. When the base region (base) is doped with the p-type impurities, a doping concentration of the base region (base) is lower, e.g. lower by several orders of magnitude, than a doping concentration of the p-type impurity region (p+).

By applying a positive first voltage V1 to the first gate electrode GE1, apart of the base region (base) may exhibit the characteristics of an n-type semiconductor material. By applying the second voltage V2, which is a negative voltage, to the second gate electrode GE2, the rest of the base region (base) may exhibit the characteristics of the p-type semiconductor material. Even if or when the base region (base) is formed of or includes an intrinsic semiconductor material or a p-type semiconductor material (e.g. a lightly doped p-type semiconductor material), by applying the voltage to the first gate electrode GE1 and the second gate electrode GE2, electrical properties of the base region (base) may be modulated. For example, the semiconductor region of the semiconductor memory device may have a pnpn structure, in a state in which the voltage is applied to the first gate electrode GE1 and the second gate electrode GE2. Alternatively or additionally, the semiconductor memory device of example embodiments may be or include a memory device including a thyristor structure.

The operation of the semiconductor memory device of example embodiments will be described below.

A band diagram of the p-type impurity region (p+), the base region (base), and the n-type impurity region (n+) having the pnpn structure may be in a first state (a solid line in a conduction band CB and a valence band VB illustrated in FIG. 2). For example, the first state may have no voltage difference between the bit line voltage $V_{BL}$ and the source voltage $V_S$. In the first state, current may not flow between the p-type impurity region (p+) and the n-type impurity region (n+).

When a positive voltage is applied to the bit line voltage $V_{BL}$, the band diagram of the p-type impurity region (p+), the base region (base), and the n-type impurity region (n+) may be in a second state (as in a dashed line for the conduction band CB and the valence band VB).

In the second state, holes applied to the p-type impurity region (p+) may not exceed an energy barrier between the p-type impurity region (p+) and the base region (base). Further, the electrons applied to the n-type impurity region (n+) may not exceed the energy barrier between the n-type impurity region (n+) and the base region (base).

For example even though there is a voltage difference between the bit line voltage $V_{BL}$ and the source voltage $V_S$, current does not flow well or flow at all between the p-type impurity region (p+) and the n-type impurity region (n+).

Accordingly, when a pulse voltage is applied to the first gate electrode GE1 and/or the second gate electrode GE2, the energy barrier between the p-type impurity region (p+) and the base region (base) and/or the energy barrier between the n-type impurity region (n+) and the base region (base) may be temporarily lowered.

When the energy barrier between the n-type impurity region (n+) and the base region (base) is lowered, the electrons of the n-type impurity region (n+) may move to the base region (base) (i). When the energy barrier between the p-type impurity region (p+) and the base region (base) is lowered, holes of the p-type impurity region (p+) may move to the base region (base) (ii).

The electrons (i) that move to the base region (base) may lower the energy barrier between the p-type impurity region (p+) and the base region (base). Further, the holes (ii) that move to the base region (base) may lower the energy barrier between the n-type impurity region (n+) and the base region (base).

Such a positive feedback loop is generated, and an energy barrier between the p-type impurity region (p+) and the base region (base), and the energy barrier between the n-type impurity region (n+) and the base region (base) may reduce/collapse. The band diagrams of the p-type impurity region (p+), the base region (base), and the n-type impurity region (n+) may be in a third state (a conduction band CB and valence band VB of alternated long and short dash line).

In the third state, the current between the p-type impurity region (p+) and the n-type impurity region (n+) may flow like a p-i-n diode.

Unlike the configuration/example embodiments mentioned above, a pulse voltage may not be applied to the first gate electrode GE1 and/or the second gate electrode GE2. In such a case, by further increasing the voltage difference between the bit line voltage $V_{BL}$ and the source voltage $V_S$, the current may be made to flow like a p-i-n diode between the p-type impurity region (p+) and the n-type impurity region (n+).

In FIG. 1B, a selection transistor $T_{SEL}$ may be further placed between the p-type impurity region (p+) and the n-type impurity region (n+). By adjusting the selection voltage $V_{SEL}$ applied to the selection transistor $T_{SEL}$, controlling the movement of charges between the p-type impurity region (p+) and the n-type impurity region (n+) may be possible.

Alternatively or additionally, the current between the p-type impurity region (p+) and the n-type impurity region (n+) may be reduced or stopped/become 0, by adjusting the selection voltage $V_{SEL}$ applied to the selection transistor $T_{SEL}$. Alternatively or additionally, the current between the p-type impurity region (p+) and the n-type impurity region (n+) may be stopped/become 0, by reducing the voltage difference between the bit line voltage $V_{BL}$ and the source voltage $V_S$ to a threshold value or less.

Unlike the aforementioned configuration, the base region (base) may include an n-type base region and a p-type base region. The n-type base region (base) may be formed of/include a semiconductor material doped with n-type impurities, and the p-type base region (base) may be formed of a semiconductor material/include doped with p-type impurities. The n-type base region of the base region (base) is in contact with the p-type impurity region (p+). For example, the semiconductor region of the semiconductor memory device may have a pnpn structure in a state in which no voltage is applied to the first gate electrode GE1 and the second gate electrode GE2. The impurity concentration of the n-type base region of the base region (base) may be lower, e.g. lower by one or more orders of magnitude, than the impurity concentration of the n-type impurity region (n+). The impurity concentration of the p-type base region of the base region (base) may be lower, e.g. lower by one or more orders of magnitude, than the impurity concentration of the p-type impurity region (p+).

In such a case, as an example, either the first gate electrode GE1 or the second gate electrode GE2 may not exist. As another example, both the first gate electrode GE1 and the second gate electrode GE2 may not exist. However, at least one of the first gate electrode GE1 and the second gate electrode GE2 that adjust the energy band of the base region (base) may be formed/included so that the charges may move between the p-type impurity region (p+) and the n-type impurity region (n+) at a lower bit line voltage $V_{BL}$.

Figure 3:
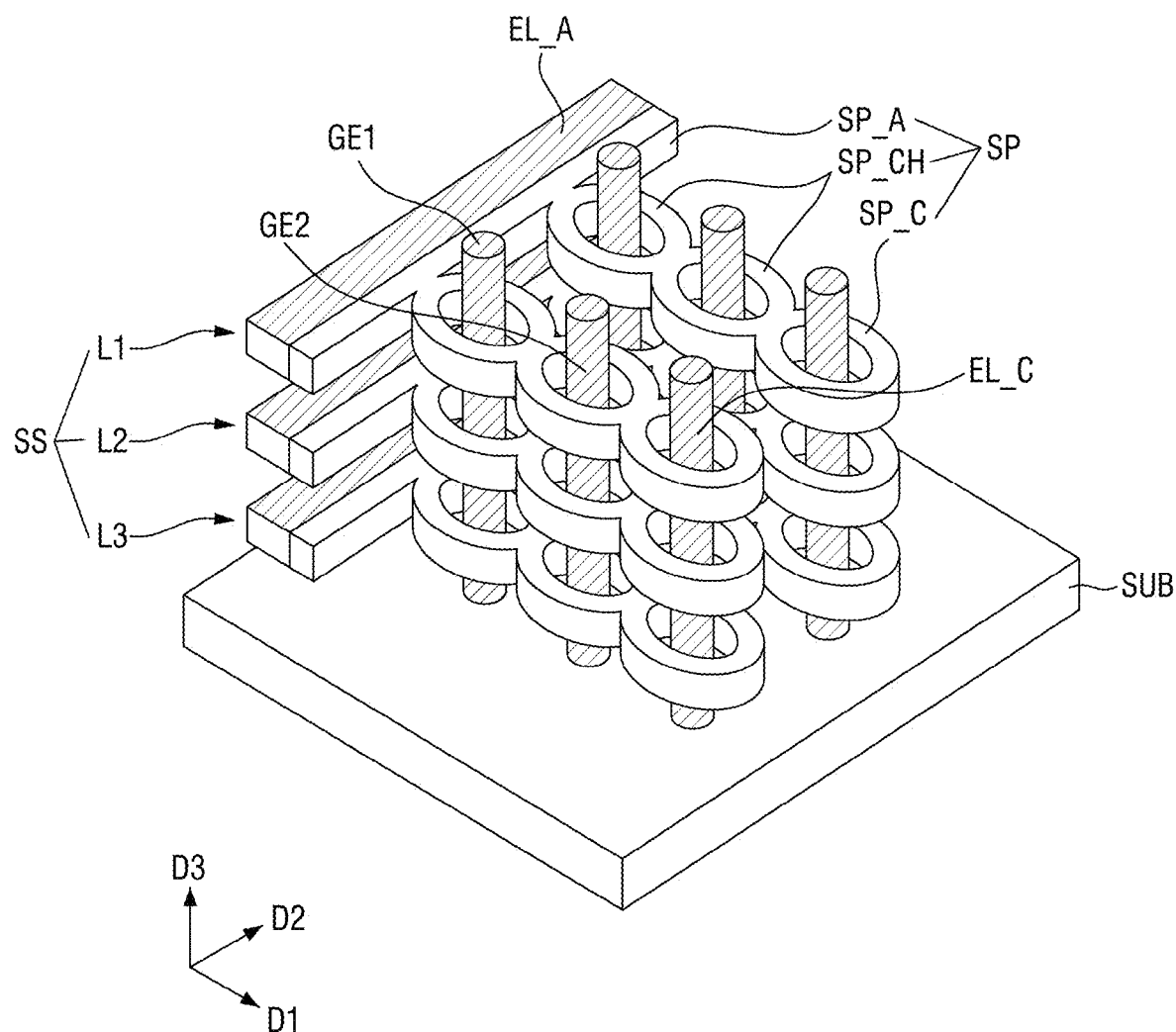
FIGS. 3 to 4B are example perspective views showing the semiconductor memory device according to some example embodiments.
Figure 4A:
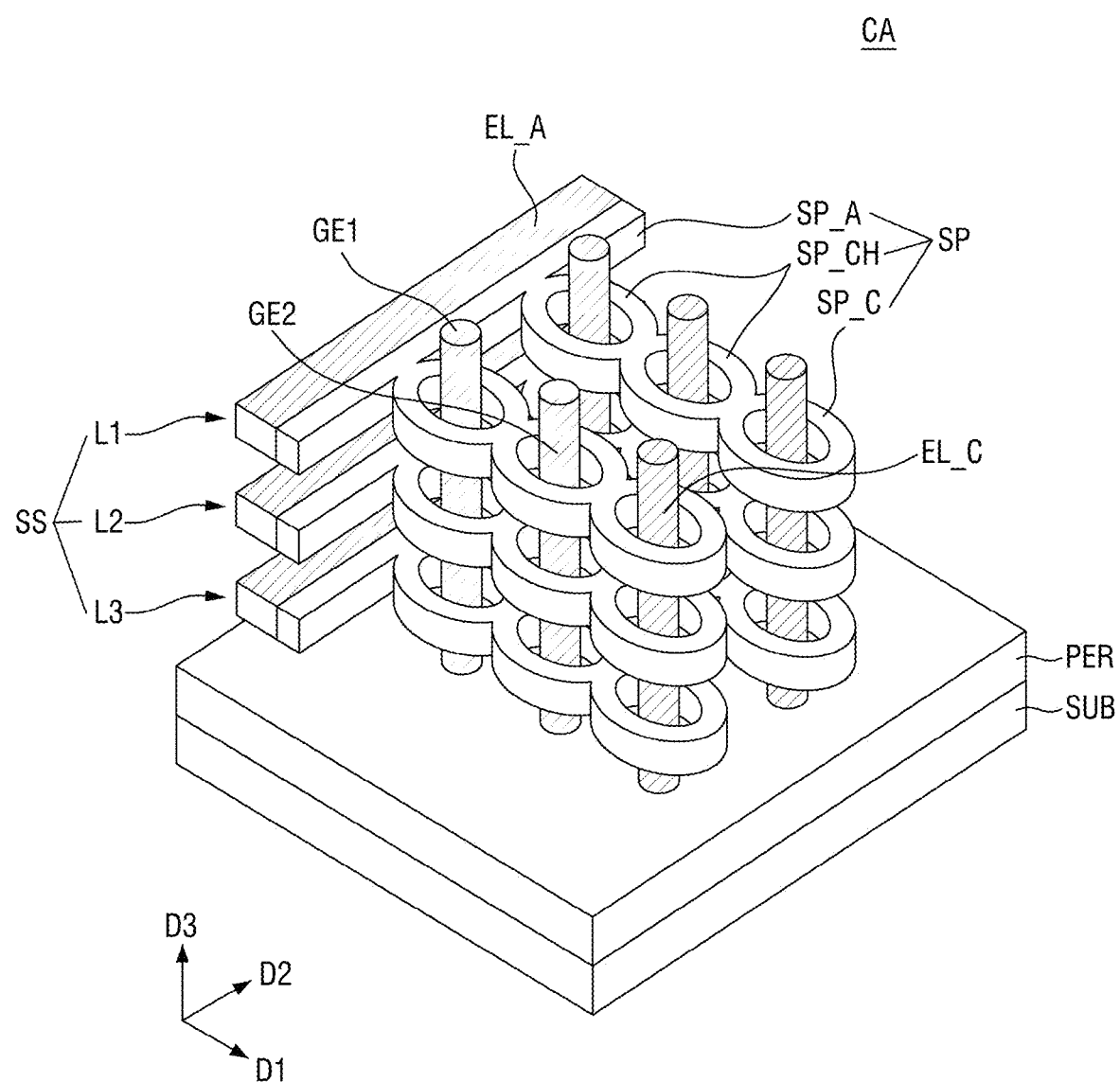
Figure 4B:
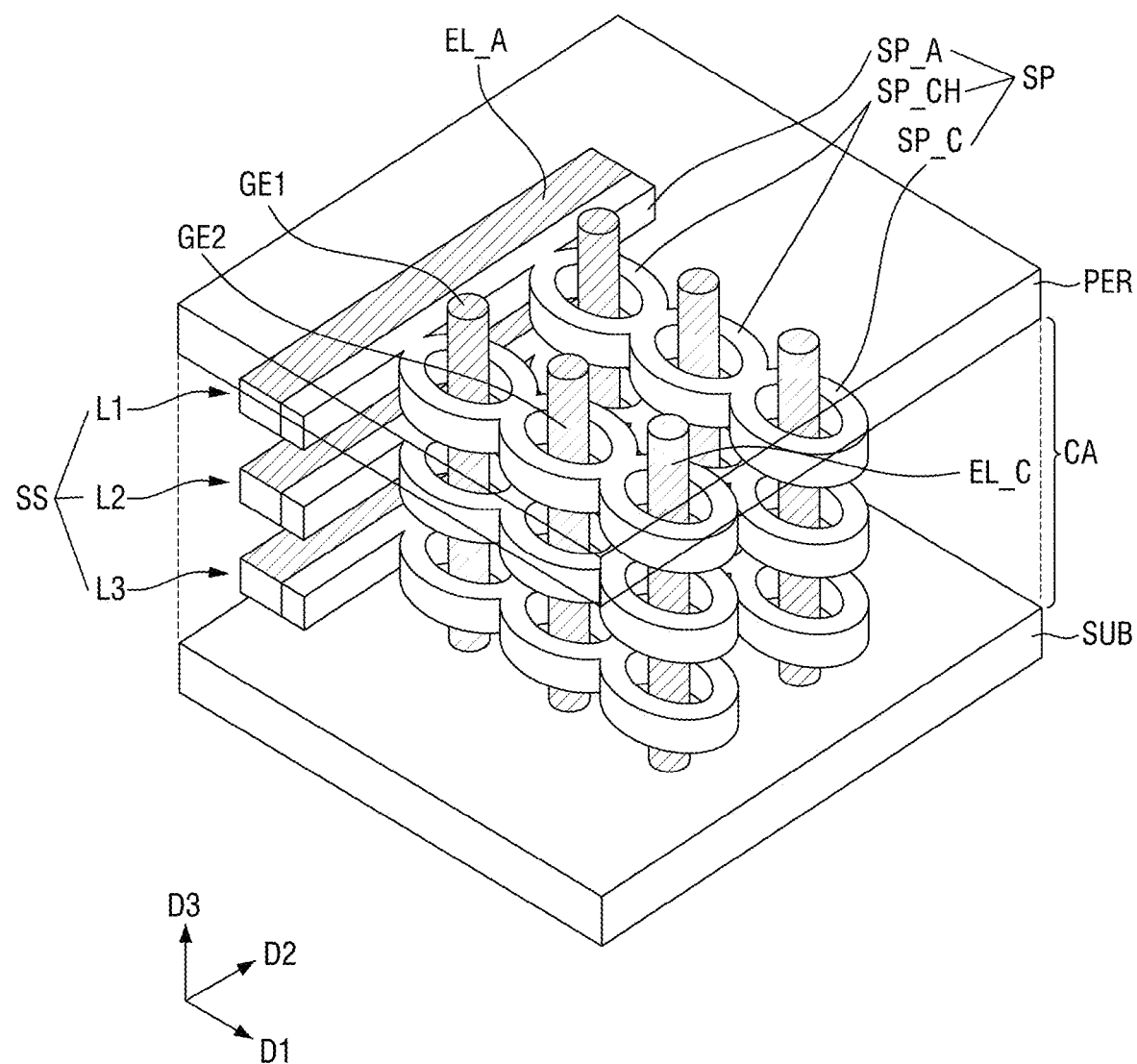

FIGS. 3 to 4B are example perspective views showing a semiconductor memory device according to some example embodiments. For reference, FIGS. 3 to 4B may be perspective views of the semiconductor memory device having the circuit diagram shown in FIG. 1A.

First, referring to FIGS. 1A and 3, a cell array region CA in which a plurality of unit cells may be disposed on the substrate SUB; each of the plurality of unit cells may include the features illustrated in FIG. 1A.

The substrate SUB may be or include bulk silicon or SOI (silicon-on-insulator). Alternatively, the substrate SUB may be a silicon substrate or may include, but is not limited to, other material such as heterogeneous group IV semiconductor material such as silicon germanium, SGOI (silicon germanium on insulator), or group III-V compound semiconductor material such as indium antimonide, lead telluride, indium arsenide, indium phosphide, gallium arsenide or gallium antimonide. In the following description, the substrate SUB will be described as a silicon (e.g. single-crystal silicon) substrate.

A stacked structure SS including first to third layers L1, L2 and L3 may be disposed on the substrate SUB. The first to third layers L1, L2 and L3 of the stacked structure SS may be stacked to be spaced apart from each other in a direction (i.e., a third direction D3) which is perpendicular to a top surface of the substrate SUB. Each of the first to third layers L1, L2 and L3 may include a plurality of semiconductor patterns SP, first and second gate electrodes GE1 and GE2, a first conductive connection line EL_A and a second conductive connection line EL_C.

From a viewpoint of a plan view, each semiconductor pattern SP may include a shape in which a plurality of closed-loops is connected. For example, each closed loop may have an annular shape of a circle or an ellipse. Alternatively, each closed loop may have a loop shape having a rectangular shape with chamfered and/or beveled outer peripheral surfaces, or another polygonal shape such as a hexagonal or octagonal shape.

The semiconductor patterns SP may include a semiconductor material such as silicon, germanium, silicon-germanium (SiGe), silicon carbide (SiC), metal oxide or two-dimensional (2D) material. As an example, the semiconductor patterns SP may include polysilicon. As another example, the semiconductor patterns SP may include an amorphous metal oxide, a polycrystalline metal oxide, a combination of the amorphous metal oxide and the polycrystalline metal oxide, and/or the like. When the semiconductor patterns SP include a metal oxide, the semiconductor patterns SP may include, for example, but are not limited to, one of indium oxide, tin oxide, zinc oxide, In—Zn-based oxide (IZO), Sn—Zn-based oxide, Ba—Sn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide (ITZO), In—W—Zn-based oxide (IWZO), Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide and In—Hf—Al—Zn-based oxide.

Alternatively or additionally, when the semiconductor patterns SP include a two-dimensional material, the semiconductor patterns SP may include at least one of a two-dimensional allotrope or a two-dimensional compound, and may include, for example, but is not limited to, at least one of graphene, molybdenum disulfide ($MoS_2$), molybdenum diselenide ($MoSe_2$), tungsten diselenide ($WSe_2$), and tungsten sulfide ($WS_2$).

Each semiconductor pattern SP may include a channel region SP_CH, a first impurity region SP_A, and a second impurity region SP_C. The channel region SP_CH and the second impurity region SP_C may have a closed loop shape, e.g. a closed circular loop shape or a closed elliptical loop shape. The channel region SP_CH and the second impurity region SP_C to which the closed loop is connected may extend in the first direction D1. The first impurity region SP_A may have a rod shape/linear shape extending along in the second direction D2. The channel region SP_CH may be interposed between the first and second impurity regions SP_A and SP_C. The channel region SP_CH may correspond to the base region (base) described referring to FIG. 2. The first impurity region SP_A may correspond to the p-type impurity region (p+) described referring to FIG. 2, and the second impurity region SP_C may correspond to the n-type impurity region (n+) described referring to FIG. 2.

Each of the first gate electrode GE1 and the second gate electrode GE2 may have a line form and/or a pillar shape extending in the third direction D3. The first gate electrode GE1 may be disposed to be spaced apart from the second gate electrode GE2 in the first direction D1. Each of the first gate electrode GE1 and the second gate electrode GE2 may be spaced apart from each other in the second direction D2.

Each of the first gate electrode GE1 and the second gate electrode GE2 may penetrate the channel region SP_CH, e.g. may fully extend throughout an opening defined by the channel region SP_CH. The first gate electrode GE1 and the second gate electrode GE2 may each pass through a closed loop; the closed loop may be shaped as a ring, a circle, an ellipse, a polygon, etc. Each of the first gate electrode GE1 and the second gate electrode GE2 is not in contact with the channel region SP_CH, but may be spaced apart from the channel region SP_CH. The first gate electrode GE1 and the second gate electrode GE2 may be/correspond to the gate electrodes of the first and second control transistors T1 and T2 described in FIGS. 1A and 2.

The first conductive connection line EL_A may have a line/linear form and/or a bar shape extending in the second direction D2. The first conductive connection lines EL_A may be disposed to be spaced apart from each other in the third direction D3. The first conductive connection line EL_A may be in contact with/directly connected to the first impurity region SP_A and may be electrically connected to the first impurity region SP_A. The first conductive connection line EL_A may be/correspond to a bit line that applies a bit line voltage ($V_{BL}$ of FIG. 1A) to the first impurity region SP_A.

The second conductive connection line EL_C may have a line/linear form or a pillar shape extending in the third direction D3. The second conductive connection line EL_C may be disposed to be spaced apart from the second gate electrode GE2 in the first direction D1. The second conductive connection lines EL_C may be disposed to be spaced apart from each other in the second direction D2.

The second conductive connection line EL_C may penetrate, e.g. may fully extend through, the second impurity region SP_C. The second conductive connection line EL_C may pass through a closed loop; the closed loop may have one of ring shape, a circular shape, a polygonal shape, etc. The second conductive connection line EL_C is in contact with the second impurity region SP_C, and may be electrically connected to the second impurity region SP_C. The second conductive connection line EL_C may connect the second impurity regions SP_C spaced apart from each other in the third direction D3. The second conductive connection line EL_C may be/correspond to a source supply line that applies a source voltage ($V_S$ of FIG. 1A) to the second impurity region SP_C.

The first gate electrode GE1, the second gate electrode GE2, the first conductive connection line EL_A, and the second conductive connection line EL_C may each include a conductive material. For example, each of the first gate electrode GE1, the second gate electrode GE2, the first conductive connection line EL_A and the second conductive connection line EL_C may include, but is not limited to, one of a conductive metal nitride (titanium nitride, tantalum nitride, niobium nitride (NbN), etc.), metals (tungsten, titanium, tantalum, cobalt, ruthenium, etc.), and metal-semiconductor compounds (tungsten silicide, cobalt silicide, titanium silicide, etc.).

A first layer L1 among the first to third layers L1, L2 and L3 will be representatively described in detail. The semiconductor patterns SP of the first layer L1 may be arranged in the second direction D2. The semiconductor patterns SP of the first layer L1 may be located at the same level. The semiconductor patterns SP of the first layer L1 may share the first impurity region SP_A extending in the second direction D2. Among the semiconductor patterns SP disposed on the first layer L1, the channel region SP_CH and the second impurity region SP_C may be spaced apart from each other in the second direction D2. The channel regions SP_CH spaced apart from each other in the second direction D2 may be connected to the first impurity region SP_A. The first gate electrode GE1, the second gate electrode GE2, and the second conductive connection line EL_C are sequentially arranged in the first direction D1, and may pass through the channel region SP_CH and the second impurity region SP_C that are coupled to each other in the first direction D1. The semiconductor patterns SP arranged in the second direction D2 may be connected to the first conductive connection lines EL_A disposed on the first layer L1.

Although not illustrated, a gate insulating film may be interposed between the first gate electrode GE1 and the channel region SP_CH, and between the second gate electrode GE2 and the channel region SP_CH. The gate insulating film may include at least one of a high-dielectric constant insulating film, a silicon oxide film, a silicon nitride film, and a silicon oxynitride film. As an example, the high-dielectric constant insulating film may include at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Although not illustrated, empty spaces within the stacked structure SS may be filled with insulating material. For example, the insulating material may include at least one of a silicon oxide film, a silicon nitride film, and a silicon oxynitride film. A wiring layer electrically connected to the cell array CA may be disposed on the stacked structure SS. Although not illustrated, a peripheral circuit for operating the cell array CA may be formed on the substrate SUB. The peripheral circuit and the cell array may be connected, for example using the wiring layer.

Unlike the aforementioned configuration, the first impurity region SPA may correspond to the n-type impurity region (n+) described referring to FIG. 2, and the second impurity region SP_C may correspond to the p-type impurity region (p+) described referring to FIG. 2. In such a case, the second conductive connection line EL_C may be/correspond to a bit line that applies the bit line voltage ($V_{BL}$ of FIG. 1A) to the p-type impurity region (p+) described in FIGS. 1A and 2. The first conductive connection line EL_A may be/correspond to a source supply line that applies a source voltage $V_S$ to the n-type impurity region (n+) described in FIGS. 1A and 2.

The description will be provided below on the assumption that the first impurity region SP_A corresponds to the p-type impurity region (p+) described referring to FIG. 2, and the second impurity region SP_C corresponds to the n-type impurity region (n+) described using FIG. 2.

The embodiments according to FIGS. 4A and 4B will be described mainly on the basis of the points different from those described using FIG. 3.

Referring to FIGS. 4A and 4B, the peripheral circuit region PER and the cell array CA may be stacked in a vertical direction (i.e., the third direction D3).

In FIG. 4A, a peripheral circuit region PER may be disposed between the substrate SUB and the cell array CA. The peripheral circuit region PER may include peripheral circuit transistors such as MOSFET transistors and/or bipolar transistors formed on the substrate SUB. The peripheral circuit region PER may include a circuit for operating the memory cell array according to the embodiments of example embodiments.

The cell array CA may be electrically connected to the peripheral circuit regions PER through, for example, at least one penetration electrode. Alternatively or additionally, the first gate electrode GE1, the second gate electrode GE2 and the second conductive connection line EL_C of the cell array CA may be directly connected to the peripheral circuit region PER.

In FIG. 4B, the cell array CA may be disposed on the substrate SUB. The peripheral circuit region PER may be disposed on the cell array CA. As described above, the peripheral circuit region PER may include a circuit for operating the cell array CA.

As an example, the first direction D1, the second direction D2, and the third direction D3 may be perpendicular to each other, but are not limited thereto. Also, the first direction D1 and the second direction D2 may be parallel to the top surface of the substrate SUB, and the third direction D3 may be perpendicular to the top surface of the substrate SUB.

Figure 5:
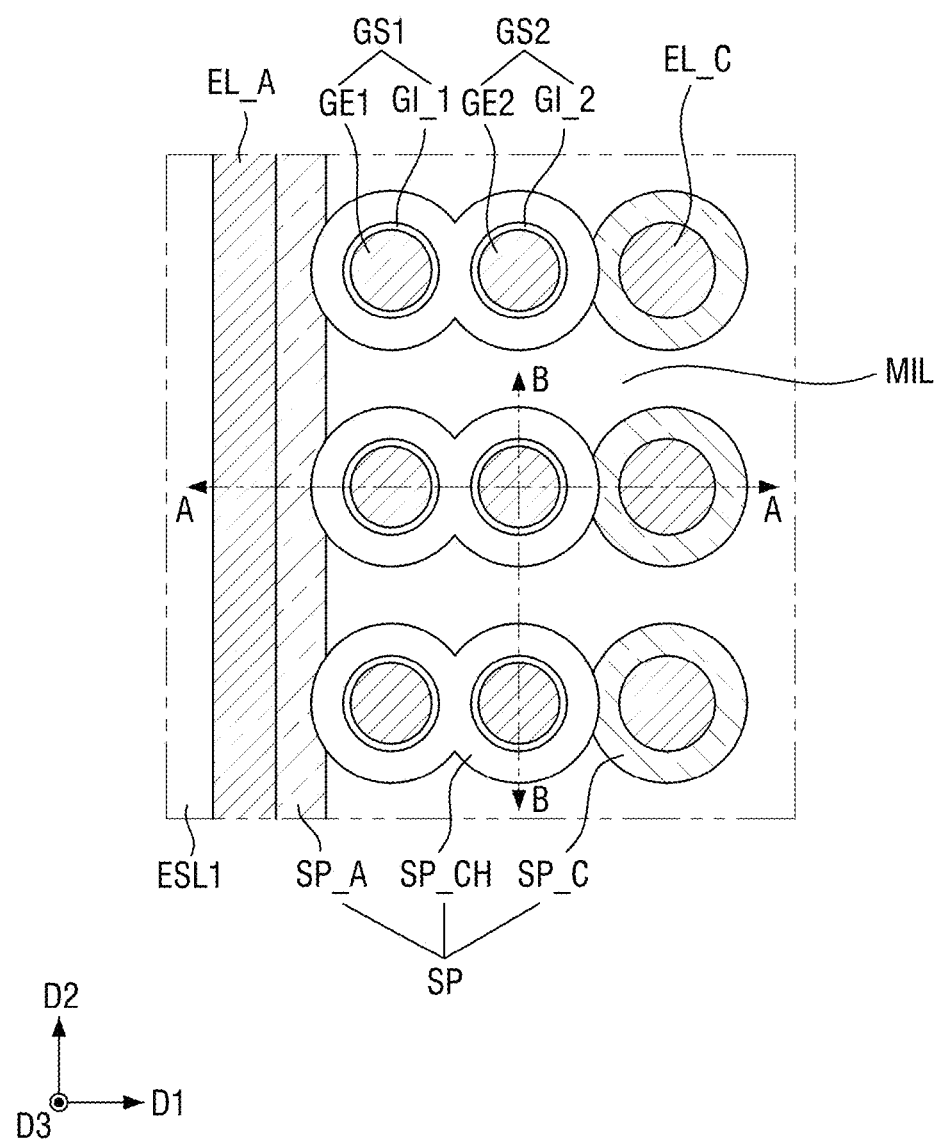
FIG. 5 is a plan view showing the semiconductor memory device according to some example embodiments.
Figure 6:
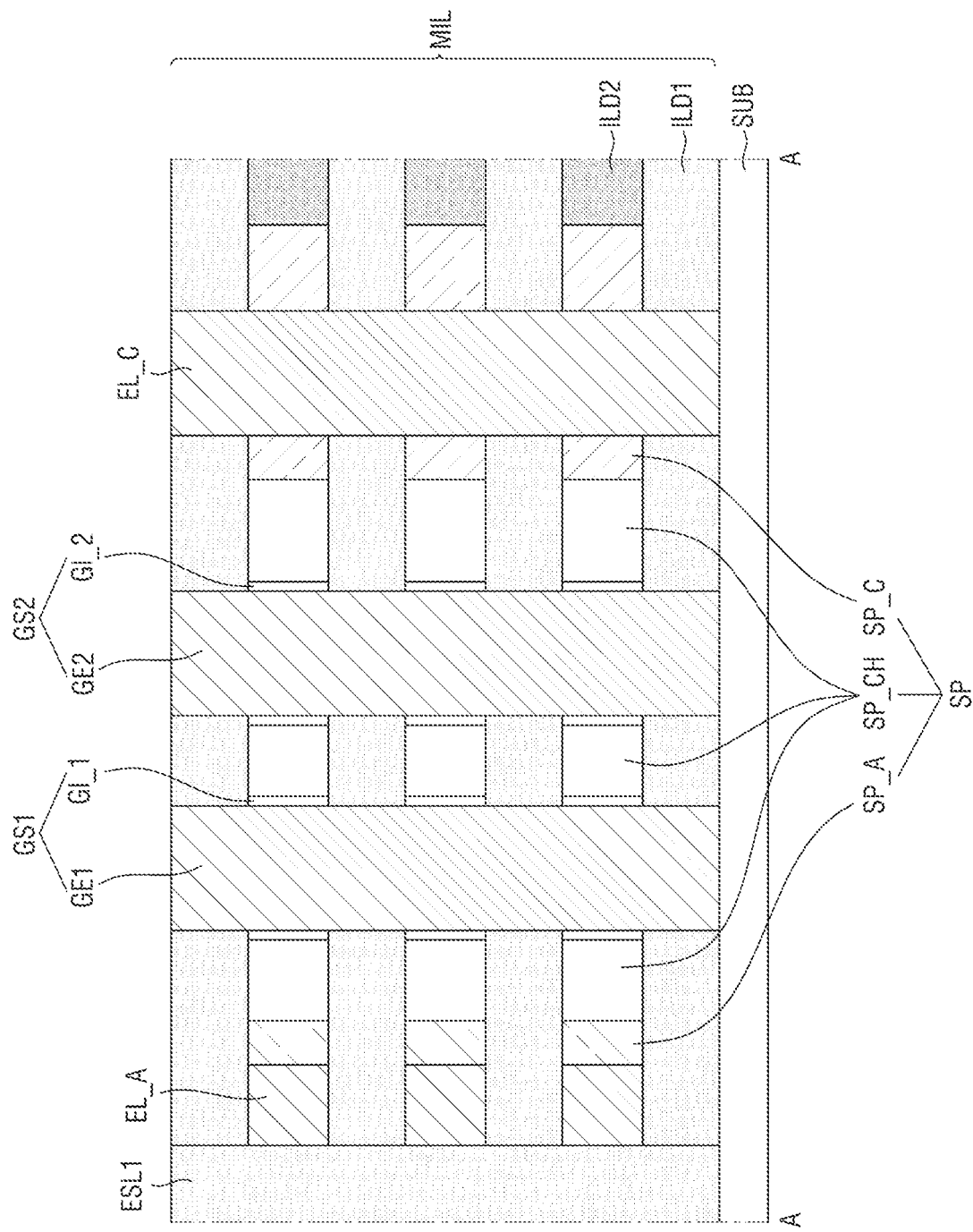
FIGS. 6 and 7 are cross-sectional views taken along lines A-A and B-B of FIG. 5.
Figure 7:
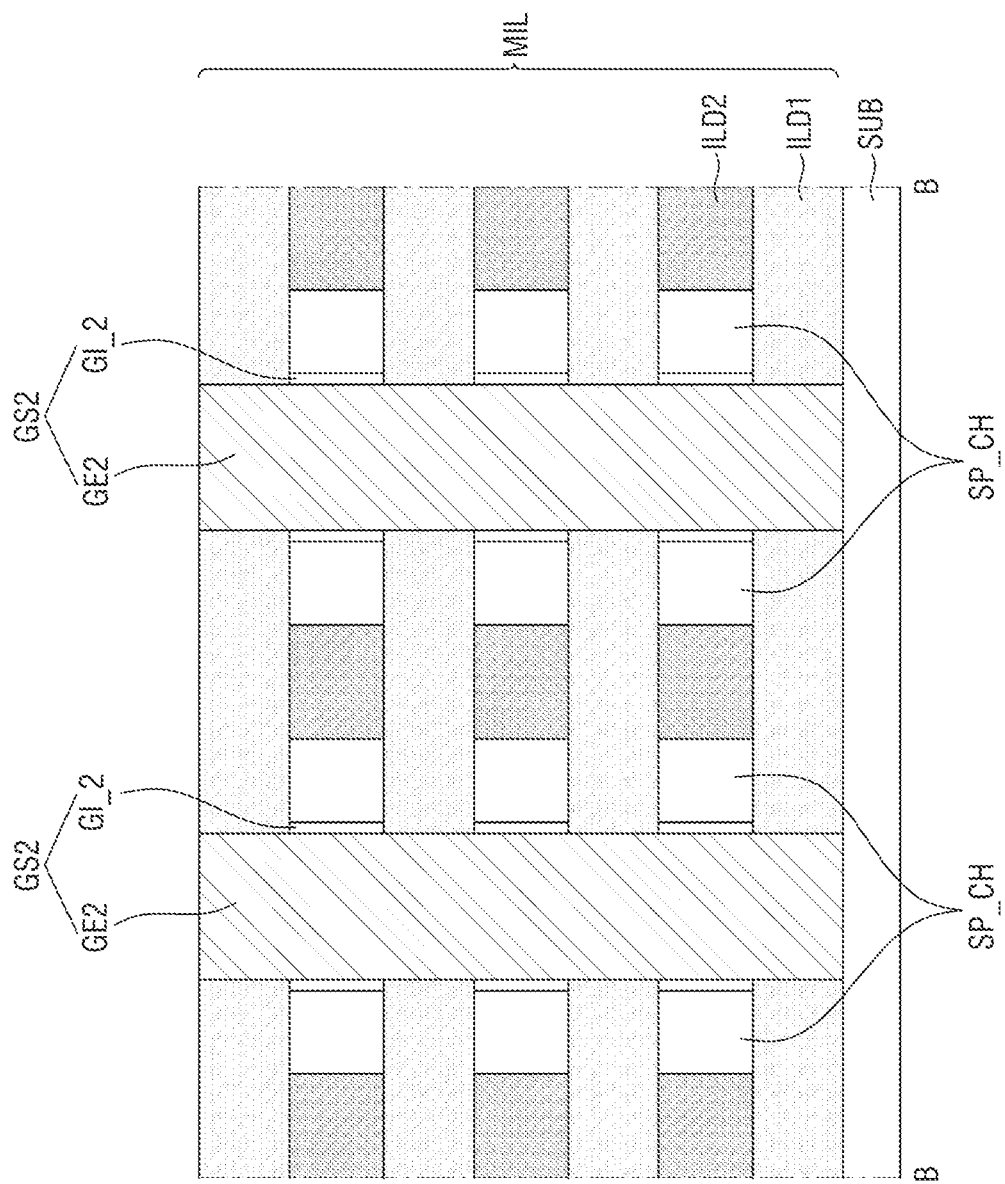

FIG. 5 is a plan view showing a semiconductor memory device according to some example embodiments. FIGS. 6 and 7 are cross-sectional views taken along lines A-A and B-B, respectively, of FIG. 5. For convenience of description, repeated parts of contents explained referring to FIGS. 1A, 2 and 3 will be briefly explained.

Referring to FIGS. 5 to 7, the semiconductor memory device according to some example embodiments may include a semiconductor pattern SP, a first conductive connection line EL_A, a second conductive connection line EL_C, a first gate structure GS1, and a second gate structure GS2.

The mold structure MIL may be disposed on the substrate SUB. The mold structure MIL may include a first mold insulating layer ILD1 and a second mold insulating layer ILD2. The mold structure MIL may include first mold insulating layer ILD1 and the second mold insulating layer ILD2 alternately stacked on the substrate SUB.

In FIGS. 6 and 7, although four first mold insulating layers ILD1 and three second mold insulating layers ILD2 are shown, this is only for convenience of description, and example embodiments are not limited to thereto. Although the mold structure MIL immediately adjacent to the substrate SUB is shown as the first mold insulating layer ILD1, example embodiments are not limited thereto.

The first mold insulating layer ILD1 and the second mold insulating layer ILD2 may each include an insulating material. A first insulating material included in the first mold insulating layer ILD1 may have an etching selection ratio with respect to a second insulating material included in the second mold insulating layer ILD2, e.g. may etch slower than the second insulating material included in the second mold insulating layer ILD2. Each of the first mold insulating layer ILD1 and the second mold insulating layer ILD2 may include, for example, at least one of silicon oxide film, silicon nitride film, silicon oxynitride film, carbon-containing silicon oxide film, carbon-containing silicon nitride film and carbon-containing silicon oxynitride film, and may include the same and different material from each other. As an example, the first mold insulating layer ILD1 may include a silicon oxide film, and the second mold insulating layer ILD2 may include a silicon nitride film. For example, the mold structure MIL may be or include an ON (oxide/nitride) mold structure.

The plurality of semiconductor patterns SP may be disposed on the substrate SUB. The semiconductor patterns SP may be disposed along the second direction D2. Further, the plurality of semiconductor patterns SP may be stacked along the third direction D3. The semiconductor patterns SP stacked in the third direction D3 may be spaced apart from each other. The semiconductor patterns SP stacked in the third direction D3 may be disposed between the adjacent first mold insulating layers ILD1 or between the adjacent second mold insulating layers ILD2. As an example, in the semiconductor memory device according to some example embodiments, the first mold insulating layer ILD1 may be disposed between the semiconductor patterns SP adjacent to each other in the third direction D3. In addition, the second mold insulating layer ILD2 may be disposed between the semiconductor patterns SP adjacent to each other in the second direction D2. The second mold insulating layer ILD2 may be in contact with the semiconductor patterns SP adjacent to each other in the second direction D2.

For example, the semiconductor patterns SP may include a first semiconductor pattern and a second semiconductor pattern disposed along the second direction D2. Each of the first semiconductor pattern and the second semiconductor pattern may include a first impurity region SP_A, a second impurity region SP_C, and a channel region SP_CH between the first impurity region SP_A and the second impurity region SP_C. The channel region SP_CH and the second impurity region SP_C of the first semiconductor pattern may be spaced apart from the channel region SP_CH and the second impurity region SP_C of the second semiconductor pattern in the second direction D2. Further, the first impurity region SP_A of the first semiconductor pattern and the first impurity region SPA of the second semiconductor pattern may be connected to each other. The first semiconductor pattern and the second semiconductor pattern may share the first impurity region SP_A extending in the second direction D2. Each of the first semiconductor pattern and the second semiconductor pattern may include a channel region SP_CH and a second impurity region SP_C each having a form in which the closed loops are connected.

The semiconductor patterns SP may include a semiconductor material such as silicon, germanium, silicon-germanium, silicon carbide, metal oxide or a two-dimensional material.

In the semiconductor memory device according to some example embodiments, the channel region SP_CH of the semiconductor pattern SP may be formed of or include an undoped semiconductor material or a semiconductor material doped with p-type impurities. When the channel region SP_CH is formed of or includes a semiconductor material doped with p-type impurities, the concentration of the p-type impurities of the channel region SP_CH is lower than the concentration of the p-type impurities of the first impurity region SPA, e.g. lower by at least one order of magnitude.

Each of the first gate structure GS1 and the second gate structure GS2 may be disposed on the substrate SUB. Each of the first gate structure GS1 and the second gate structure GS2 may extend long in the third direction D3. Each of the first gate structure GS1 and the second gate structure GS2 may penetrate the channel region SP_CH. Each of the first gate structure GS1 and the second gate structure GS2 may penetrate the mold structure MIL.

At least a part of each of the first gate structure GS1 and the second gate structure GS2 may be surrounded by a channel region SP_CH. In the semiconductor memory device according to some example embodiments, the channel region SP_CH may wrap entirely around the sidewalls of the first gate structure GS1 extending in the third direction D3, in a region in which the first gate structure GS1 and the semiconductor pattern SP intersect each other. In the region in which the second gate structure GS2 and the semiconductor pattern SP intersect each other, the channel region SP_CH may wrap entirely around the sidewalls of the second gate structure GS2 extending in the third direction D3.

The first gate structure GS1 may include a first gate electrode GE1 and a first gate insulating film GI_1. The first gate electrode GE1 may extend in the third direction D3 and penetrate the channel region SP_CH. The first gate insulating film GI_1 may be disposed between the first gate electrode GE1 and the semiconductor pattern SP. The first gate insulating film GI_1 may be disposed between the first gate electrode GE1 and the channel region SP_CH.

The second gate structure GS2 may include a second gate electrode GE2 and a second gate insulating film GI_2. The second gate electrode GE2 may extend in the third direction D3 and penetrate, e.g. fully penetrate or pass through, the channel region SP_CH. The second gate insulating film GI_2 may be disposed between the second gate electrode GE2 and the semiconductor pattern SP. The second gate insulating film GI_2 may be disposed between the second gate electrode GE2 and the channel region SP_CH.

Although the first gate electrode GE1 and the second gate electrode GE2 are shown as a single film, this is only for convenience of description, and example embodiments are not limited thereto. As an example, each of the first gate electrode GE1 and the second gate electrode GE2 may include a work function adjusting film. In order to make threshold potentials of the first gate electrode GE1 and the second gate electrode GE2 different from each other, the work function adjusting film of the first gate electrode GE1 and the work function adjusting film of the second gate electrode GE2 may include different materials from each other. Alternatively or additionally, the work function adjusting film of the first gate electrode GE1 and the work function adjusting film of the second gate electrode GE2 may include the same material of different thicknesses.

The first gate electrode GE1 and the second gate electrode GE2 may each include at least one of a conductive metal nitride, a metal, and a metal-semiconductor compound.

In the semiconductor device according to some example embodiments, the first gate insulating film GI_1 and the second gate insulating film GI_2 may include at least one of silicon oxide, silicon oxynitride, and silicon nitride, and may be the same as, or different from, each other.

The first gate insulating film GI_1 and the second gate insulating film GI_2 may have the same thickness or different thicknesses.

Unlike the shown configuration, the first gate insulating film GI_1 and the second gate insulating film GI_2 may extend between the first gate electrode GE1 and the first mold insulating layer ILD1, and extend between the second gate electrode GE2 and the first mold insulating layer ILD1.

The first conductive connection line EL_A may be connected to the first impurity region SP_A of the semiconductor pattern SP. The first conductive connection line EL_A may extend along in the second direction D2. The first conductive connection line EL_A may be aligned with the top surface of the substrate SUB. The first conductive connection line EL_A may be connected to the first semiconductor pattern and the second semiconductor pattern disposed along the second direction D2.

The first conductive connection line EL_A may be disposed between the first mold insulating layers ILD1 spaced apart from each other in the third direction D3. The first conductive connection lines EL_A adjacent to each other in the third direction D3 are separated from each other by the first mold insulating layer ILD1 and the first electrode separation pattern ESL1. The first electrode separation pattern ESL1 may extend along in the second direction D2. The first electrode separation pattern ESL1 may include an insulating material.

The second conductive connection line EL_C may extend in the third direction D3 and may penetrate the second impurity region SP_C. The second conductive connection line EL_C is in contact with the semiconductor pattern SP. The second conductive connection line EL_C may be electrically connected to the second impurity region SP_C.

In the region in which the second conductive connection line EL_C intersects the semiconductor pattern SP, the second impurity region SP_C may entirely wrap around the sidewalls of the second conductive connection line EL_C extending in the third direction D3.

The first conductive connection line EL_A and the second conductive connection line EL_C may each include at least one of a conductive metal nitride, a metal, and a metal-semiconductor compound.

In the semiconductor memory device according to some example embodiments, the first conductive connection line EL_A and the second conductive connection line EL_C may have a cross point (XP) structure.

Figure 8B:
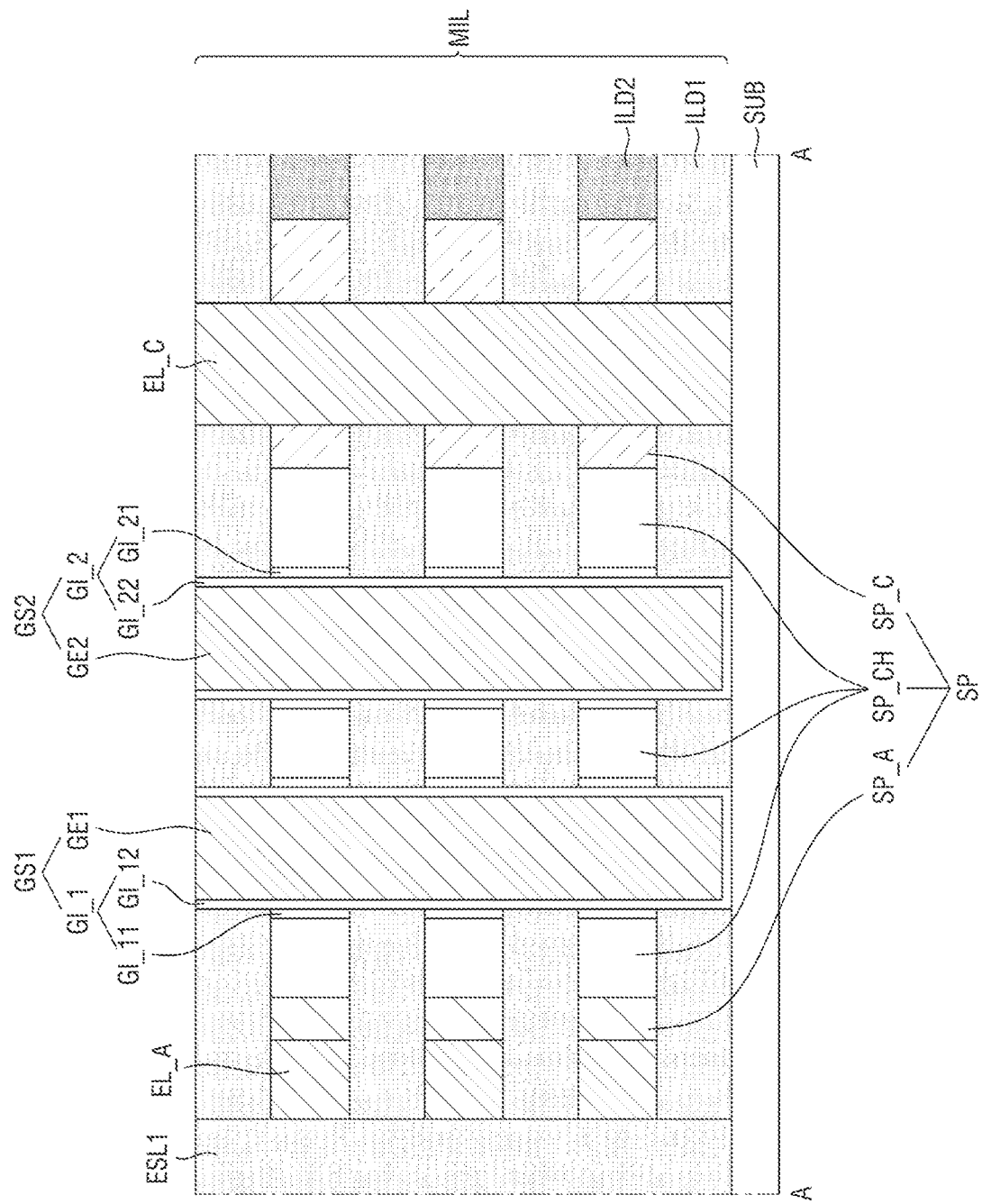
Figure 9:
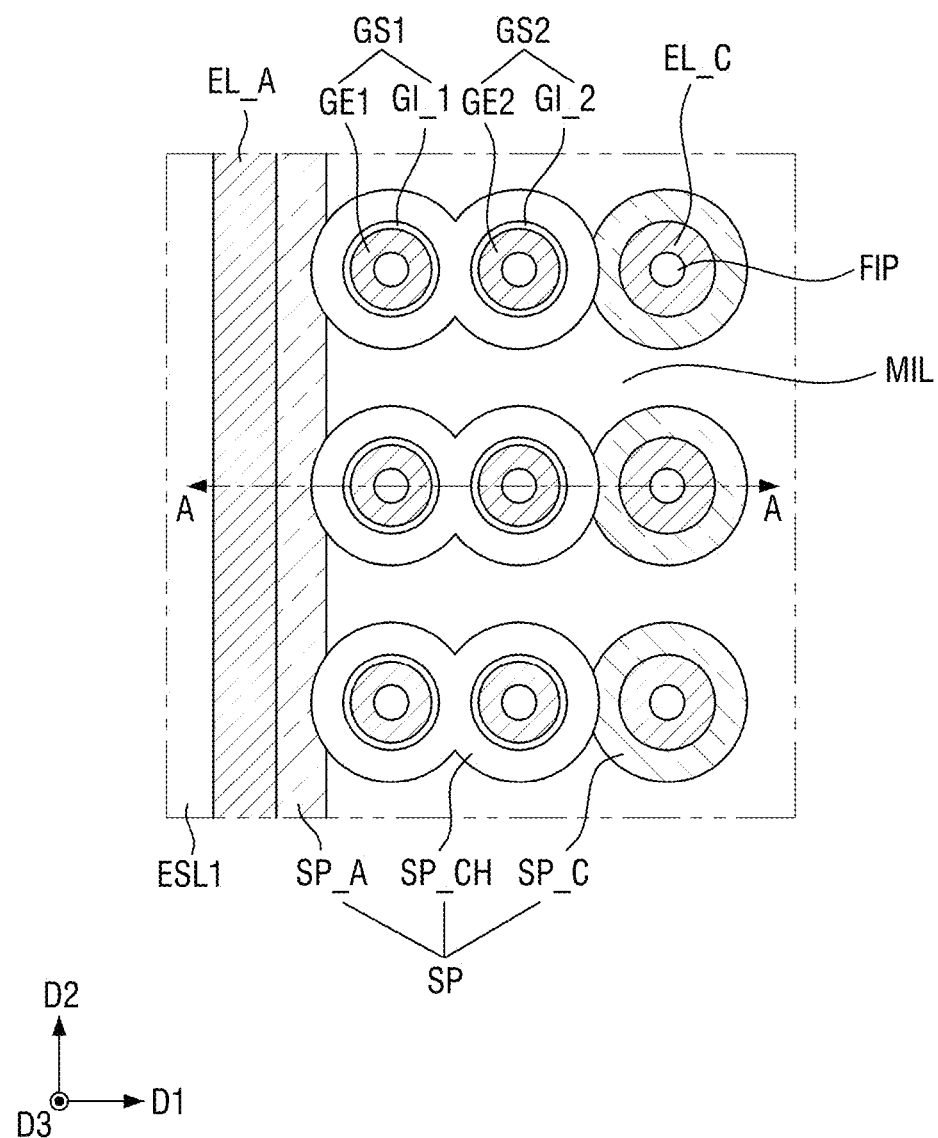
FIGS. 9 and 10 are diagrams for explaining a semiconductor device according to some example embodiments.
Figure 10:
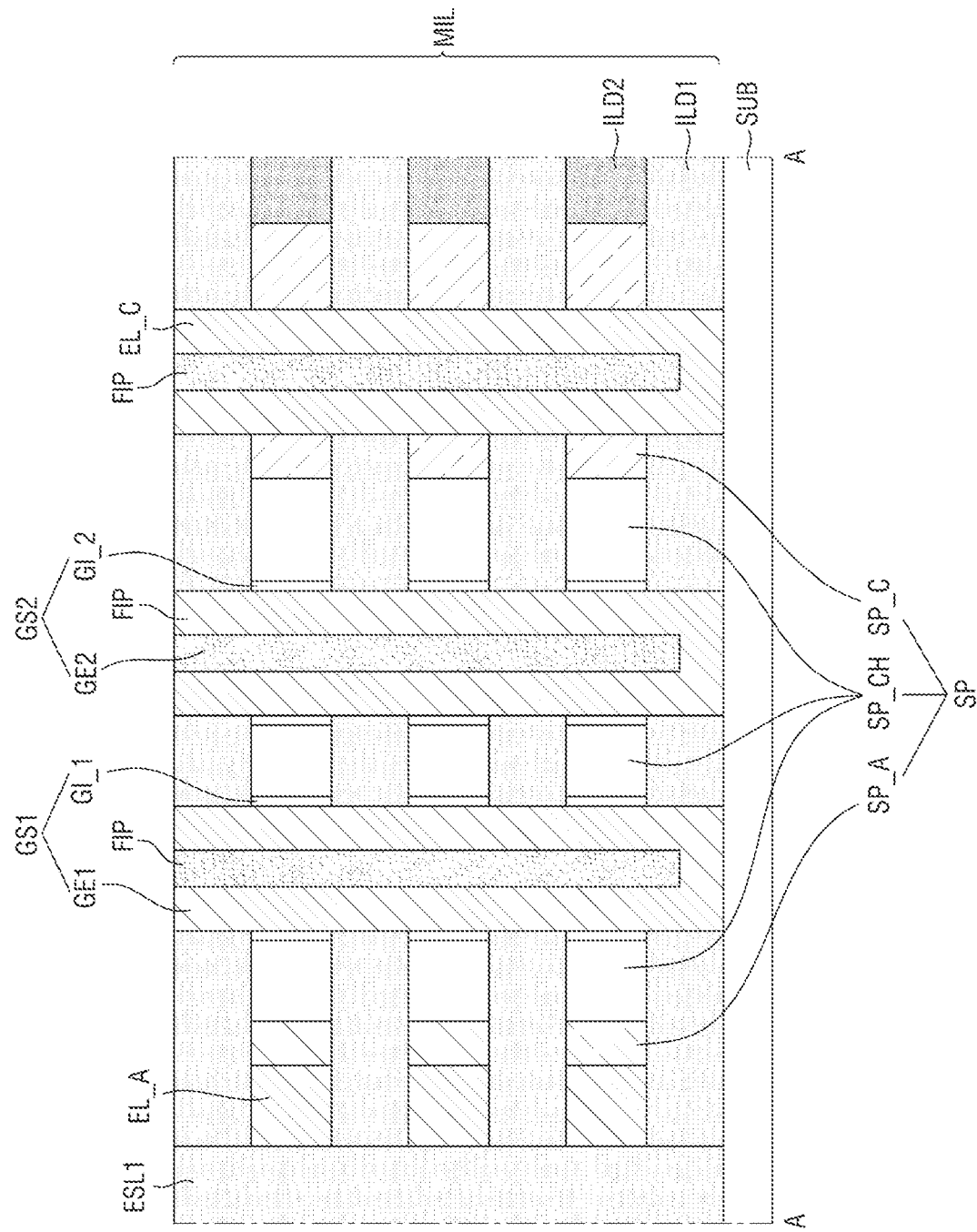

FIGS. 8A and 8B are diagrams for explaining a semiconductor memory device according to some example embodiments. FIGS. 9 and 10 are diagrams for explaining a semiconductor device according to some example embodiments. For convenience of description, points different from those described using FIGS. 3 and 5 to 7 will be mainly described.

Referring to FIGS. 8A and 8B, in the semiconductor memory device according to some example embodiments, the first gate insulating film GI_1 includes a first interface insulating film GI_11 and a first high-dielectric constant film GI_12, and the second gate insulating film GI_2 may include a second interface insulating film GI_21 and a second high-dielectric constant film GI_22.

The first high-dielectric constant film GI_12 may be disposed between the first gate electrode GE1 and the semiconductor pattern SP, and between the first gate electrode GE1 and the first mold insulating layer ILD1. The second high-dielectric constant film GI_22 may be disposed between the second gate electrode GE2 and the semiconductor pattern SP, and between the second gate electrode GE2 and the first mold insulating layer ILD1.

When the semiconductor pattern SP includes silicon, the first interface insulating film GI_11 and the second interface insulating film GI_21 may include, for example, silicon oxide. However, as the materials contained in the semiconductor pattern SP vary, the materials contained in the first interface insulating film GI_11 and the second interface insulating film GI_21 may also vary. The first high-dielectric constant film GI_12 and the second high-dielectric constant film GI_22 may include, for example, a high-dielectric constant insulating film.

In FIG. 8A, the first high-dielectric constant film GI_12 and the second high-dielectric constant film GI_22 may be not disposed between the bottom surface of the first gate electrode GE1 and the top surface of the substrate SUB, and between the bottom surface of the second gate electrode GE2 and the top surface of the substrate SUB.

On the other hand, in FIG. 8B, the first high-dielectric constant film GI_12 and the second high-dielectric constant film GI_22 may be disposed between the bottom surface of the first gate electrode GE1 and the top surface of the substrate SUB, and between the bottom surface of the gate electrode GE2 and the top surface of the substrate SUB.

Referring to FIGS. 9 and 10, the semiconductor memory device according to some example embodiments may further include a filling insulation pattern FIP which fills at least one of a space defined by the first gate electrode GE1, a space defined by the second gate electrode GE2, and a space defined by the second conductive connection line EL_C.

The sidewall of the filling insulation pattern FIP may be covered with the first gate electrode GE1, the second gate electrode GE2, and the second conductive connection line EL_C.

The filling insulation pattern FIP may include, for example, at least one of a silicon oxide film, a silicon nitride film, a silicon oxynitride film, a carbon-containing silicon oxide film, a carbon-containing silicon nitride film, and a carbon-containing silicon oxynitride film.

Unlike the shown configuration, the filling insulation pattern FIP may be disposed in one or two of the first gate electrode GE1, the second gate electrode GE2 and the second conductive connection line EL_C.

Figure 11:
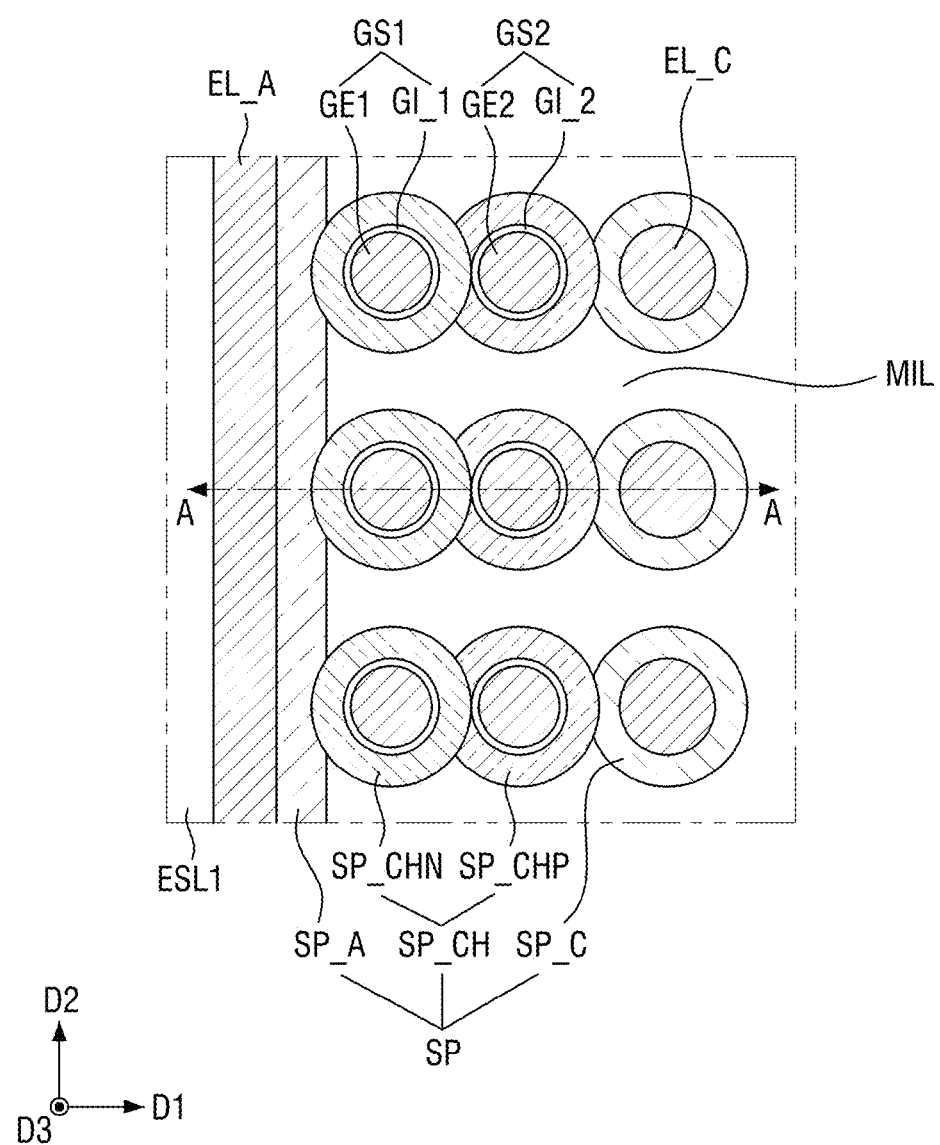
FIGS. 11 and 12 are diagrams for explaining the semiconductor memory device according to some example embodiments.
Figure 12:
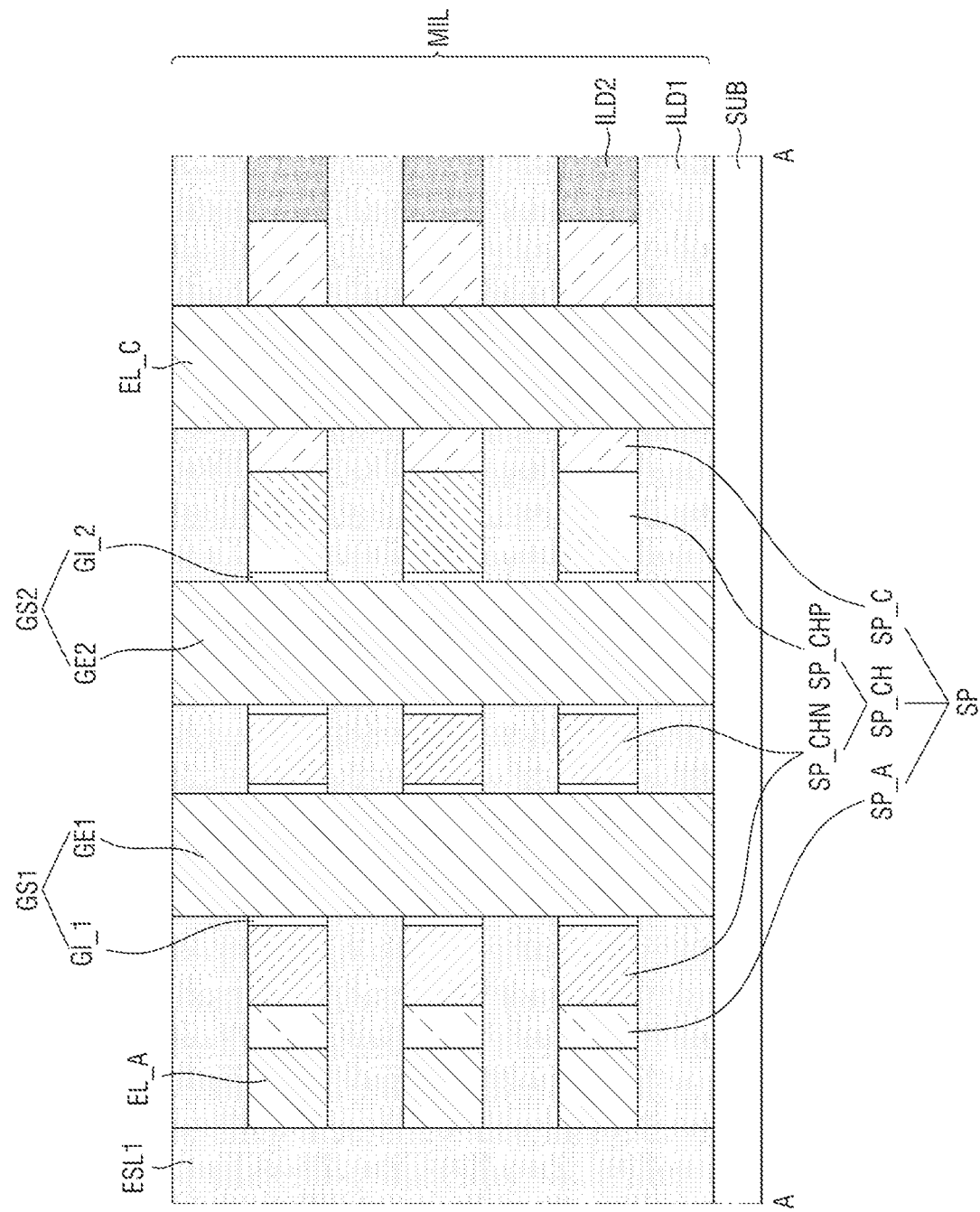
Figure 13:
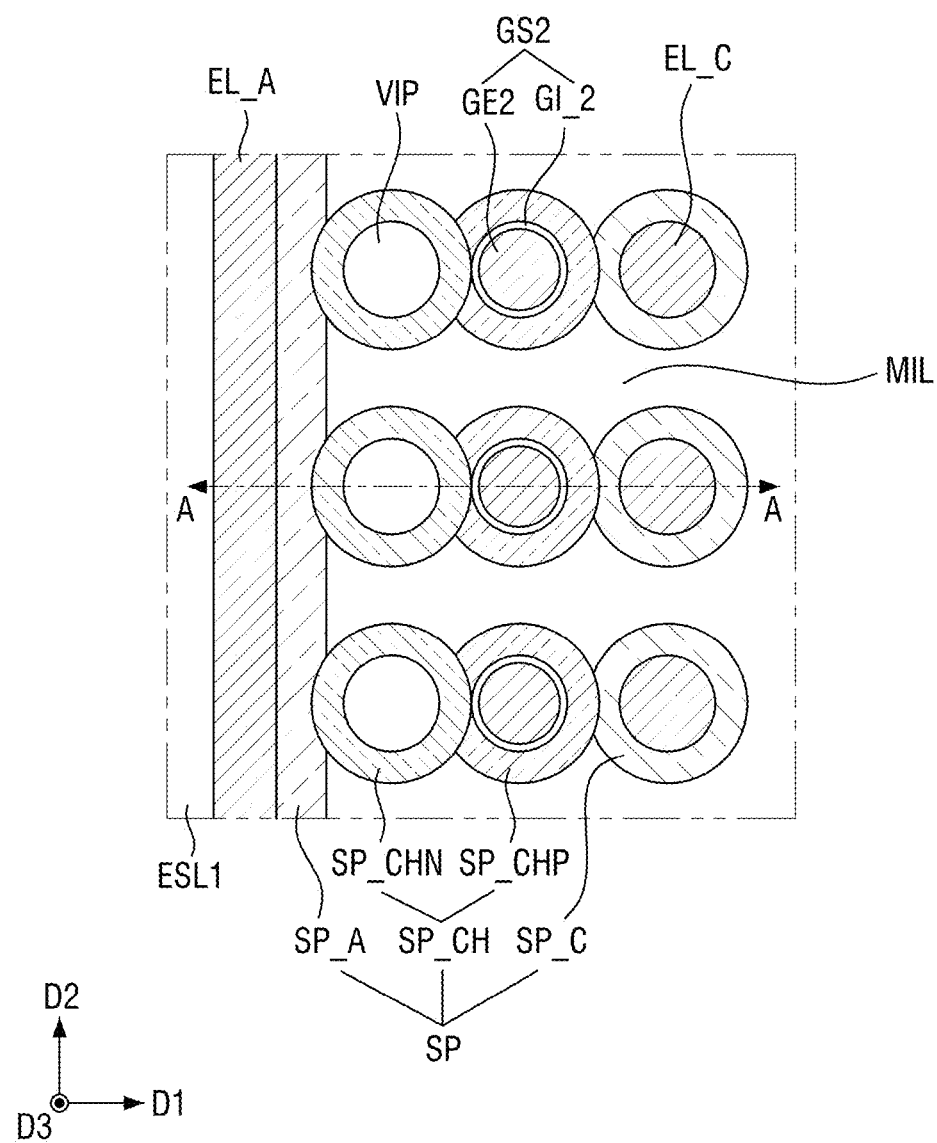
FIGS. 13 and 14 are diagrams for explaining the semiconductor memory device according to some example embodiments.
Figure 14:
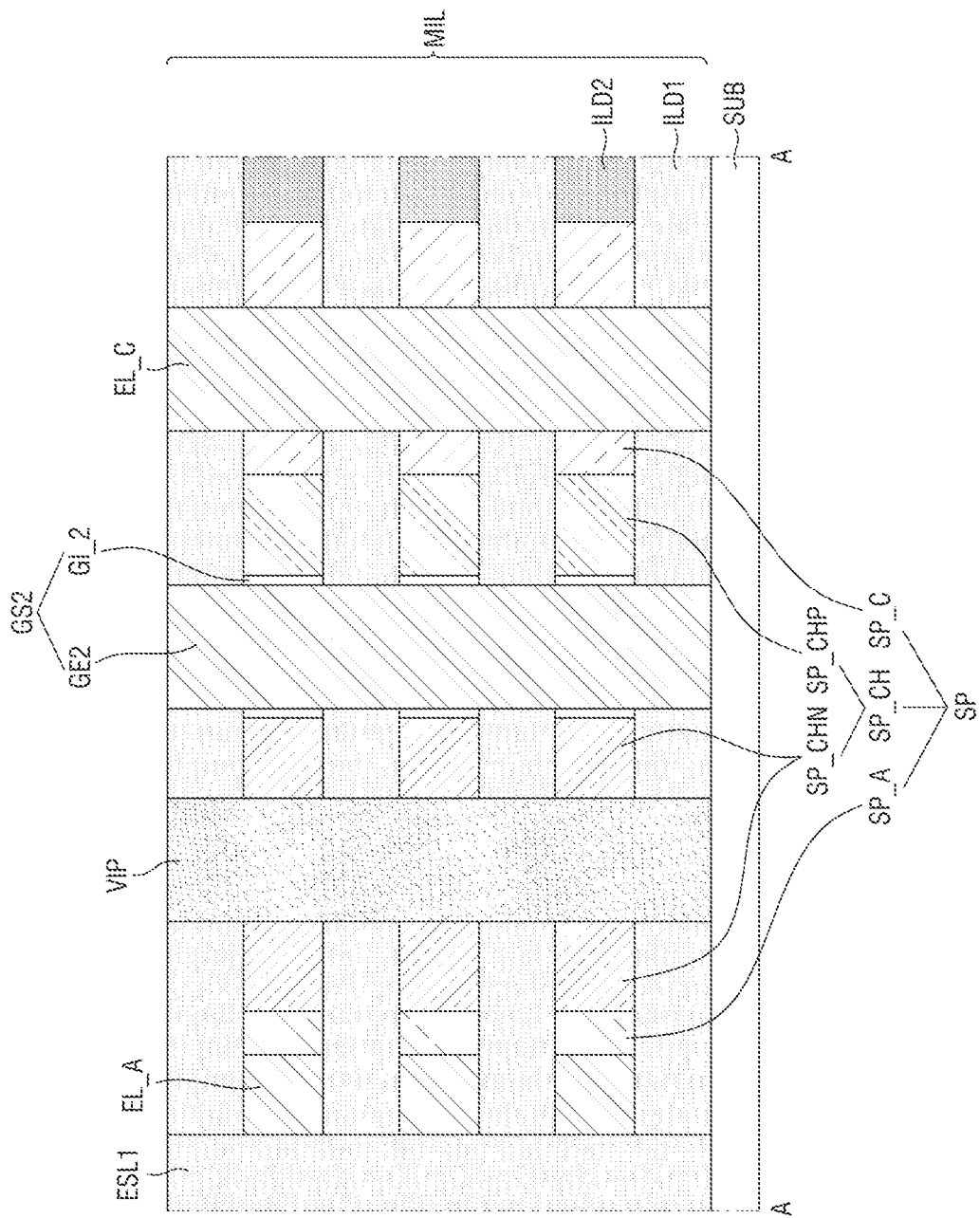
Figure 15:
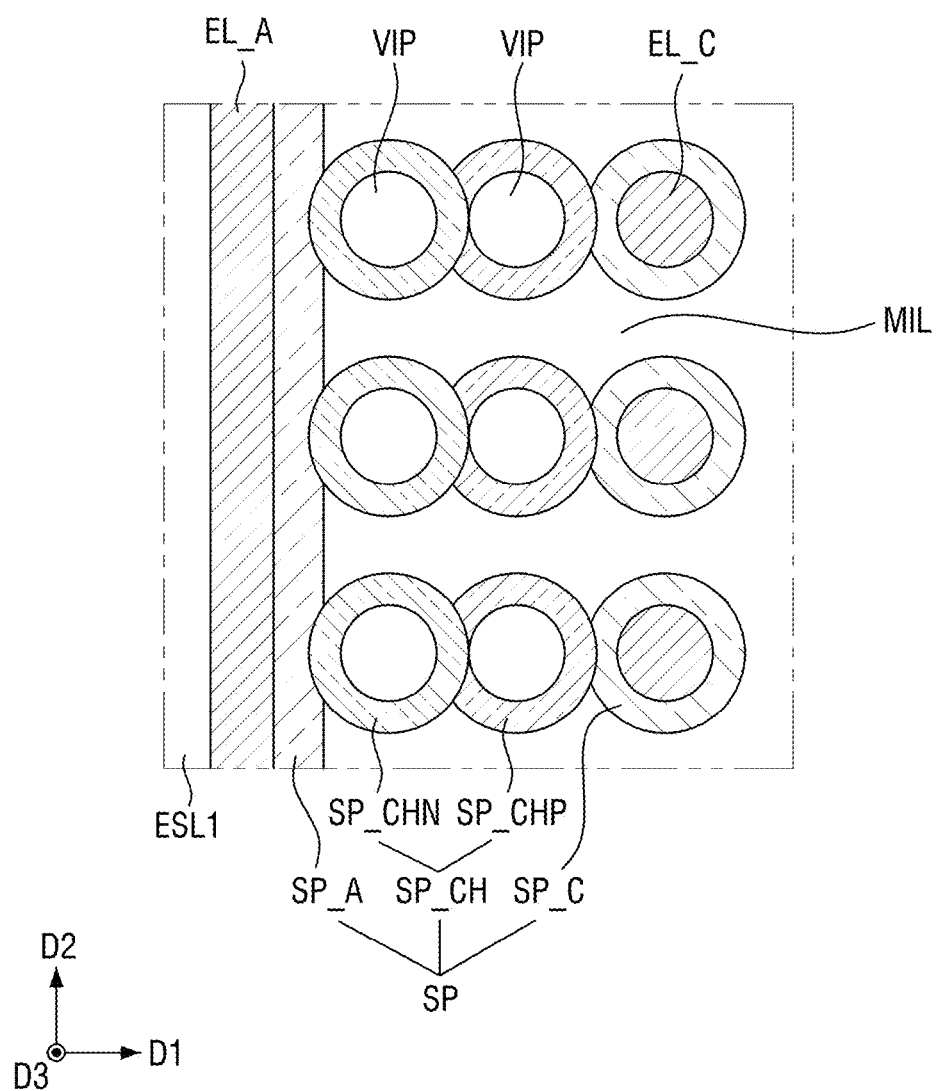
FIG. 15 is a diagram for explaining the semiconductor memory device according to some example embodiments.
Figure 16A:
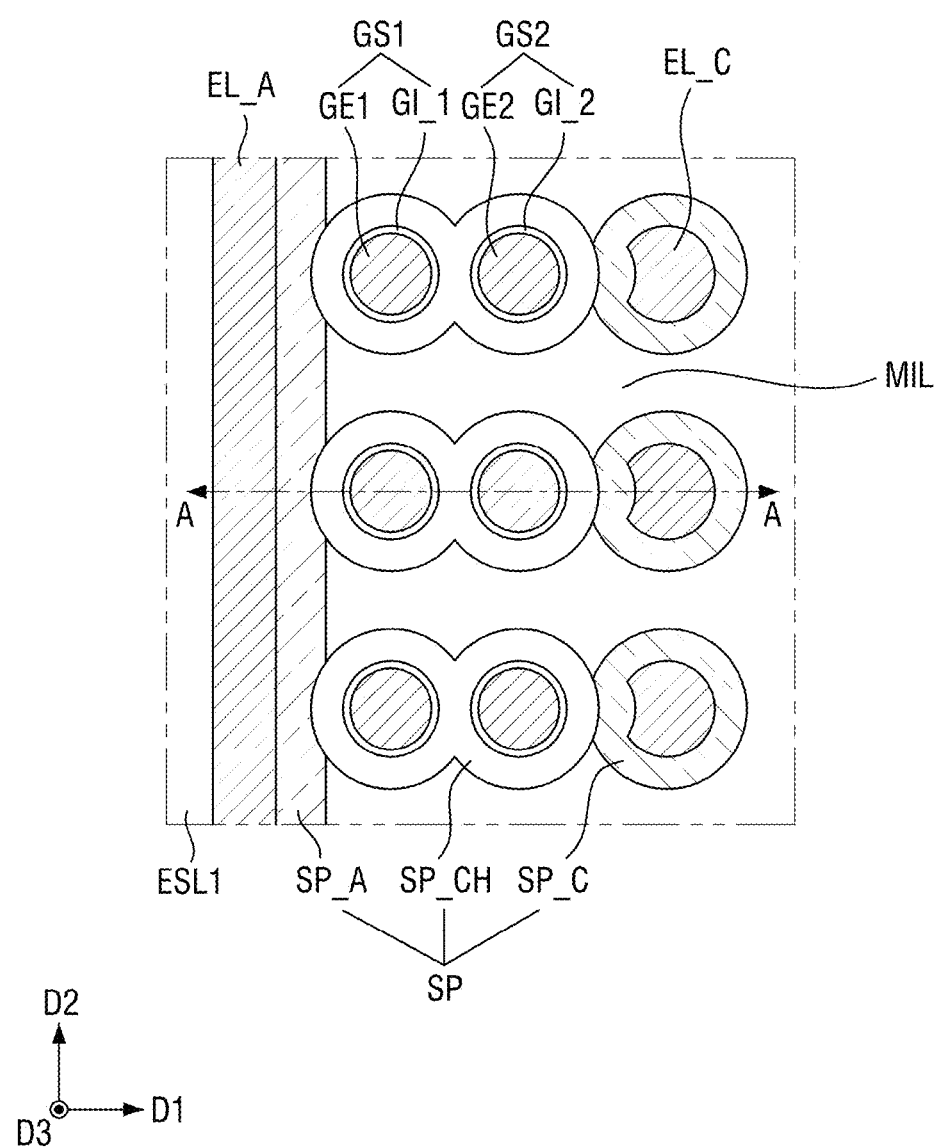
FIGS. 16A and 16B are diagrams for explaining the semiconductor memory device according to some example embodiments.
Figure 16B:
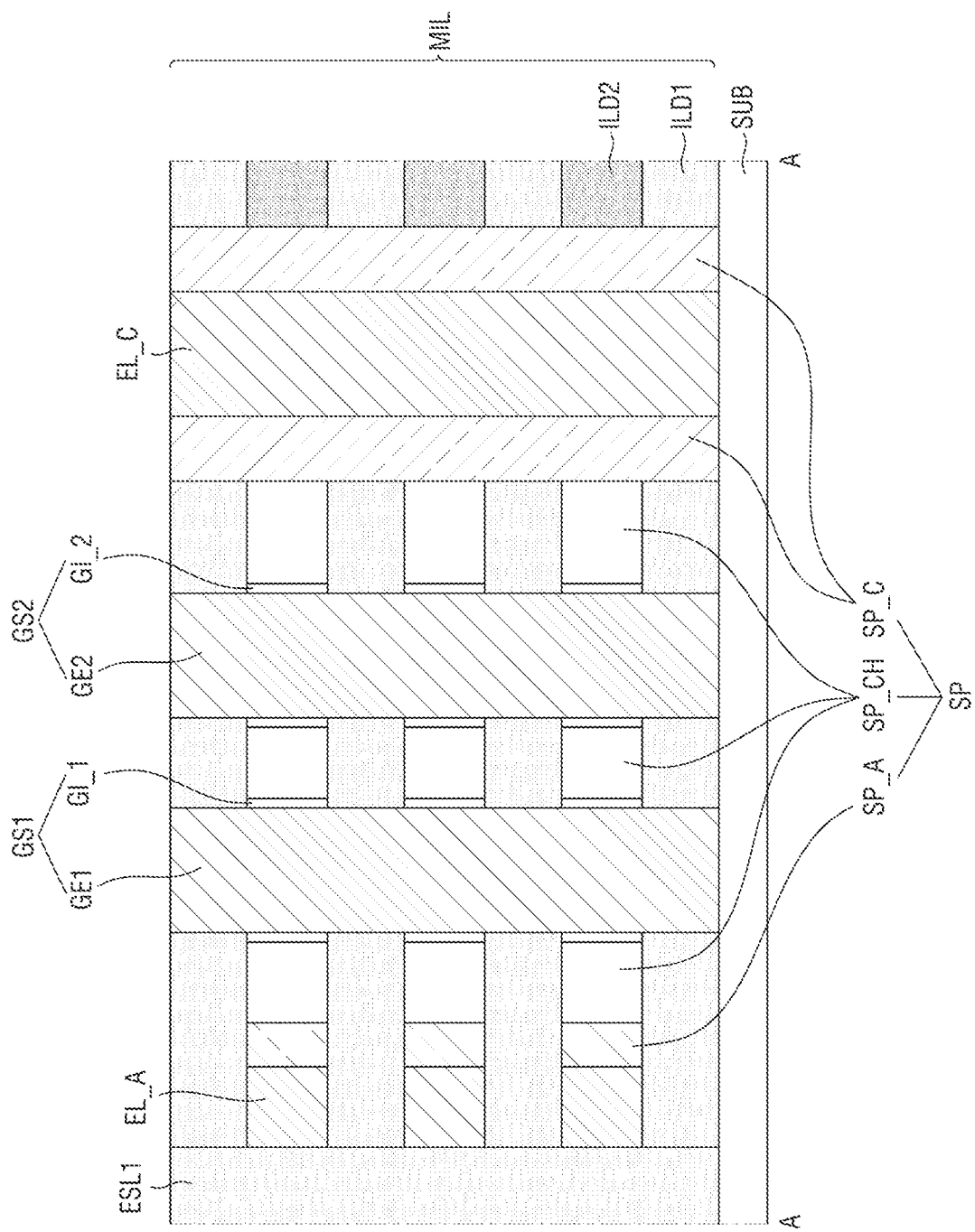

FIGS. 11 and 12 are diagrams for explaining the semiconductor memory device according to some example embodiments. FIGS. 13 and 14 are diagrams for explaining the semiconductor memory device according to some example embodiments. FIG. 15 is a diagram for explaining the semiconductor memory device according to some example embodiments. FIGS. 16A and 16B are diagrams for explaining the semiconductor memory device according to some example embodiments. For convenience of description, points different from those described using FIGS. 3 and 5 to 7 will be mainly described.

Referring to FIGS. 11 to 15, in the semiconductor memory device according to some example embodiments, a channel region SP_CH may include an n-type base channel portion SP_CHN and a p-type base channel portion SP_CHP.

The n-type base channel portion SP_CHN may be in contact with the first impurity region SP_A, and the p-type base channel portion SP_CHP may be in contact with the second impurity region SP_C. The n-type base channel portion SP_CHN may be disposed between the first impurity region SP_A and the p-type base channel portion SP_CHP.

The n-type base channel portion SP_CHN may be formed of a semiconductor material doped with n-type impurities. The concentration of the n-type impurities of the n-type base channel portion SP_CHN is lower than the concentration of the n-type impurities of the second impurity region SP_C. The p-type base channel portion SP_CHP may be formed of a semiconductor material doped with p-type impurities. The concentration of the p-type impurities of the p-type base channel portion SP_CHP is lower than the concentration of the p-type impurities of the first impurity region SP_A.

In FIGS. 11 to 15, the n-type base channel portion SP_CHN is shown as being in contact with the second gate insulating film GI_2, but example embodiments is not limited thereto. A part of the p-type base channel portion SP_CHP may, of course, be interposed between the n-type base channel portion SP_CHN and the second gate insulating film GI_2.

In addition, a part of the n-type base channel portion SP_CHN is shown as being indented into the p-type base channel portion SP_CHP, the embodiment is not limited thereto. The forms of the n-type base channel portion SP_CHN and the p-type base channel portion SP_CHP may of course vary, depending on the order for producing the n-type base channel portion SP_CHN and the p-type base channel portion SP_CHP.

In FIGS. 11 and 12, the first gate electrode GE1 may penetrate the n-type base channel portion SP_CHN of the channel region SP_CH. The second gate electrode GE2 may penetrate the p-type base channel portion SP_CHP of the channel region SP_CH.

In FIGS. 13 and 14, the first gate structure GS1 may be replaced with a vertical insulating structure VIP. That is, the vertical insulating structure VIP may penetrate the n-type base channel portion SP_CHN of the channel region SP_CH. The vertical insulating structure VIP may extend in the third direction D3. The vertical insulating structure VIP may include, for example, at least one of a silicon oxide film, a silicon nitride film, a silicon oxynitride film, a carbon-containing silicon oxide film, a carbon-containing silicon nitride film, and a carbon-containing silicon oxynitride film.

Unlike the shown configuration, the vertical insulating structure VIP may replace the second gate structure GS2.

In FIG. 15, a gate structure penetrating the channel region SP_CH may not be disposed between the first conductive connection line EL_A and the second conductive connection line EL_C. That is, the vertical insulating structure VIP may penetrate the n-type base channel portion SP_CHN and the p-type base channel portion SP_CHP, respectively.

Referring to FIGS. 16A and 16B, in the semiconductor device according to some example embodiments, a part of the outer wall of the second conductive connection line EL_C may be indented in a central direction of the second conductive connection line EL_C.

A portion of the second conductive connection line EL_C that faces the second gate electrode GE2 may be indented in the central direction of the second conductive connection line EL_C.

The second impurity region SP_C may have a cylindrical shape extending in the third direction D3. The second impurity region SP_C may wrap the outer wall of the second conductive connection line EL_C.

Figure 17:
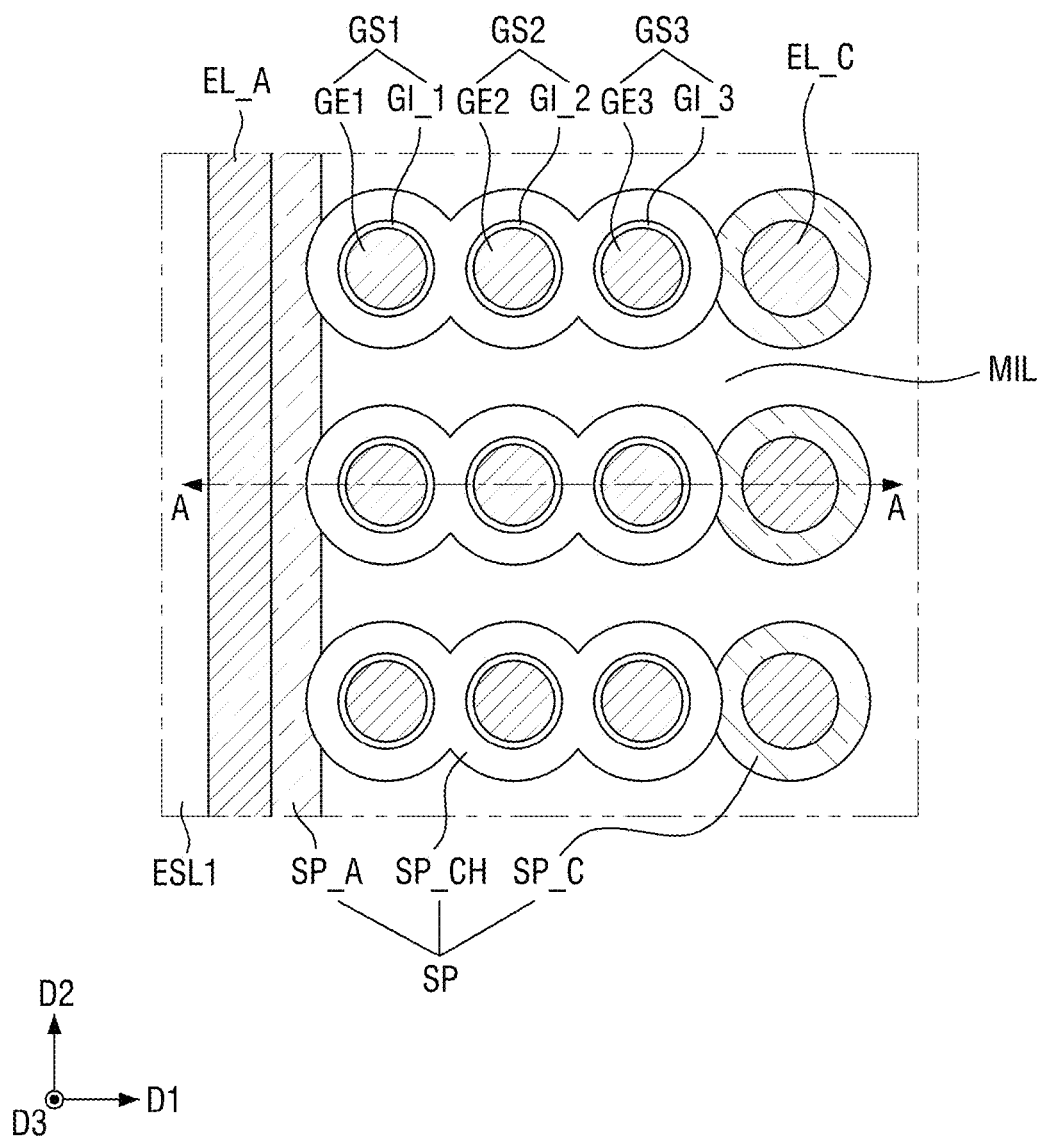
FIGS. 17 and 18 are diagrams for explaining the semiconductor device according to some example examples.
Figure 18:
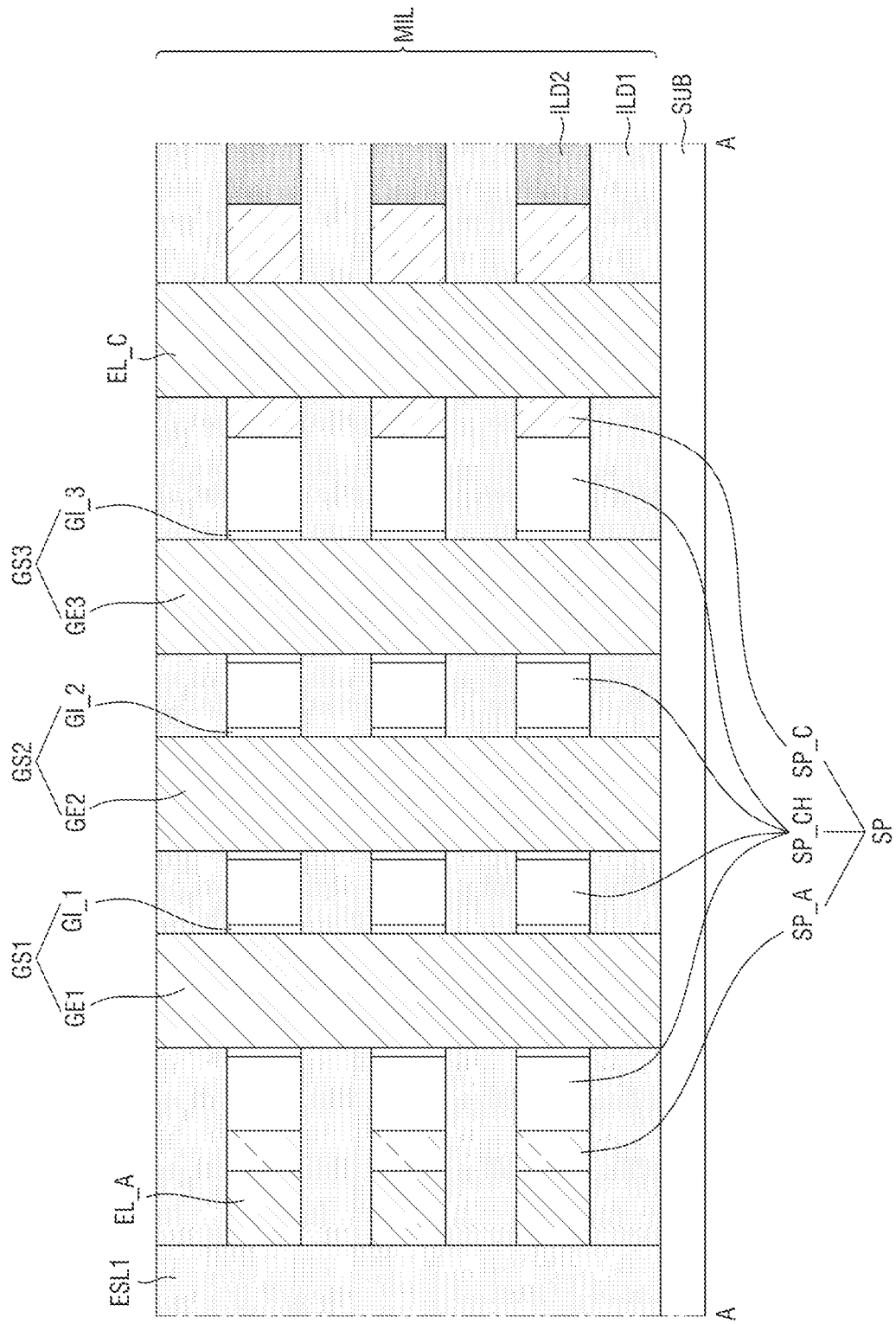

FIGS. 17 and 18 are diagrams for explaining the semiconductor device according to some examples. For convenience of description, points different from those described using FIGS. 3 and 5 to 7 will be mainly described.

Referring to FIGS. 17 and 18, the semiconductor memory device according to some example embodiments may further include a third gate structure GS3 penetrating the channel region SP_CH.

The third gate structure GS3 may be disposed on the substrate SUB. The third gate structure GS3 may extend long in the third direction D3. Each third gate structure GS3 may penetrate the mold structure MIL.

At least apart of the third gate structure GS3 may be surrounded by the channel region SP_CH. In the region in which the third gate structure GS3 and the semiconductor pattern SP intersect each other, the channel region SP_CH may entirely wrap the sidewalls of the third gate structure GS3 extending in the third direction D3.

The first to third gate structures GS1, GS2 and GS3 may be sequentially arranged in the first direction D1, on the basis of the first conductive connection line EL_A.

The third gate structure GS3 may include a third gate electrode GE3 and a third gate insulating film GI_3. The third gate electrode GE3 may extend in the third direction D3 and penetrate the channel region SP_CH. The third gate insulating film GI_3 may be disposed between the third gate electrode GE3 and the semiconductor pattern SP. The third gate insulating film GI_3 may be disposed between the third gate electrode GE3 and the channel region SP_CH. The third gate electrode GE3 may correspond to the gate electrode of the selection transistor $T_{SEL}$ of FIG. 1B.

The third gate electrodes GE3 may each include at least one of a conductive metal nitride, a metal, and a metal-semiconductor compound.

Figure 19:
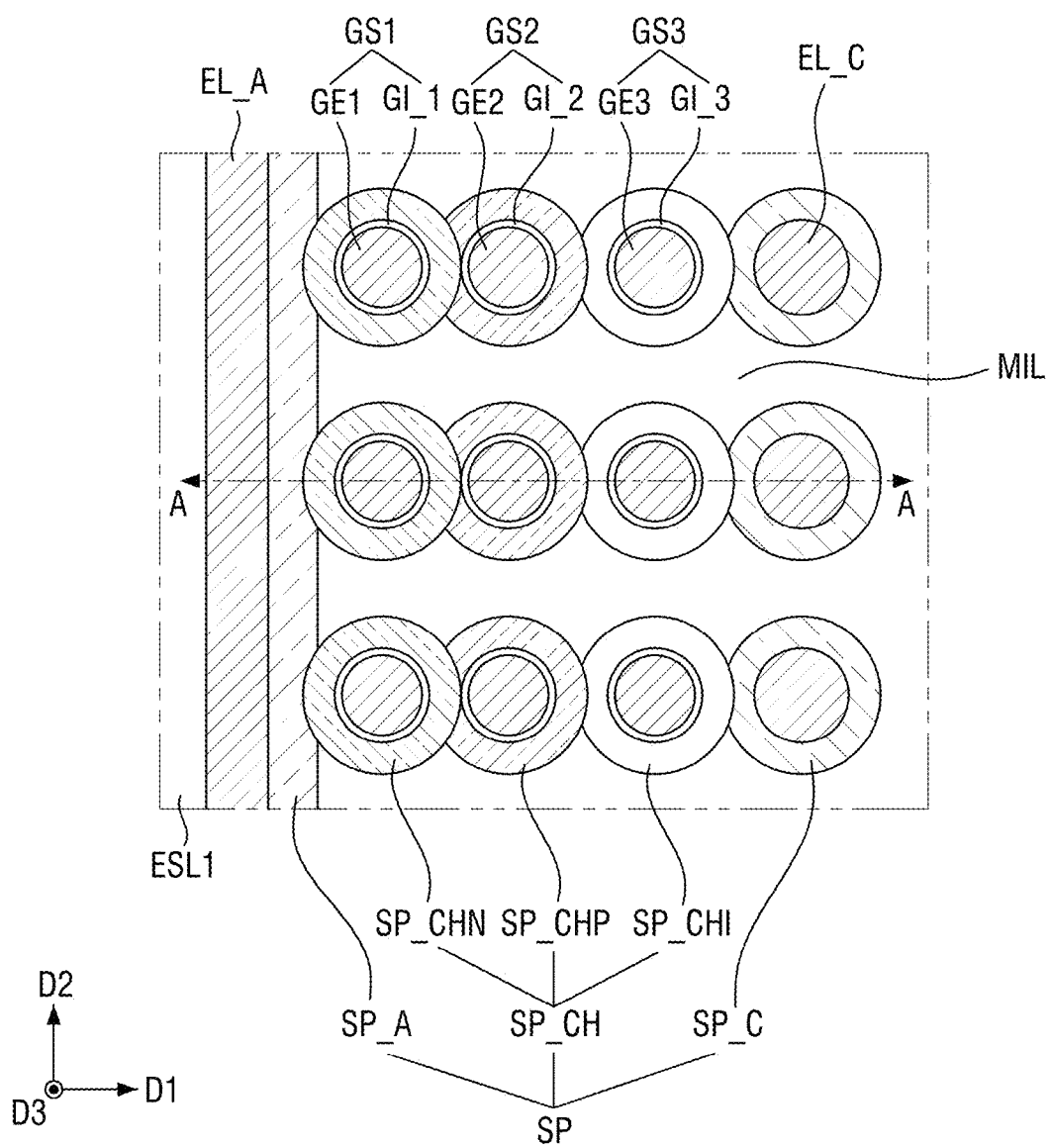
FIGS. 19 and 20 are diagrams for explaining the semiconductor memory device according to some example embodiments.
Figure 20:
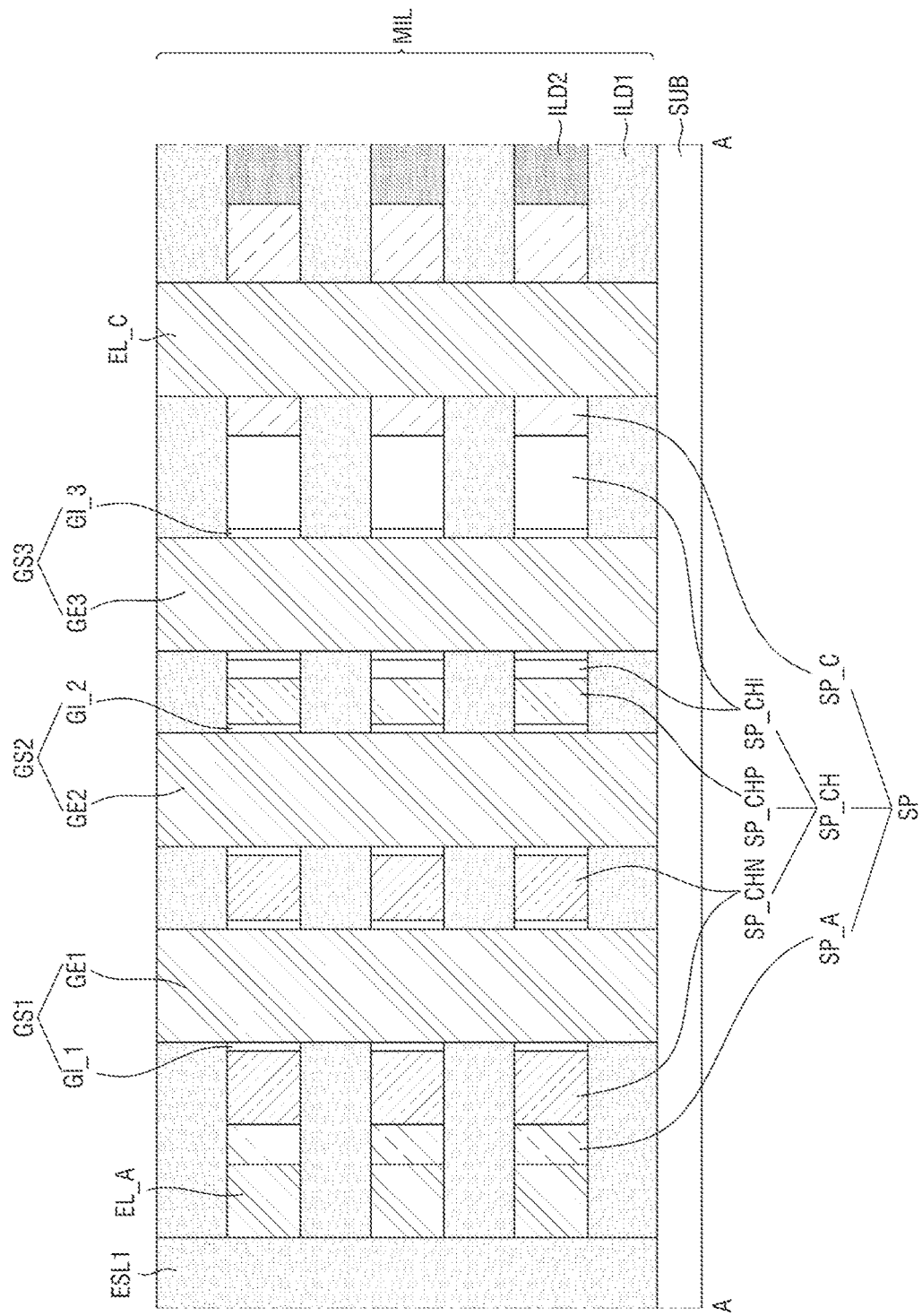

FIGS. 19 and 20 are diagrams for explaining the semiconductor memory device according to some example embodiments. For convenience of description, points different from those described using FIGS. 17 and 18 will be mainly described.

Referring to FIGS. 19 and 20, in the semiconductor memory device according to some example embodiments, a channel region SP_CH may include an n-type base channel portion SP_CHN, a p-type base channel portion SP_CHP, and an undoped base channel portion SP_CHI.

The n-type base channel portion SP_CHN is in contact with the first impurity region SP_A. The undoped base channel portion SP_CHI may be in contact with the second impurity region SP_C. The p-type base channel portion SP_CHP is disposed between the n-type base channel portion SP_CHN and the undoped base channel portion SP_CHI. The p-type base channel portion SP_CHP is in contact with the n-type base channel portion SP_CHN and the undoped base channel portion SP_CHI.

The n-type base channel portion SP_CHN may be formed of a semiconductor material doped with n-type impurities. The concentration of the n-type impurities of the n-type base channel portion SP_CHN is lower than the concentration of the n-type impurities of the second impurity region SP_C. The p-type base channel portion SP_CHP may be formed of a semiconductor material doped with p-type impurities. The concentration of the p-type impurities of the p-type base channel portion SP_CHP is lower than the concentration of the p-type impurities of the first impurity region SP_A.

As an example, the undoped base channel portion SP_CHI may be formed of an undoped semiconductor material.

As another example, the undoped base channel portion SP_CHI may be formed of a semiconductor material doped with p-type impurities. At this time, the concentration of p-type impurities of the undoped base channel portion SP_CHI is lower than the concentration of p-type impurities of the p-type base channel portion SP_CHP.

Figure 21:
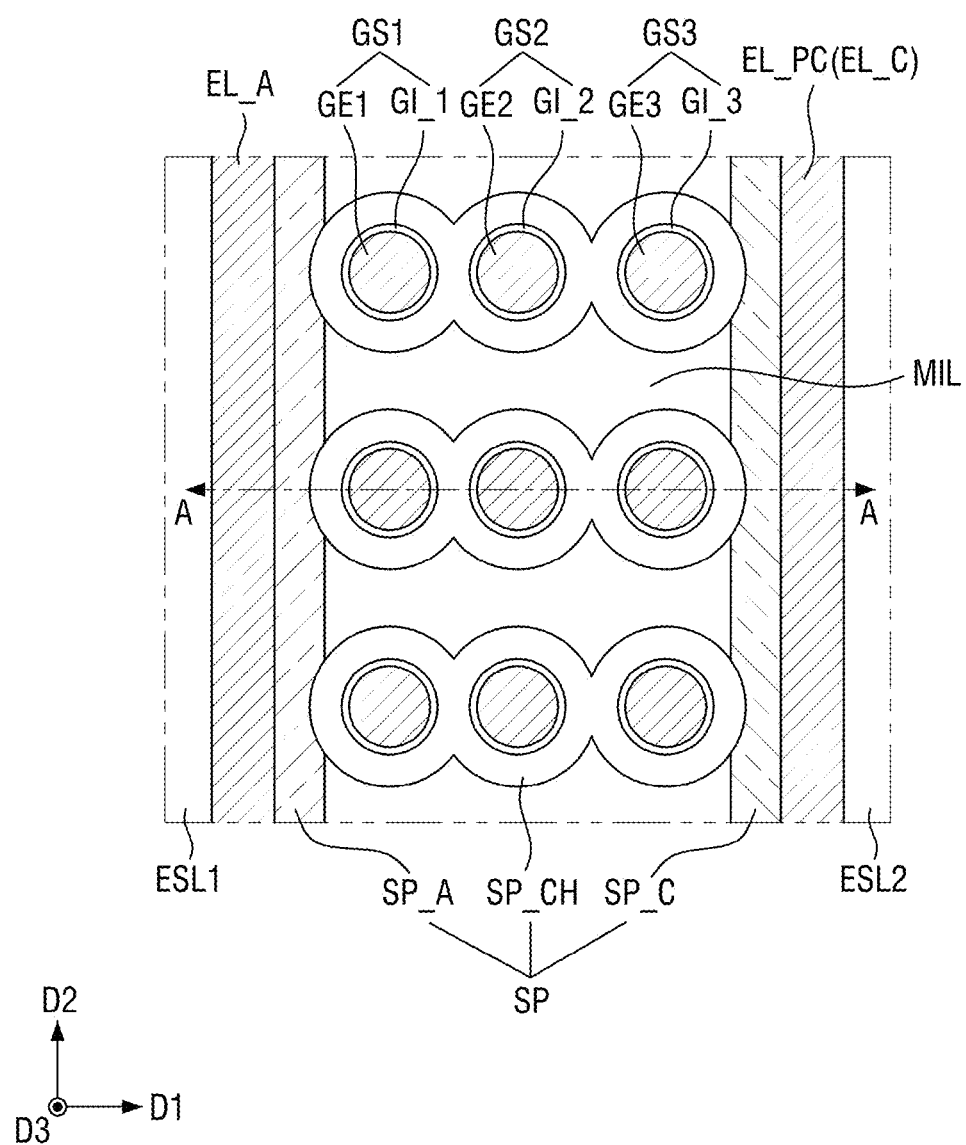
FIGS. 21 and 22 are diagrams for explaining the semiconductor memory device according to some example embodiments.
Figure 22:
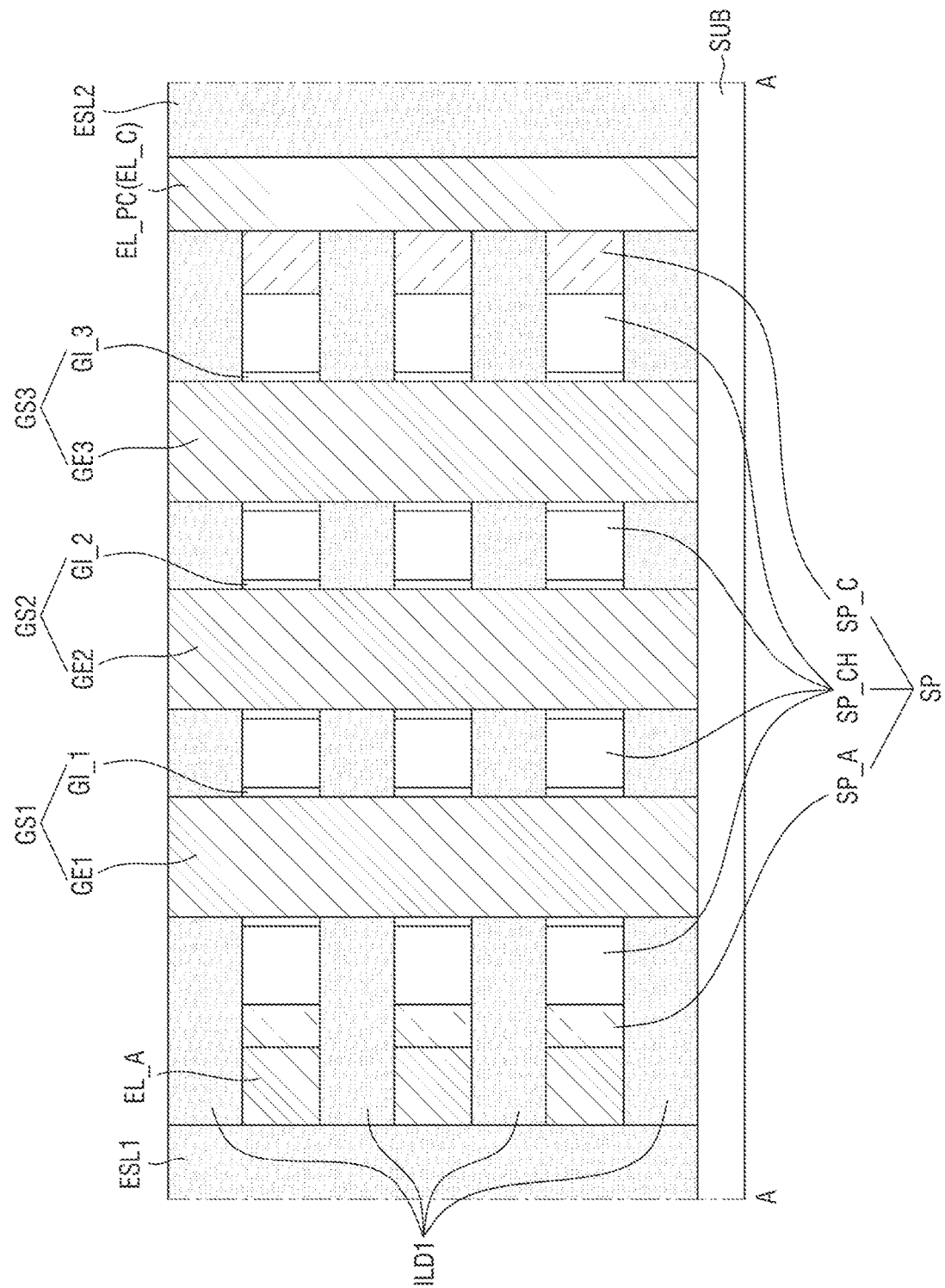

FIGS. 21 and 22 are diagrams for explaining the semiconductor memory device according to some example embodiments. For convenience of description, points different from those described using FIGS. 17 and 18 will be mainly described.

Referring to FIGS. 21 and 22, in the semiconductor memory device according to some example embodiments, the second impurity region SP_C may extend long in the second direction D2, like the first impurity region SP_A.

The plurality of semiconductor patterns SP arranged in the second direction D2 may share the first impurity region SP_A and the second impurity region SP_C. The channel regions SP_CH between the first impurity region SPA and the second impurity region SP_C may be arranged to be spaced apart from each other in the second direction D2.

The second conductive connection line EL_C may be a conductive plate electrode EL_PC having a plate shape. The conductive plate electrode EL_PC does not penetrate the semiconductor patterns SP. The conductive plate electrode EL_PC is in contact with one end of the semiconductor patterns SP. The conductive plate electrode EL_PC is in contact with the second impurity region SP_C.

When the semiconductor patterns SP include the first semiconductor pattern and the second semiconductor pattern disposed along the second direction D2, the conductive plate electrode EL_PC may be in contact with (e.g. in direct contact with) one end of the first semiconductor pattern and one end of the second semiconductor pattern.

The conductive plate electrode EL_PC may also connect the second impurity regions SP_C spaced apart from each other in the third direction D3. The conductive plate electrode EL_PC also covers the sidewall of the first mold insulating layer ILD1 between the second impurity regions SP_C. The conductive plate electrodes EL_PC are separated by the second electrode separation pattern ESL2. The second electrode separation pattern ESL2 may extend long in the second direction D2. The second electrode separation pattern ESL2 may include an insulating material.

Figure 23:
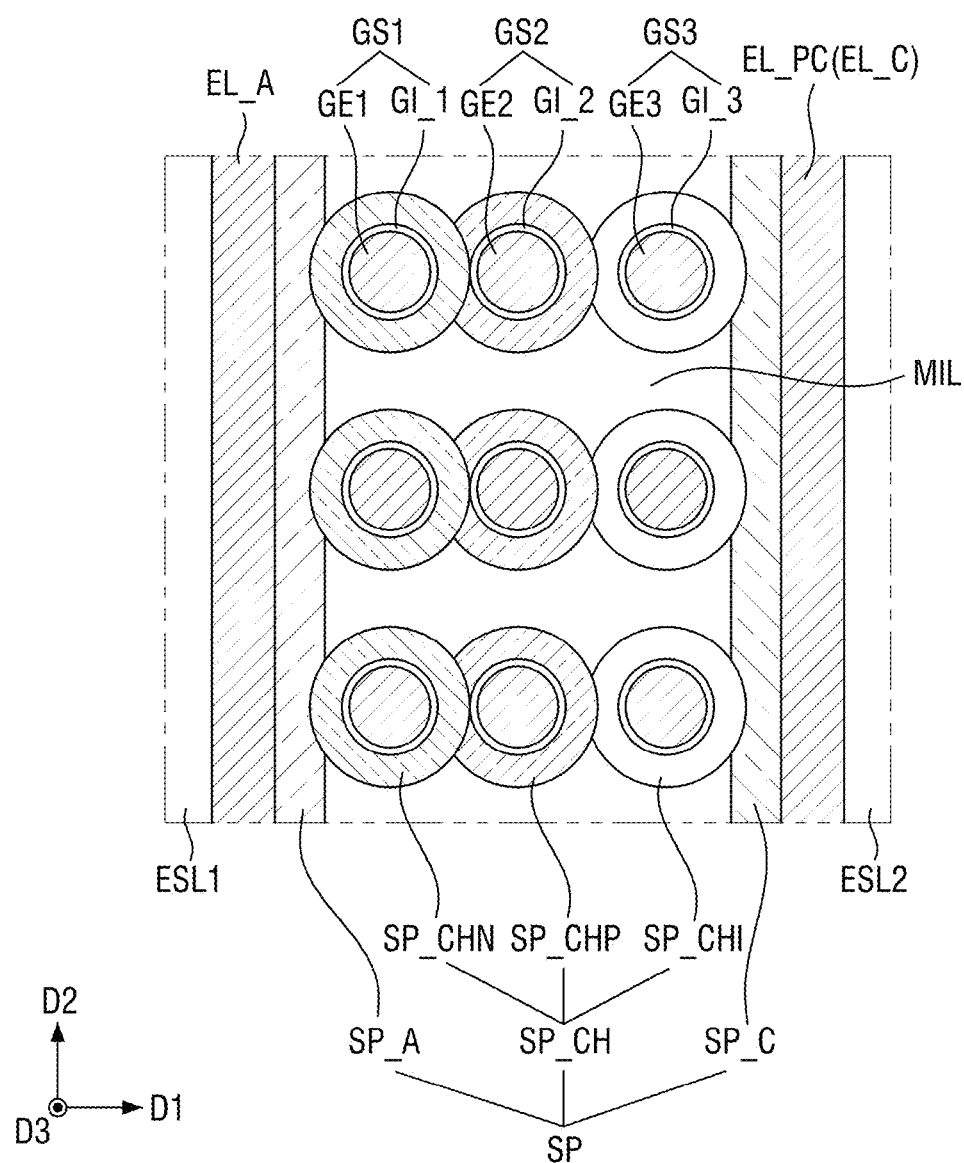
FIG. 23 is a diagram for explaining the semiconductor memory device according to some example embodiments.

FIG. 23 is a diagram for explaining the semiconductor memory device according to some example embodiments. For convenience of description, points different from those described using FIGS. 21 and 22 will be mainly described.

Referring to FIG. 23, in the semiconductor memory device according to some example embodiments, the channel region SP_CH may include an n-type base channel portion SP_CHN, a p-type base channel portion SP_CHP, and an undoped (e.g. an intrinsic) base channel portion SP_CHI.

Since the explanation of the n-type base channel portion SP_CHN, the p-type base channel portion SP_CHP, and the undoped base channel portion SP_CHI is substantially the same as that described using FIGS. 19 and 20, the explanation thereof will not be provided below.

Figure 24:
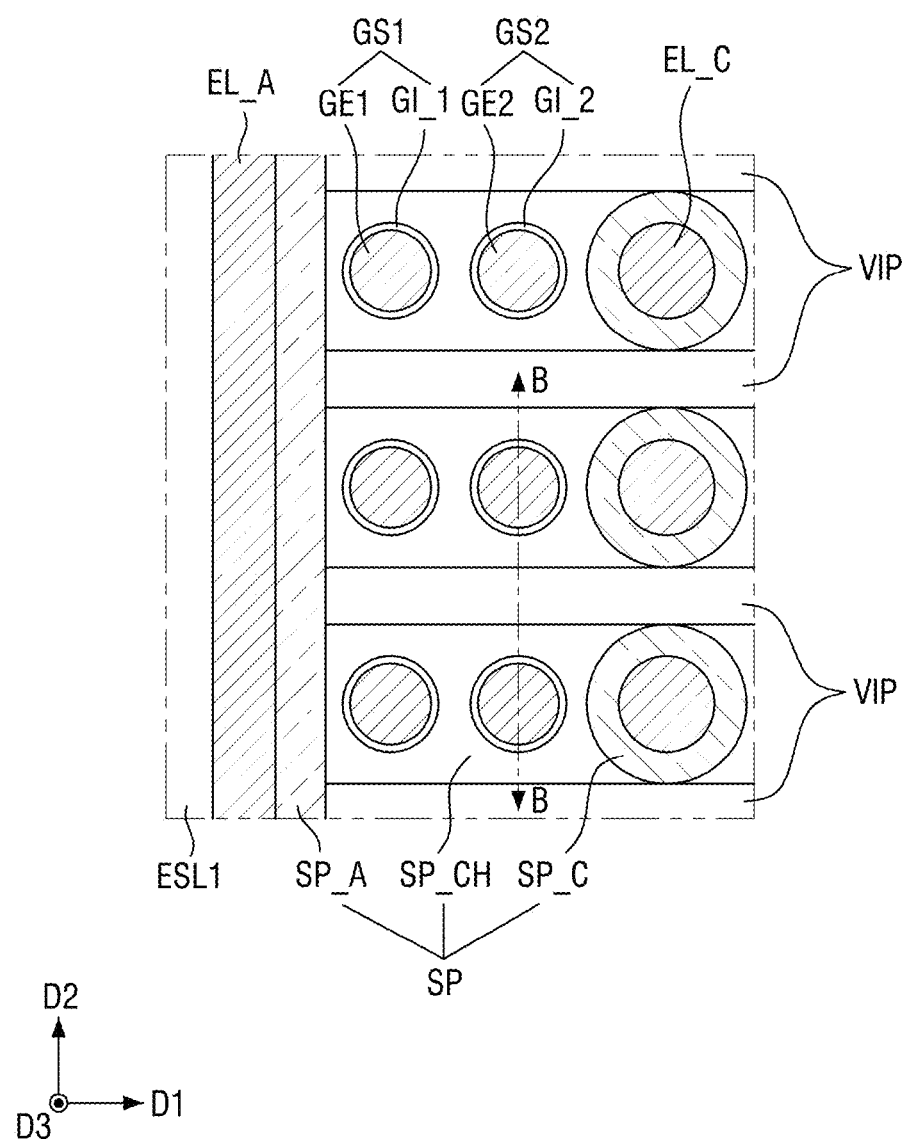
FIGS. 24 and 25 are diagrams for explaining the semiconductor memory device according to some example embodiments.
Figure 25:
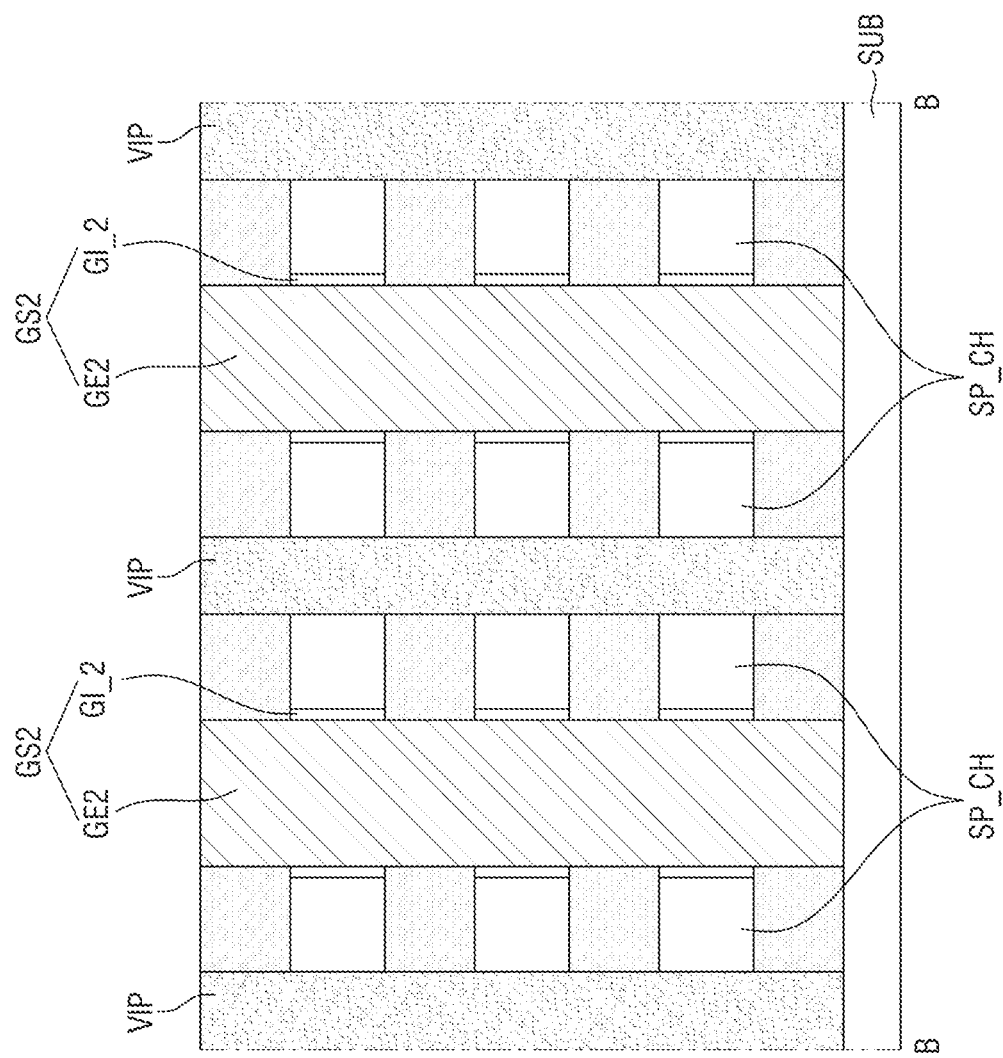
Figure 26:
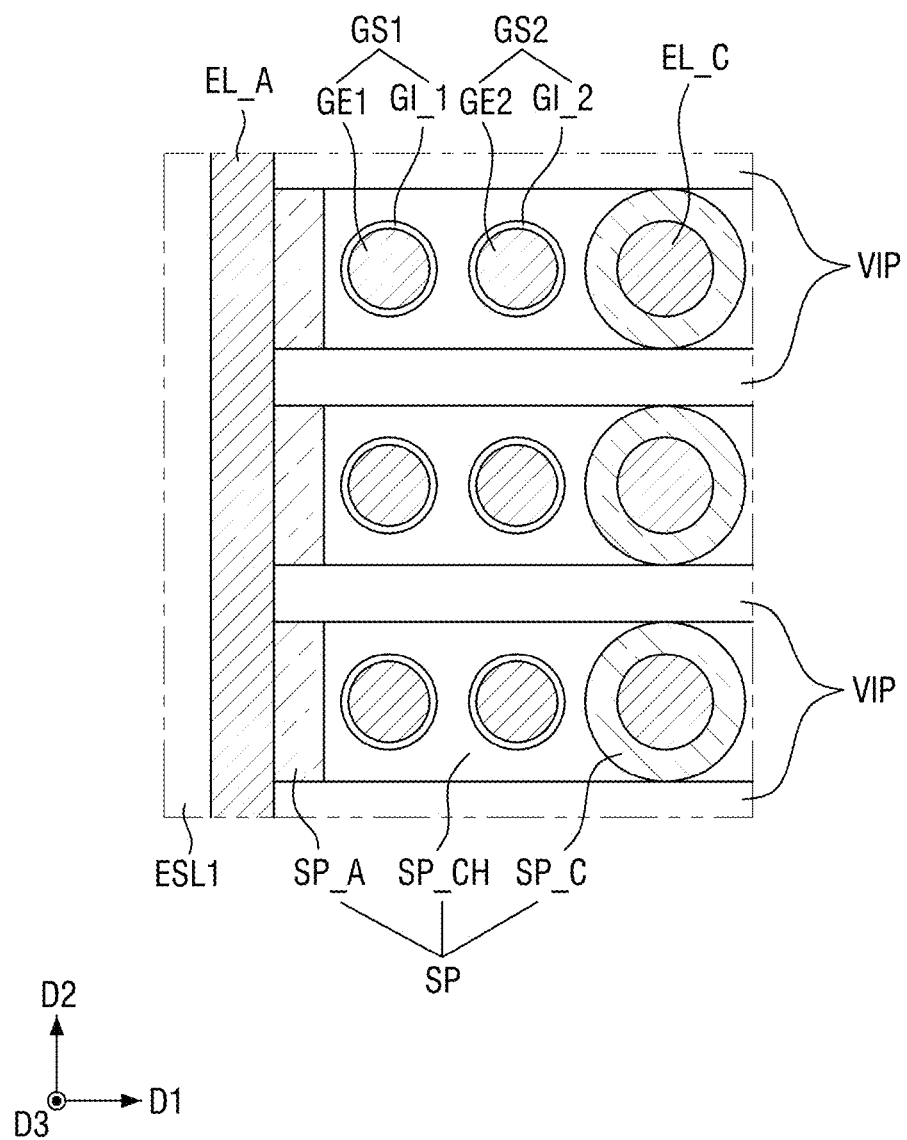
FIG. 26 is a diagram for explaining the semiconductor memory device according to some example embodiments.

FIGS. 24 and 25 are diagrams for explaining a semiconductor memory device according to some example embodiments. FIG. 26 is a diagram for explaining the semiconductor memory device according to some example embodiments. For convenience of description, points different from those described using FIGS. 3 and 5 to 7 will be mainly described.

Referring to FIGS. 24 to 26, in the semiconductor memory device according to some example embodiments, the semiconductor patterns SP and the first mold insulating layer ILD1 that are alternately stacked in the third direction D3 may be separated by the vertical insulating structure VIP.

The vertical insulating structure VIP may extend along in the first direction D1. The vertical insulating structure VIP is disposed on the substrate SUB and may extend long in the third direction D3. The vertical insulating structure VIP may pass through the semiconductor pattern SP and the first mold insulating layer ILD1.

The semiconductor patterns SP arranged in the first direction D2 and the third direction D3 may be defined by the vertical insulating structure VIP. In the semiconductor pattern SP, the channel region SP_CH and the second impurity region SP_C may be defined by the vertical insulating structure VIP.

The semiconductor pattern SP and the first mold insulating layer ILD1 may be in contact with the vertical insulating structure VIP.

In FIGS. 24 and 25, the vertical insulating structure VIP does not cut the first impurity regions SP_A of the semiconductor patterns SP. That is, the channel region SP_CH and the second impurity region SP_C separated from each other in the second direction D2 by the vertical insulating structure VIP may be connected by the first impurity region SP_A.

In FIG. 26, the vertical insulating structure VIP may also cut the first impurity region SP_A. The vertical insulating structure VIP may completely separate the semiconductor patterns SP in the second direction D2.

Figure 27:
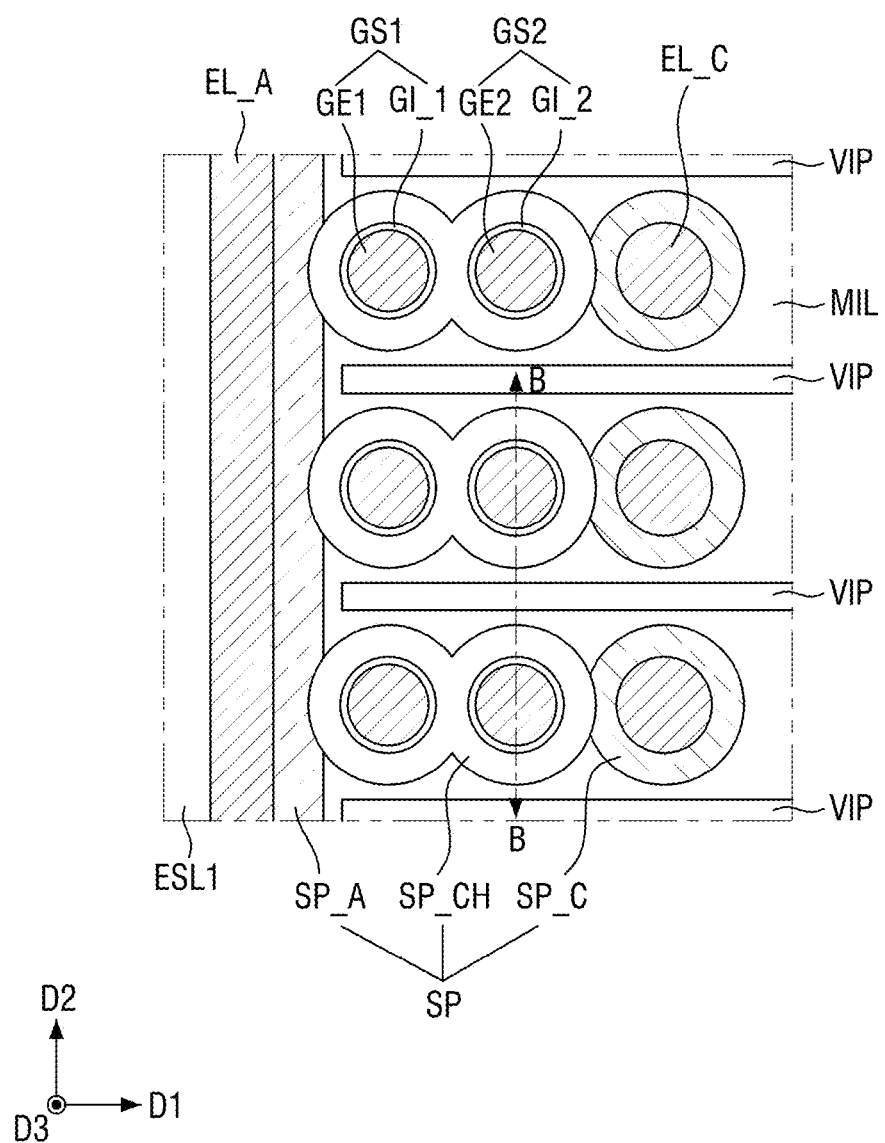
FIGS. 27 and 28 are diagrams for explaining the semiconductor memory device according to some example embodiments.
Figure 28:
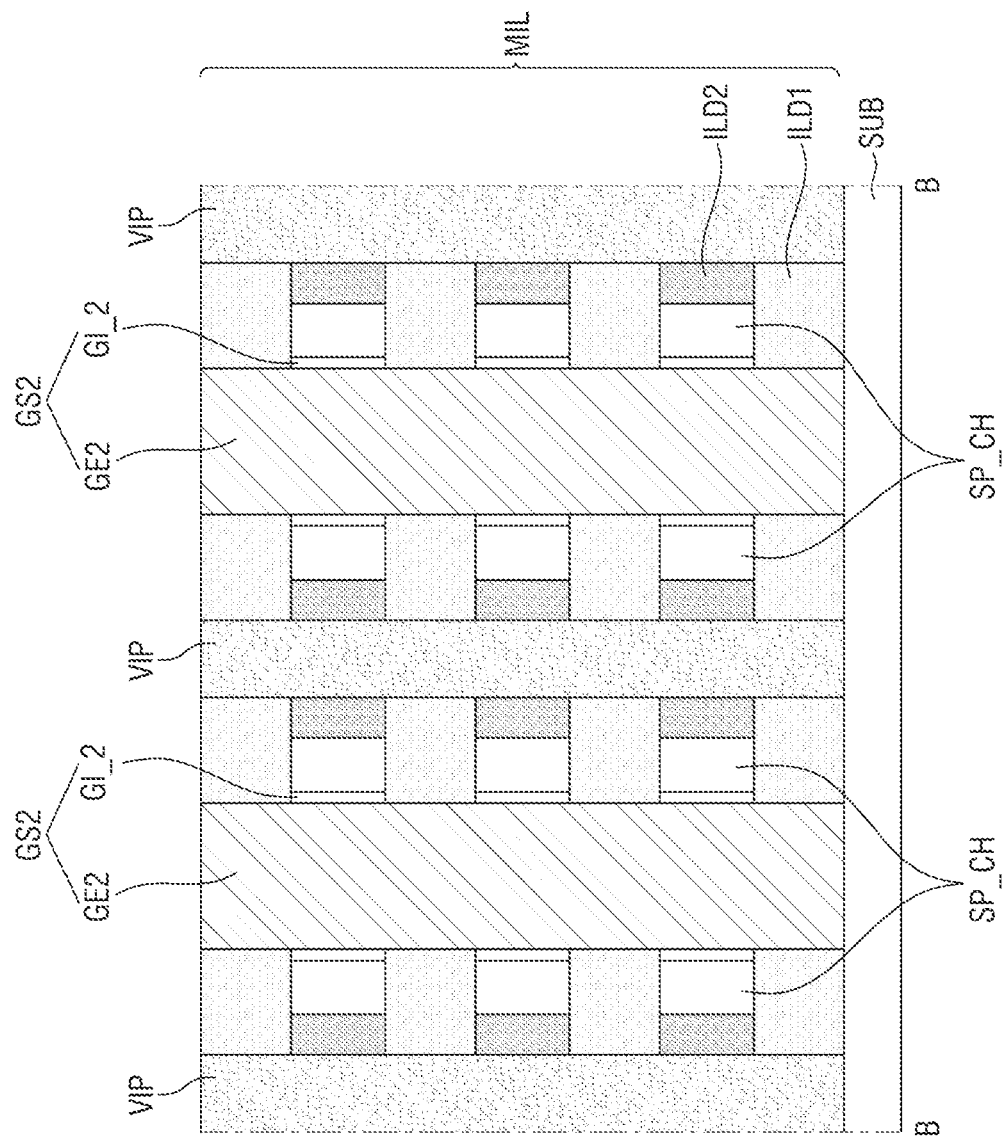
Figure 29:
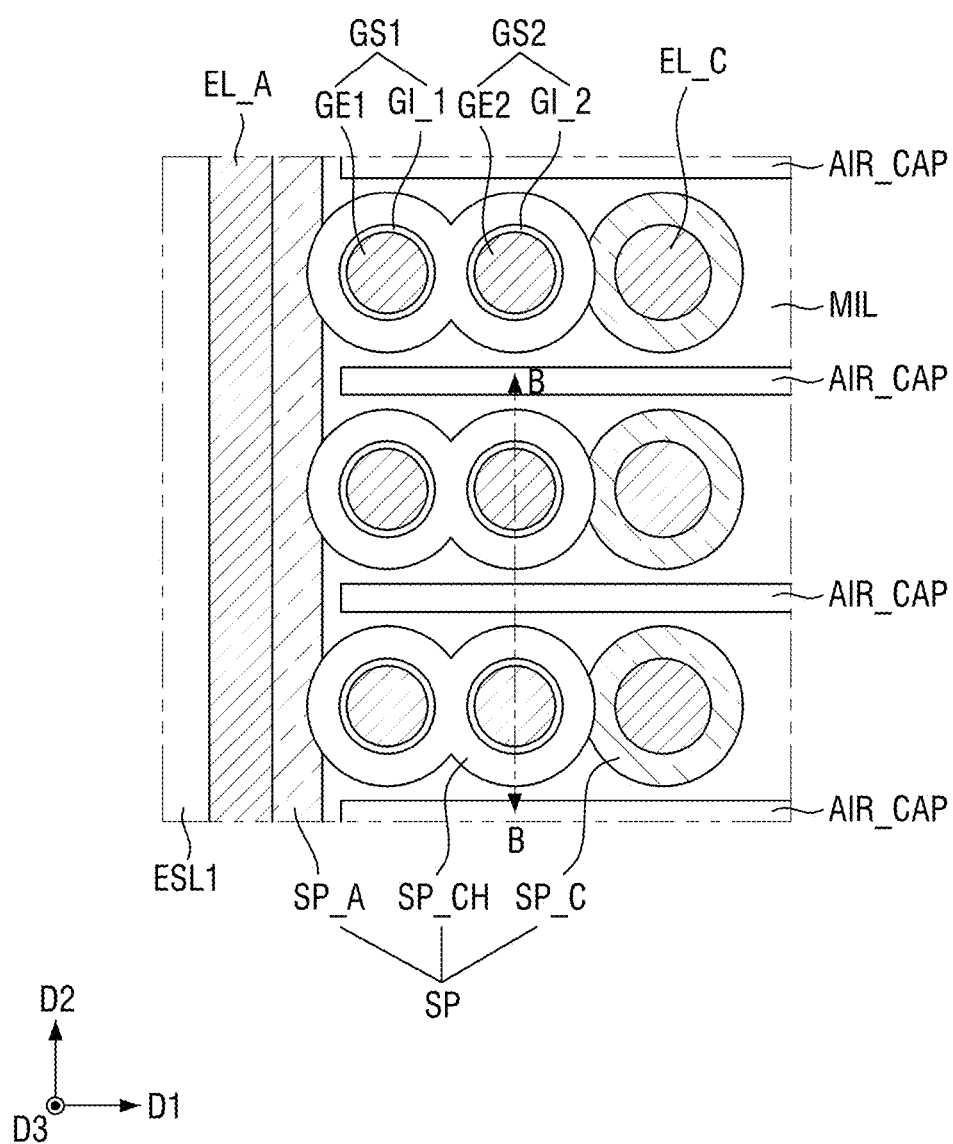
FIGS. 29 and 30 are diagrams for explaining the semiconductor memory device according to some example embodiments.
Figure 30:
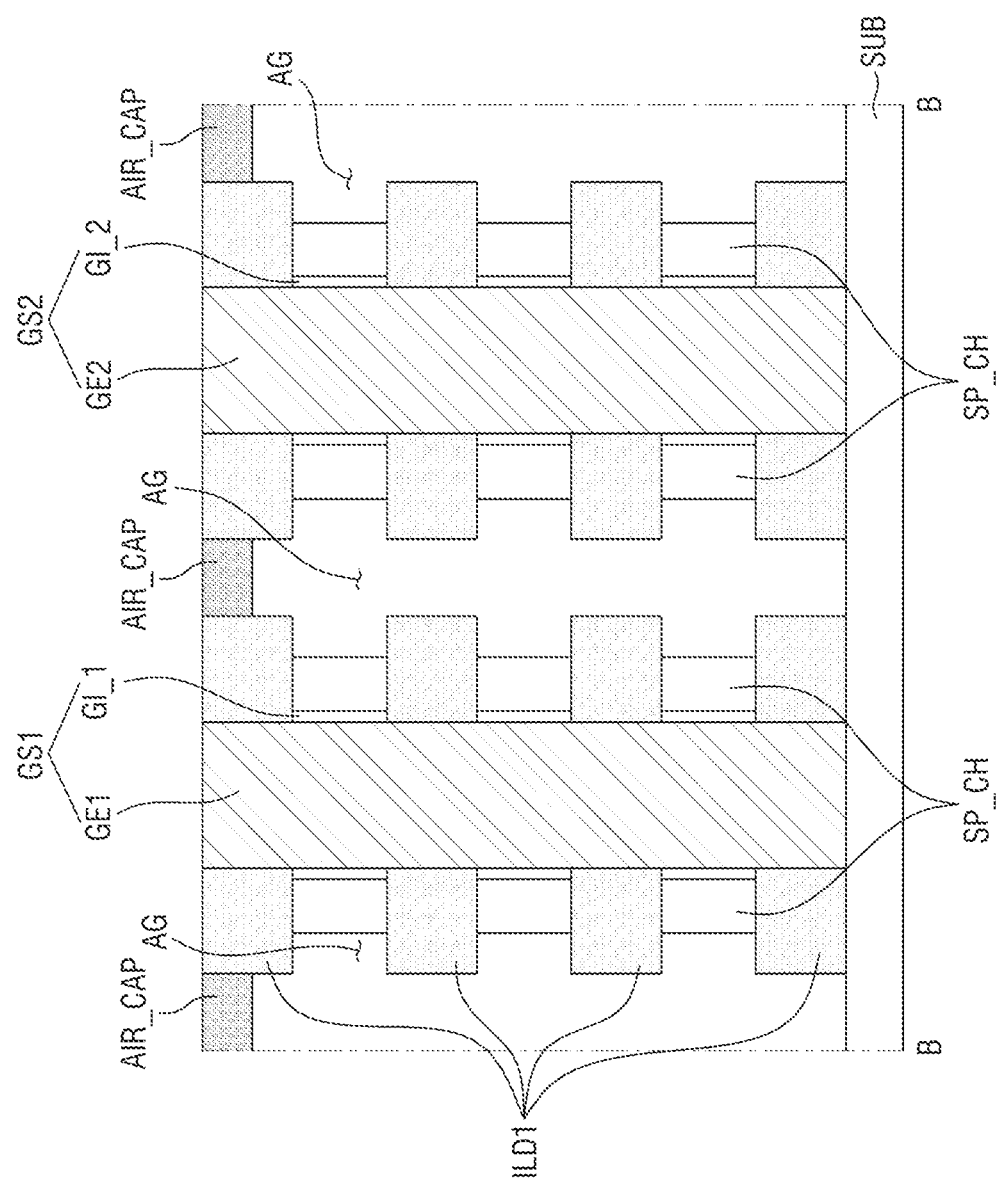
Figure 31:
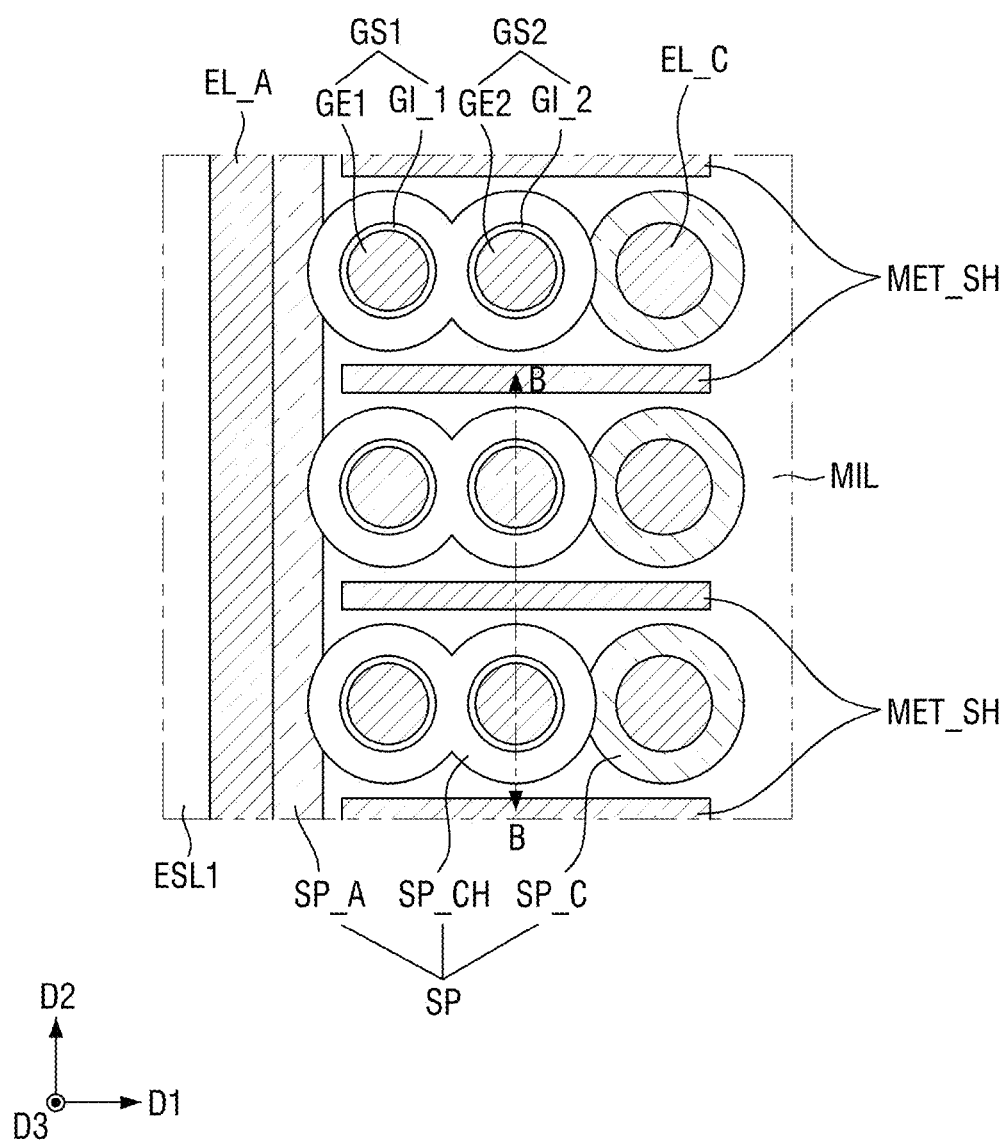
FIGS. 31 and 32 are diagrams for explaining the semiconductor memory device according to some example embodiments.
Figure 32:
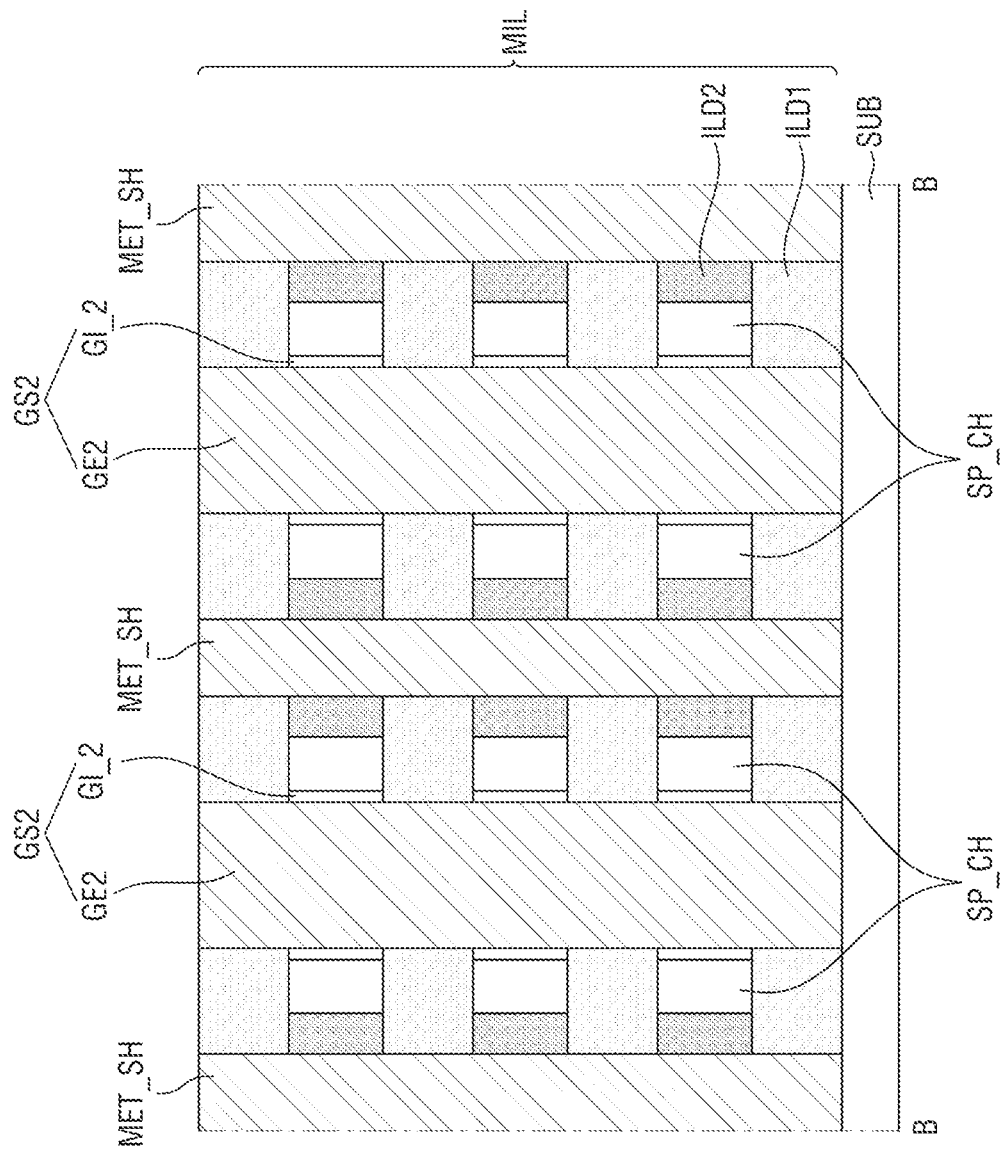

FIGS. 27 and 28 are diagrams for explaining the semiconductor memory device according to some example embodiments. FIGS. 29 and 30 are diagrams for explaining the semiconductor memory device according to some example embodiments. FIGS. 31 and 32 are diagrams for explaining the semiconductor memory device according to some example embodiments. For convenience of description, points different from those described using FIGS. 3 and 5 to 7 will be mainly described.

Referring to FIGS. 27 and 28, in the semiconductor memory device according to some example embodiments, the vertical insulating pattern VIP may cut the mold structure MIL between the semiconductor patterns SP arranged in the second direction D2.

The vertical insulating pattern VIP may define a region in the second direction D2 in which the channel region SP_CH is formed. While the channel region SP_CH is formed, the vertical insulating pattern VIP may prevent the channel region SP_CH adjacent to each other in the second direction D2 from coming into contact with each other.

Referring to FIGS. 29 and 30, the semiconductor memory device according to some example embodiments may further include an air gap AG disposed between the semiconductor patterns SP adjacent to each other in the second direction D2.

The air gap AG may be disposed between the first semiconductor pattern and the second semiconductor pattern that are adjacent to each other in the second direction D2. The air gap AG may be disposed between the adjacent channel regions SP_CH in the second direction D2 and the adjacent second impurity regions SP_C in the second direction D2.

The air gap AG may be defined by the air gap capping film AIR_CAP, the first mold insulating layer ILD1, the semiconductor patterns SP, and the substrate SUB.

Referring to FIGS. 31 and 32, the semiconductor memory device according to some example embodiments may further include a shielding pattern MET_SH disposed between the semiconductor patterns SP adjacent to each other in the second direction D2.

The shielding pattern MET_SH may extend long in the first direction D1. The shielding pattern MET_SH may penetrate the mold structure MIL.

The shielding pattern MET_SH may be disposed between the first semiconductor pattern and the second semiconductor pattern which are adjacent to each other in the second direction D2. The shielding pattern MET_SH may be disposed between the adjacent channel regions SP_CH in the second direction D2 and the adjacent second impurity regions SP_C in the second direction D2.

The shielding pattern MET_SH may include a conductive material. The shielding pattern MET_SH may include at least one of a conductive metal nitride, a metal, and a metal-semiconductor compound. A constant voltage may be provided to the shielding pattern MET_SH.

Figure 33:
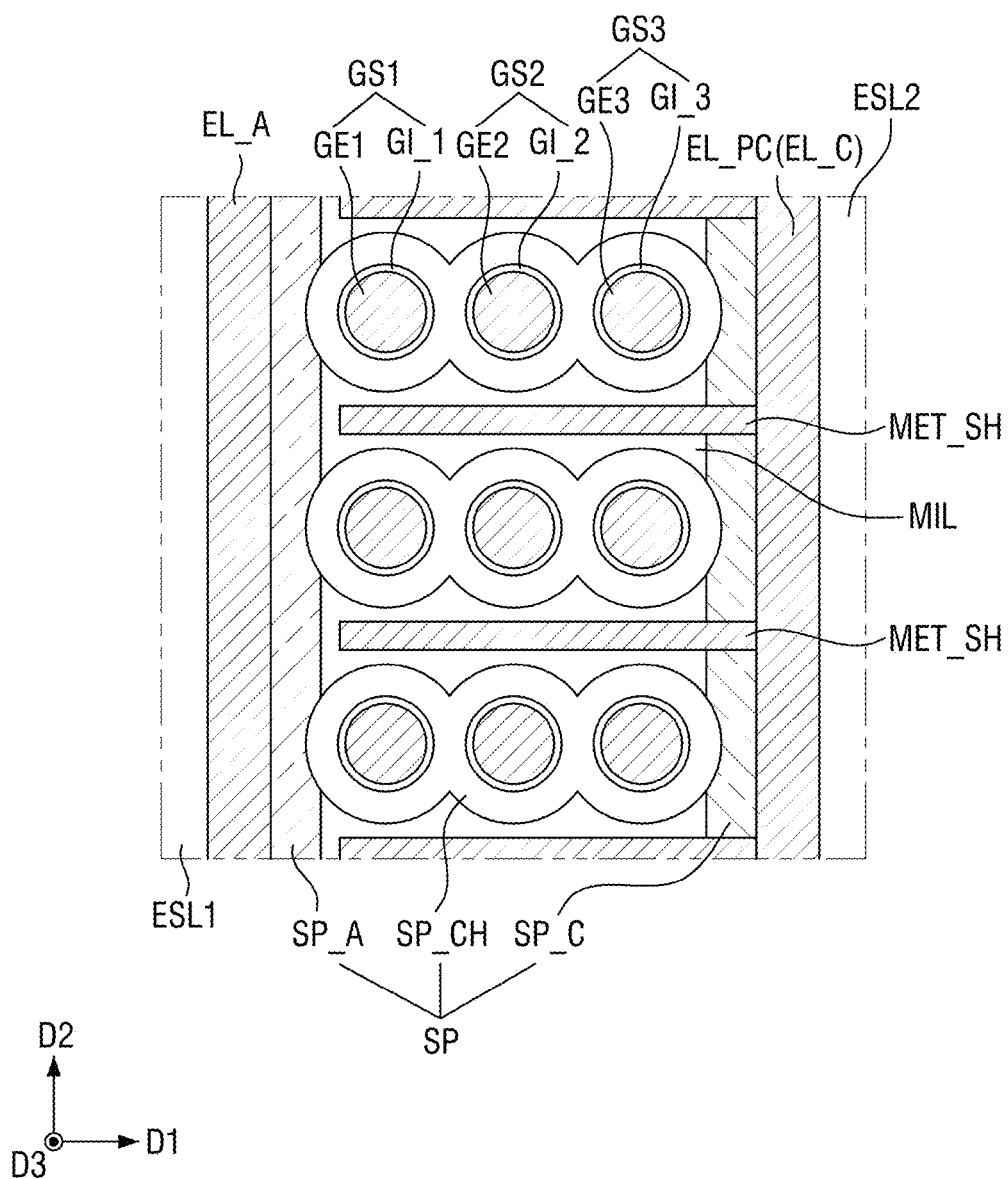
FIG. 33 is a diagram for explaining the semiconductor memory device according to some example embodiments.

FIG. 33 is a diagram for explaining the semiconductor memory device according to some example embodiments. For convenience of description, points different from those described using FIGS. 31 and 32 will be mainly described.

Referring to FIG. 33, in the semiconductor device according to some example embodiments, the second conductive connection line EL_C may be a conductive plate electrode EL_PC having a plate shape.

The conductive plate electrode EL_PC may be connected to the shielding pattern MET_SH. The second impurity regions SP_C may be separated from each other in the second direction D2 by the shielding pattern MET_SH.

Figure 34:
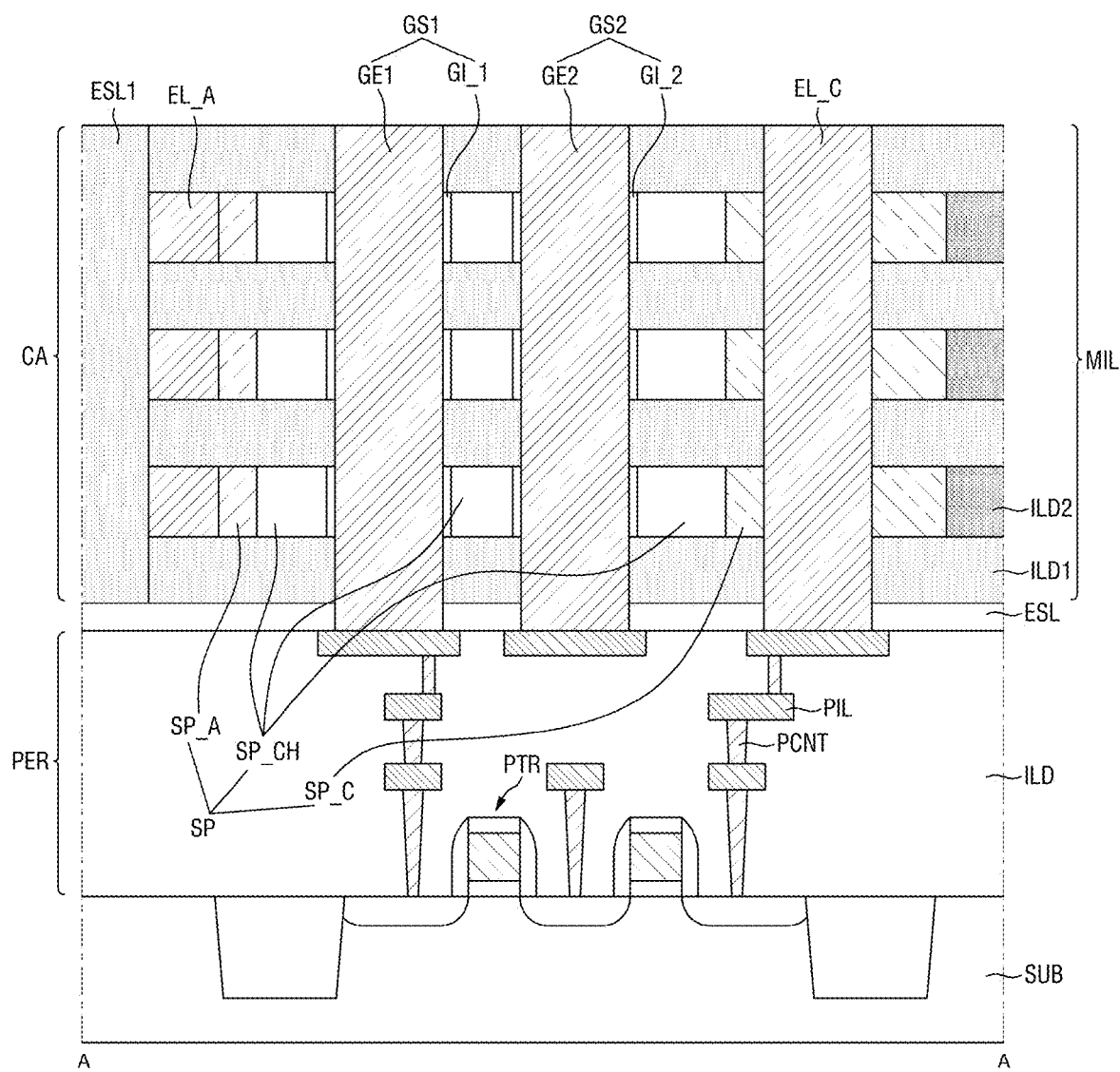
FIGS. 34 to 36 are diagrams for explaining the semiconductor memory device according to some example embodiments, respectively.
Figure 35:
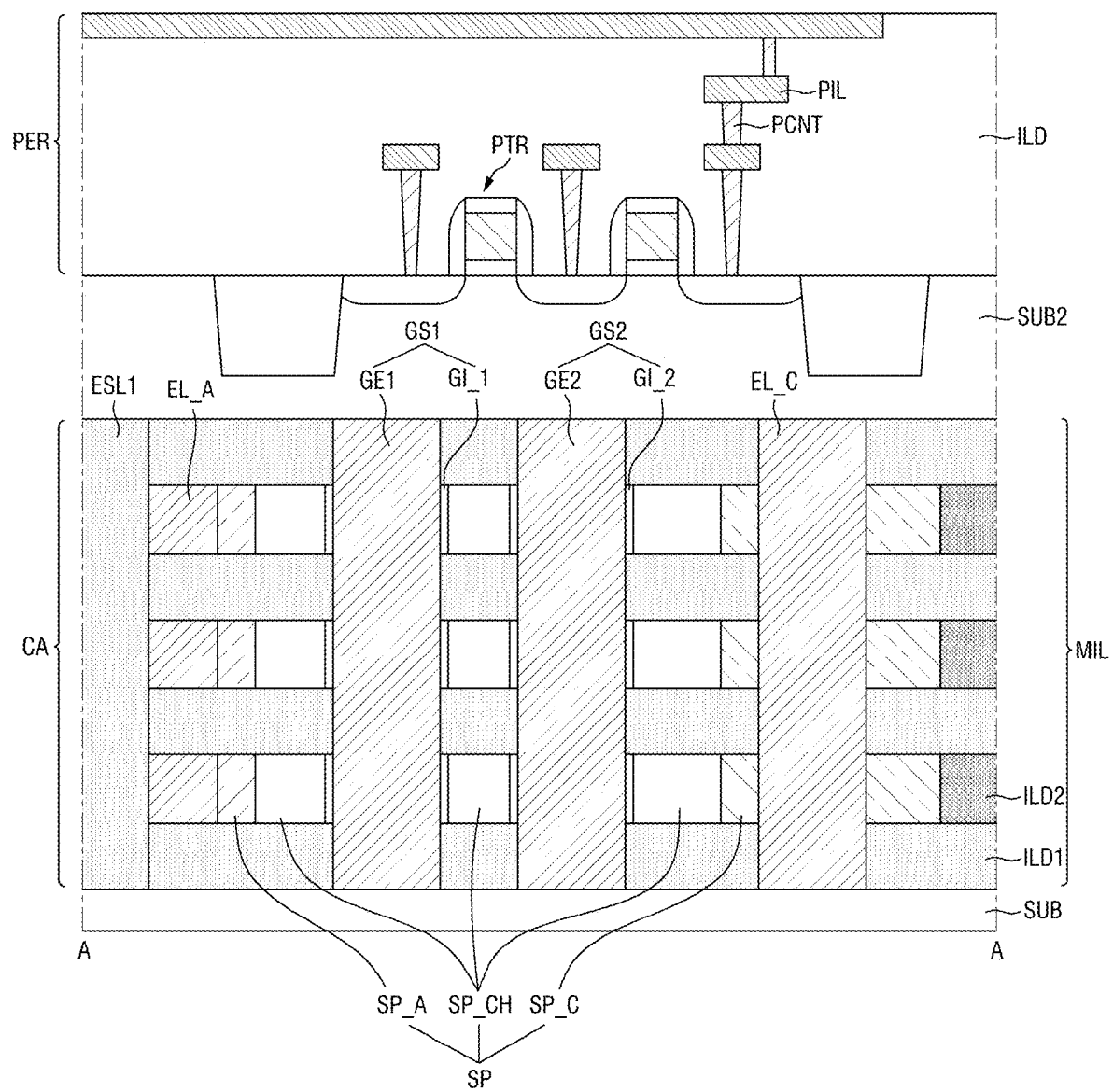
Figure 36:
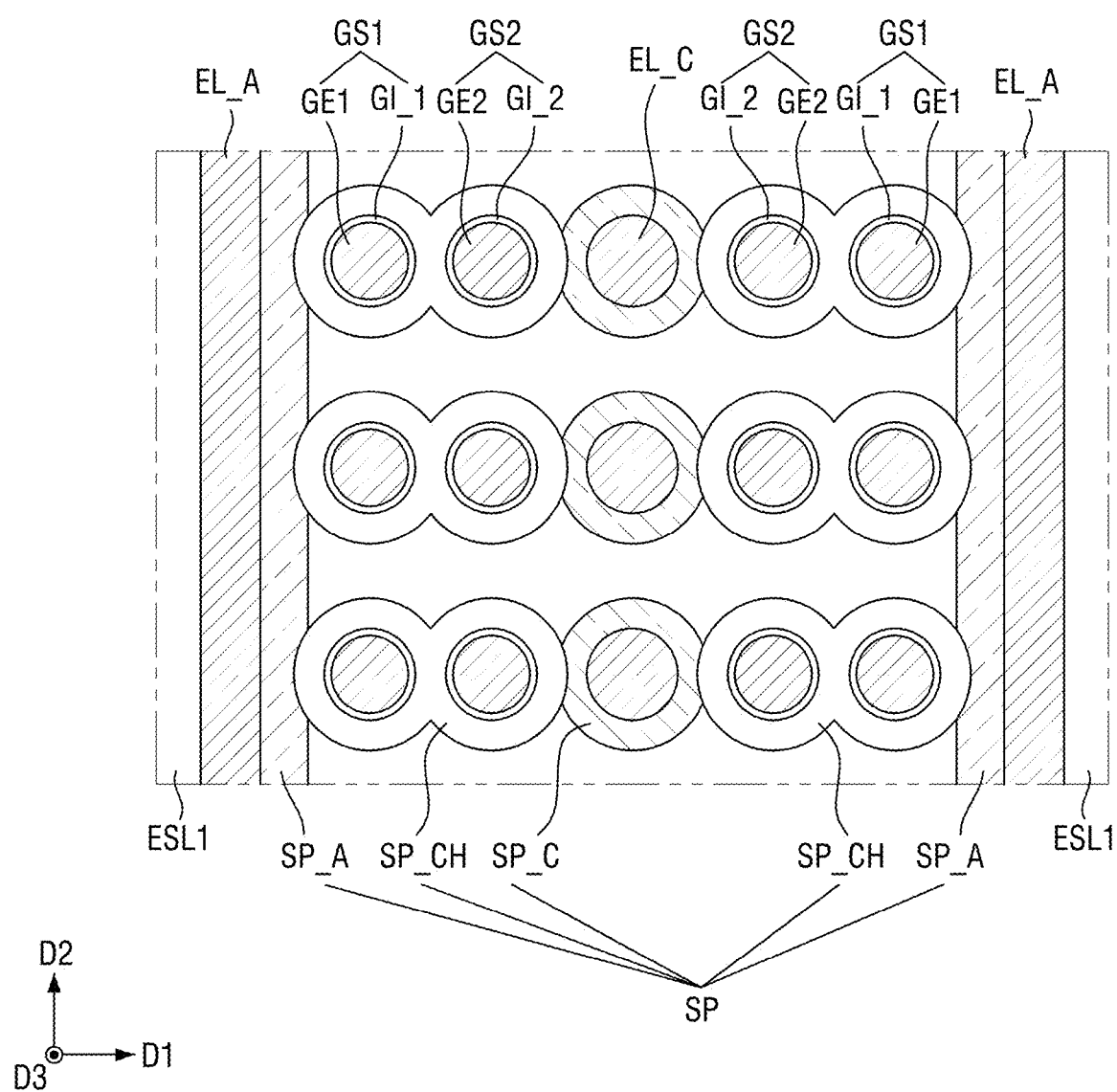

FIGS. 34 to 36 are diagrams for explaining a semiconductor memory device according to some example embodiments, respectively. For convenience of description, points different from those described using FIGS. 3 and 5 to 7 will be mainly described.

Referring to FIGS. 34 and 35, the cell array region CA and the peripheral circuit region PER described referring to FIG. 3 may be provided on the substrate SUB. The cell array region CA and the peripheral circuit region PER may be stacked in the third direction D3.

In FIG. 34, the peripheral circuit region PER may be provided between the cell array region CA and the substrate SUB. The peripheral circuit region PER may include peripheral circuits PTR, PIL, PIL and PCNT for operating the cell array region CA, and may include transistors such as planar transistors. At least some of the peripheral circuits PTR, PIL, PIL and PCNT may be formed in the peripheral circuit insulating film ILD.

For example, an etching stop layer ESL may be additionally interposed between the cell array region CA and the peripheral circuit region PER. As another example, no etching stop layer ESL may be interposed between the cell array region CA and the peripheral circuit region PER.

Specifically, the peripheral circuit formed in the peripheral circuit region PER may include peripheral transistors PTR, peripheral wirings PIL on the peripheral transistors PTR, and peripheral contacts PCNT that vertically connect the peripheral wirings PIL. As an example, the first gate electrode GE1, the second gate electrode GE2, and the second conductive connection line EL_C penetrate the etching stop layer ESL and may be electrically connected to the peripheral wirings PIL. Although not shown, the first conductive connection line EL_A may be connected to the peripheral wirings PIL through a penetration electrode or the like.

The semiconductor memory device according to some example embodiments may have a cell-on-peri (COP) structure in which memory cells are provided on the peripheral circuit region, as described above referring to FIG. 4A. By stacking the peripheral circuit region PER and the cell array region CA three-dimensionally, the area of the semiconductor memory chip may be reduced and high integration of the circuit may be realized.

In FIG. 35, the cell array region CA may be provided on the substrate SUB. An upper substrate SUB2 may be provided on the cell array region CA. The peripheral circuit region PER may be provided on the upper substrate SUB2. The peripheral circuit region PER may include a peripheral circuit for operating the cell array region CA.

Formation of the semiconductor memory device according to some example embodiments may include formation of the cell array region CA on the substrate SUB, formation of the peripheral circuit region PER on the upper substrate SUB2, and attachment of the upper substrate SUB2 onto the cell array region CA in a wafer bonding manner.

As described above referring to FIG. 4B, the semiconductor memory device according to some example embodiments may include a peri-on-cell (POC) in which the peripheral circuit region PER is provided on the memory cell. By stacking the cell array region CA and the peripheral circuit region PER three-dimensionally, the area of the semiconductor memory chip may be reduced and high integration of the circuit may be realized.

Referring to FIG. 36, in the semiconductor memory device according to some example embodiments, the channel region SP_CH and the first impurity region SPA may be disposed around the second impurity region SP_C.

The channel regions SP_CH spaced apart from each other in the first direction D1 may share the second impurity regions SP_C. By disposing the two channel regions SP_CH spaced apart from each other in the first direction D1 between the first impurity regions SP_A adjacent to each other in the first direction D1, the area of the semiconductor memory chip may be reduced, and high integration of the circuit may be realized.

Figure 37:
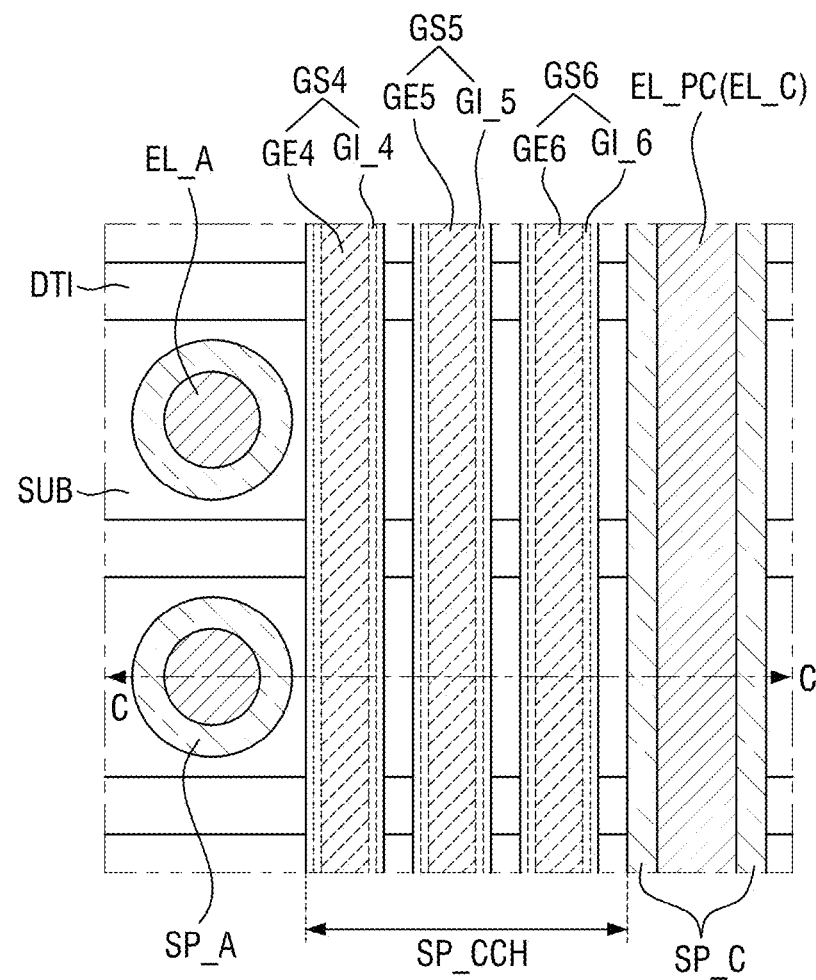
FIGS. 37 and 38 are diagrams for explaining the semiconductor memory device according to some example embodiments.
Figure 38:
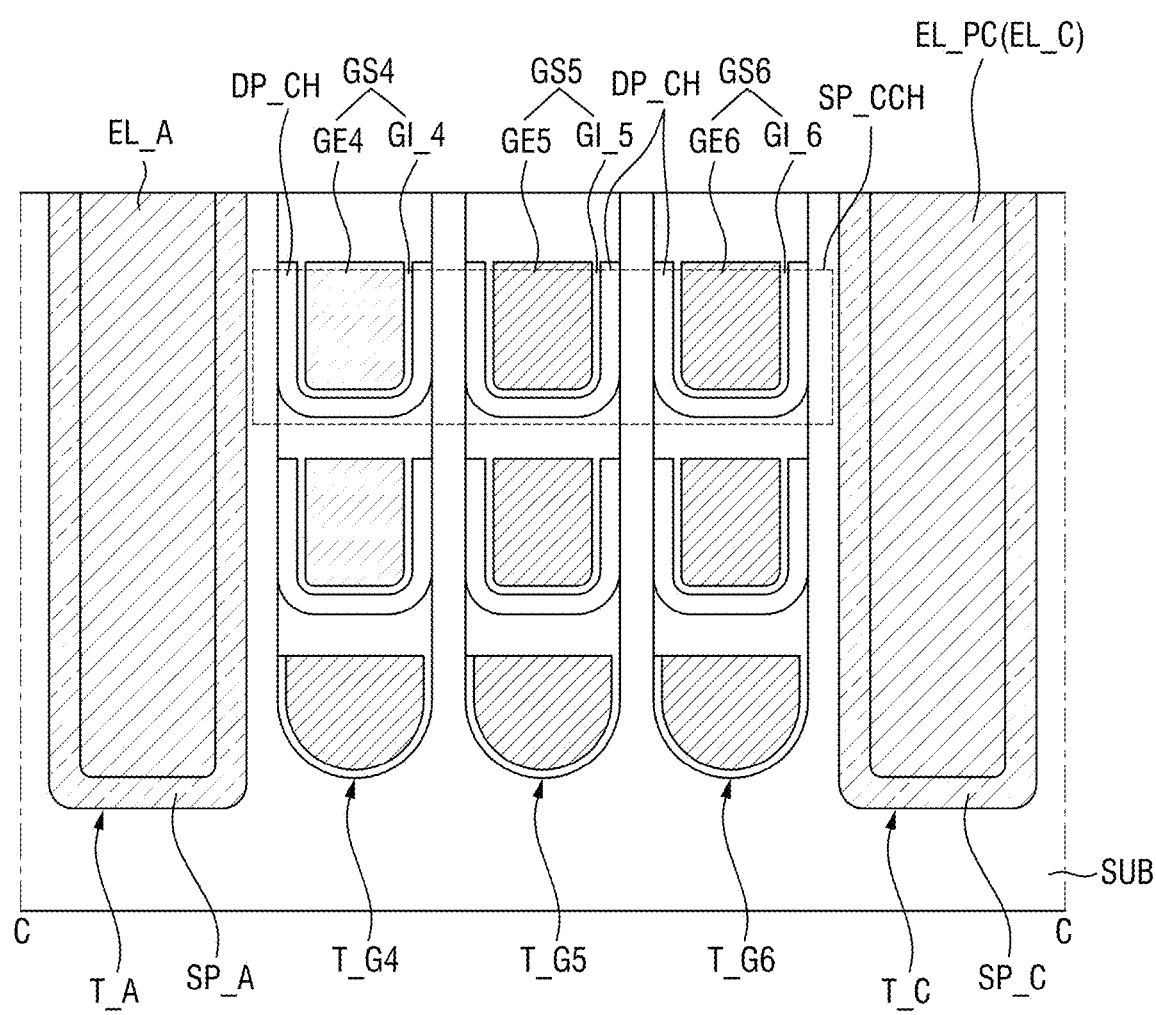

FIGS. 37 and 38 are diagrams for explaining the semiconductor memory device according to some example embodiments. FIG. 37 is a plan view for explaining the semiconductor memory device according to some example embodiments, and FIG. 38 is a cross-sectional view taken along a line C-C of FIG. 37.

An element separation layer DTI may extend long in a fourth direction D4. The element separation layer DTI may be formed in the substrate SUB. The element separation layer DTI may serve to separate unit memory cells adjacent to each other in a fifth direction D5. The element separation layer DTI may include, for example, at least one of silicon oxide, silicon nitride, and silicon oxynitride.

A first impurity region SP_A, and a first conductive connection line EL_A that is in contact with the first impurity region SP_A may be disposed between the adjacent element separation layers DTI. The first impurity region SPA and the first impurity region SP_A may be disposed in the substrate SUB. The first conductive connection line EL_A may have a line form or a pillar shape.

The first impurity region SPA may be formed along sidewalls and a bottom surface of an anode hole T_A. The first conductive connection line EL_A may fill the space defined by the first impurity region SP_A.

The second impurity region SP_C may extend long in the fifth direction D5. A plate-shaped second conductive connection line EL_PC extending in the fifth direction D5 may be disposed on the second impurity region SP_C.

The second impurity region SP_C may be formed along sidewalls and a bottom surface of a cathode trench T_C. The second conductive connection line EL_PC may fill the space defined by the second impurity region SP_CA.

The first conductive connection line EL_A may be spaced apart from the second conductive connection line EL_PC in the fourth direction D4.

Fourth to sixth gate structures GS4, GS5 and GS6 buried in the substrate SUB may be disposed between the first impurity region SP_A and the second impurity region SP_C. Each of the fourth to sixth gate structures GS4, GS5 and GS6 may extend in the fifth direction D5. The fourth to sixth gate structures GS4, GS5 and GS6 may be arranged in the fourth direction D4.

The fourth to sixth gate structures GS4, GS5 and GS6 may pass through a composite channel region SP_CCH defined between the first impurity region SPA and the second impurity region SP_C. The composite channel region SP_CCH may be defined between the element separation layers DTI adjacent to each other in the fifth direction DTI.

The composite channel region SP_CCH may include a part of the substrate SUB and a deposited semiconductor film DP_CH. A part of the substrate SUB may include p-type semiconductor material. The deposited semiconductor film DP_CH may be formed of an undoped semiconductor material or a p-type semiconductor material. Even if the composite channel region SP_CCH has p-type electrical characteristics, the concentration of the p-type impurities of the substrate SUB and the concentration of the p-type impurities of the deposited semiconductor film DP_CH are lower than the concentration of p-type impurities of the first conductive connection line EL_A.

Each of the fourth to sixth gate structures GS4, GS5 and GS6 may include fourth to sixth gate electrodes GE4, GE5 and GE6 and fourth to sixth gate insulating films GI_4, GI_5 and GI_6. The fourth gate electrode GE4 may be a gate electrode of the first control transistor T1 of FIG. 1b, and the fifth gate electrode GE5 may be a gate electrode of the second control transistor T2 of FIG. 1B. The sixth gate electrode GE6 may be agate electrode of the selection transistor $T_{SEL}$ of FIG. 1B.

The fourth to sixth gate insulating films GI_4, GI_5 and GI_6 may wrap around the peripheries of the fourth to sixth gate electrodes GE4, GE5 and GE6, between the fourth to sixth gate electrodes GE4, GE5 and GE6 and the composite channel region SP_CCH.

In the region in which the fourth to sixth gate structures GS4, GS5 and GS6 intersect the composite channel region SP_CCH, some of each of the fourth to sixth gate structures GS4, GS5 and GS6 may be surrounded by the composite channel region SP_CCH. Each of the fourth to sixth gate structures GS4, GS5 and GS6 are stacked in the third direction D3 inside the substrate SUB. For example, the deposited semiconductor film DP_CH used as the channels of the fourth to sixth gate structures GS4, GS5 and GS6 does not cover the top surfaces of the fourth to sixth gate electrodes GE4, GE5 and GE6. The fourth to sixth gate insulating films GI_4, GI_5 and GI_6 cover the top surfaces of the fourth to sixth gate electrodes GE4, GE5 and GE6.

Since the deposited semiconductor film DP_CH used as the channel does not cover the top surfaces of the fourth to sixth gate electrodes GE4, GE5 and GE6, in the region in which the fourth to sixth gate structures GS4, GS5 and GS6 intersect the composite channel region SP_CCH, the composite channel region SP_CCH does not entirely wrap the fourth to sixth gate structures GS4, GS5 and GS6.

The fourth gate structures GS4 stacked in the third direction D3 may be disposed in the fourth gate trench T_G4. The fifth gate structures GS5 stacked in the third direction D3 may be disposed in the fifth gate trench T_G5. The sixth gate structures GS6 stacked in the third direction D3 may be disposed in the sixth gate trench T_G6. A deposited semiconductor film DP_CH may be formed in the fourth to sixth gate trenches T_G4, T_G5 and T_G6.

In the semiconductor memory device according to some example embodiments, the fourth direction D4 and the fifth direction D5 intersect the third direction D3 which is a thickness direction of the substrate SUB.

FIGS. 39A to 48 are intermediate stage diagrams for explaining a method for fabricating a semiconductor memory device according to some example embodiments.

Referring to FIG. 39A and FIG. 39B, a mold structure MIL may be formed on the substrate SUB. The mold structure MIL may include a plurality of first mold insulating layers ILD1 and second mold insulating layers ILD2 which are vertically stacked, and may be formed by a chemical vapor deposition (CVD) process such as a plasma enhanced CVD (PECVD) process.

Figure 40B:
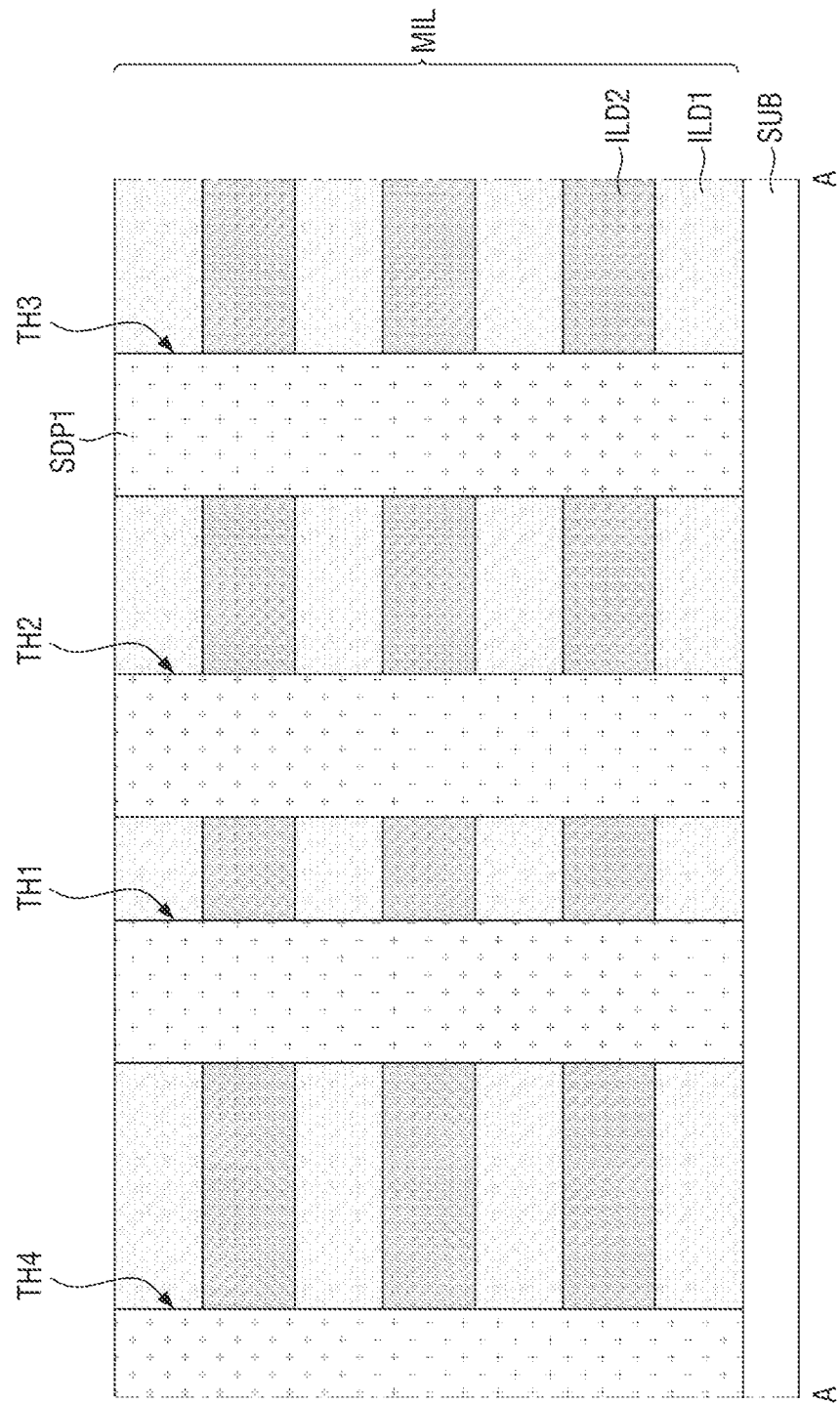

Referring to FIGS. 40A and 40B, first to fourth holes TH1, TH2, TH3 and TH4 penetrating the mold structure MIL may be formed, e.g. formed by a dry etching process and/or a wet etching process. The first to third holes TH1, TH2 and TH3 may have a contact form, and the fourth hole TH4 may have a line form extending long in the second direction D2. The first to third holes TH1, TH2 and TH3 may be sequentially arranged in the first direction D1. The fourth hole TH4 is adjacent to the first hole TH1.

Next, a first sacrificial pattern SDP1 may be formed in the first to fourth holes TH1, TH2, TH3 and TH4.

Figure 41:
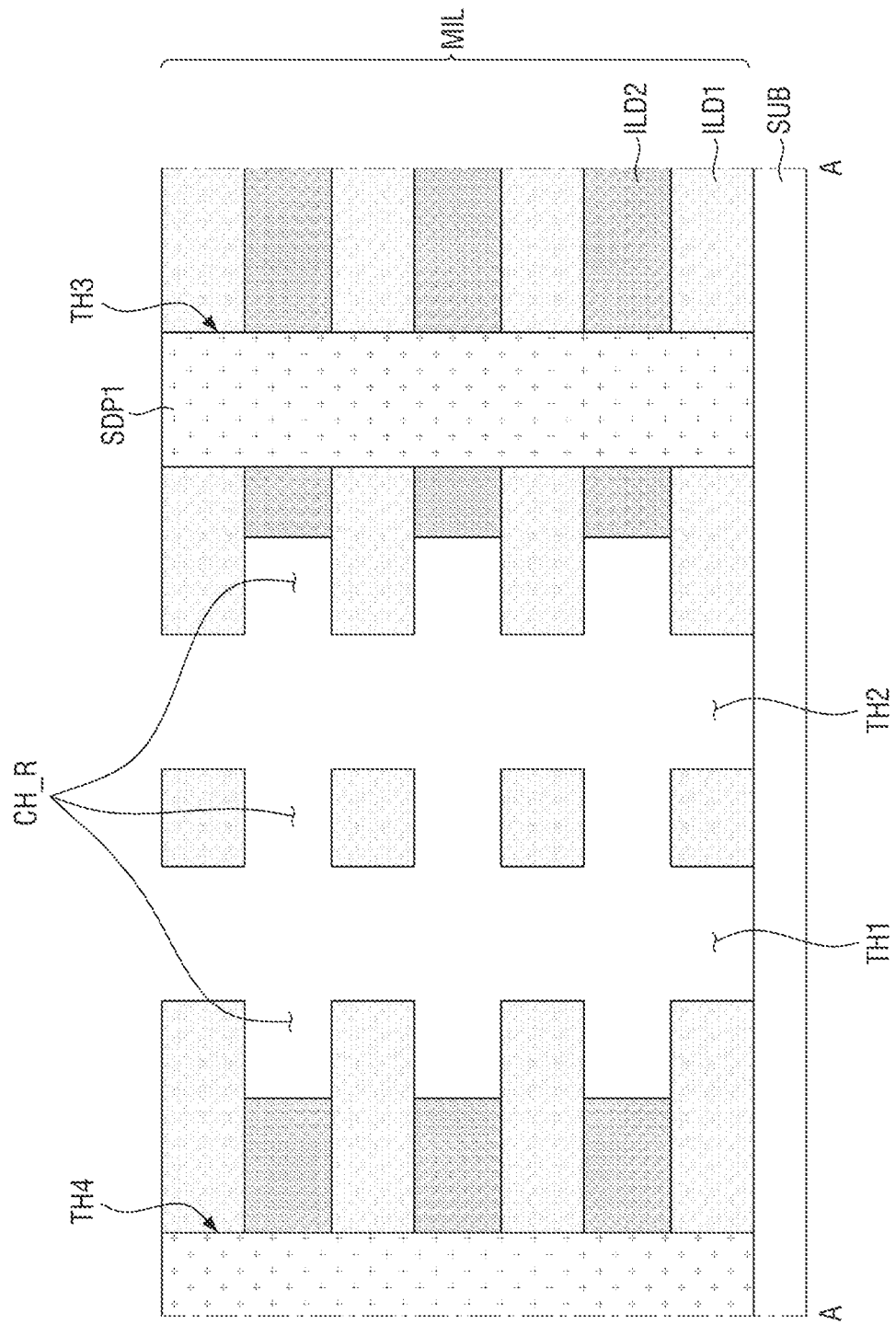

Referring to FIG. 41, the first sacrificial pattern SDP1 which fills the first and second holes TH1 and TH2 is removed. Next, the second mold insulating layer ILD2 exposed by the first and second holes TH1 and TH2 may be partially etched to form a channel recess CH_R.

Figure 42:
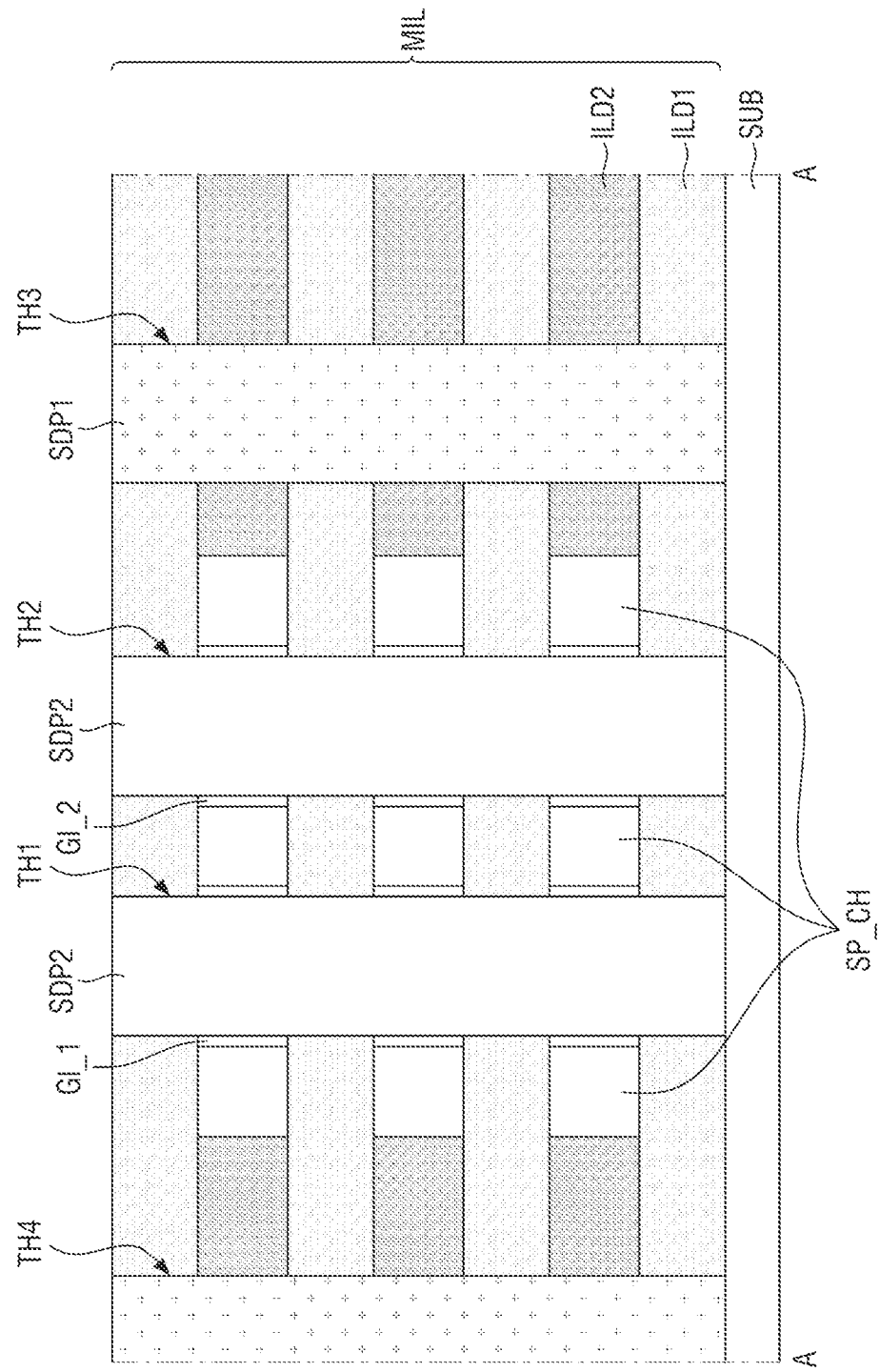

Referring to FIG. 42, a channel region SP_CH which fills the channel recess CH_R is formed. In addition, the first and second gate insulating films GI_1 and GI_2 may be formed on the channel region SP_CH exposed by the first and second holes TH1 and TH2. Next, a second sacrificial pattern SDP2 may be formed in the first and second holes TH1 and TH2.

Figure 43:
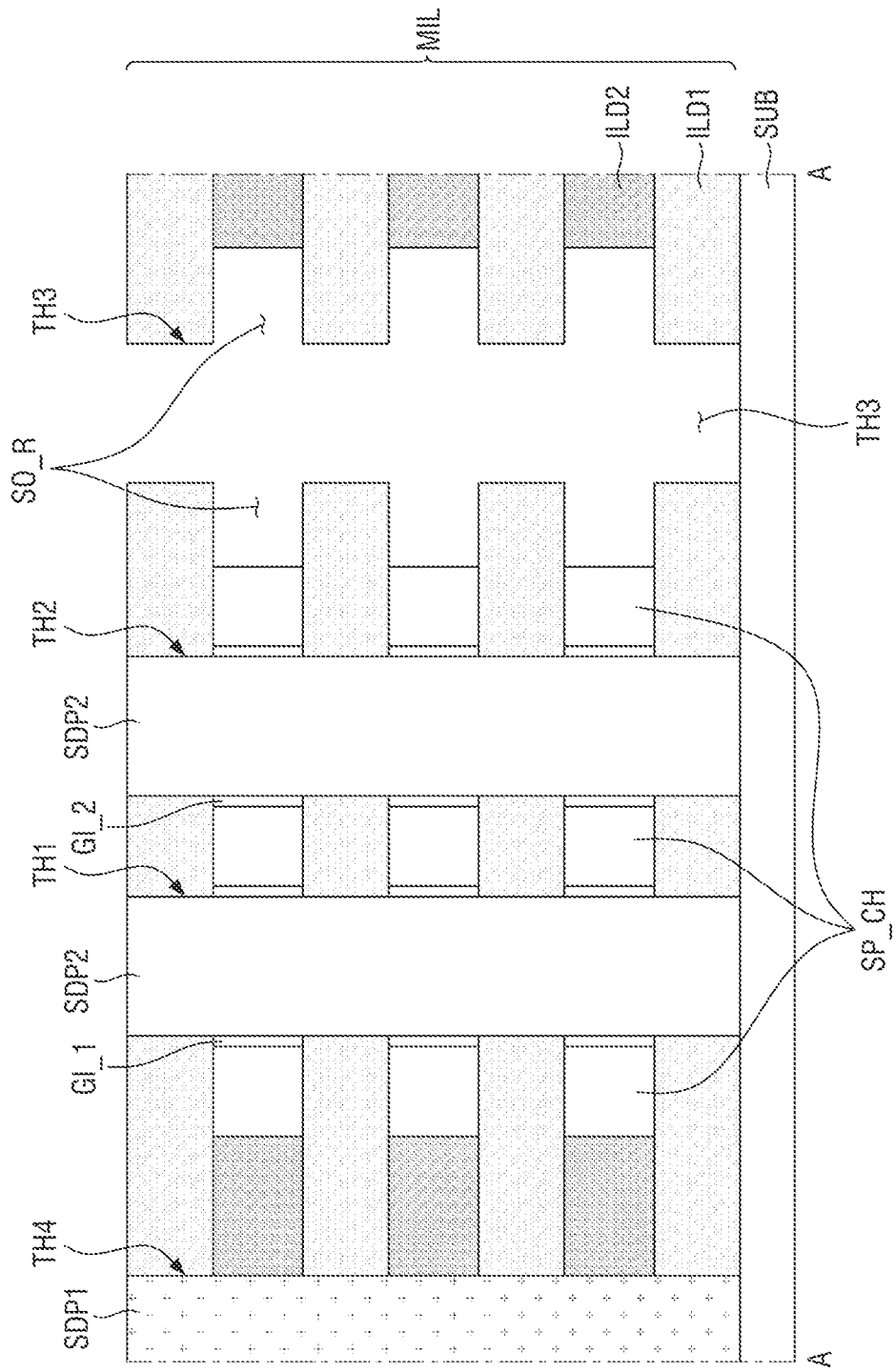

Referring to FIG. 43, the first sacrificial pattern SDP1 filling the third hole TH3 is removed. Next, the second mold insulating layer ILD2 exposed by the third hole TH3 may be partially etched to form a source recess SO_R. The channel region SP_CH is exposed by the source recess SO_R.

Figure 44:
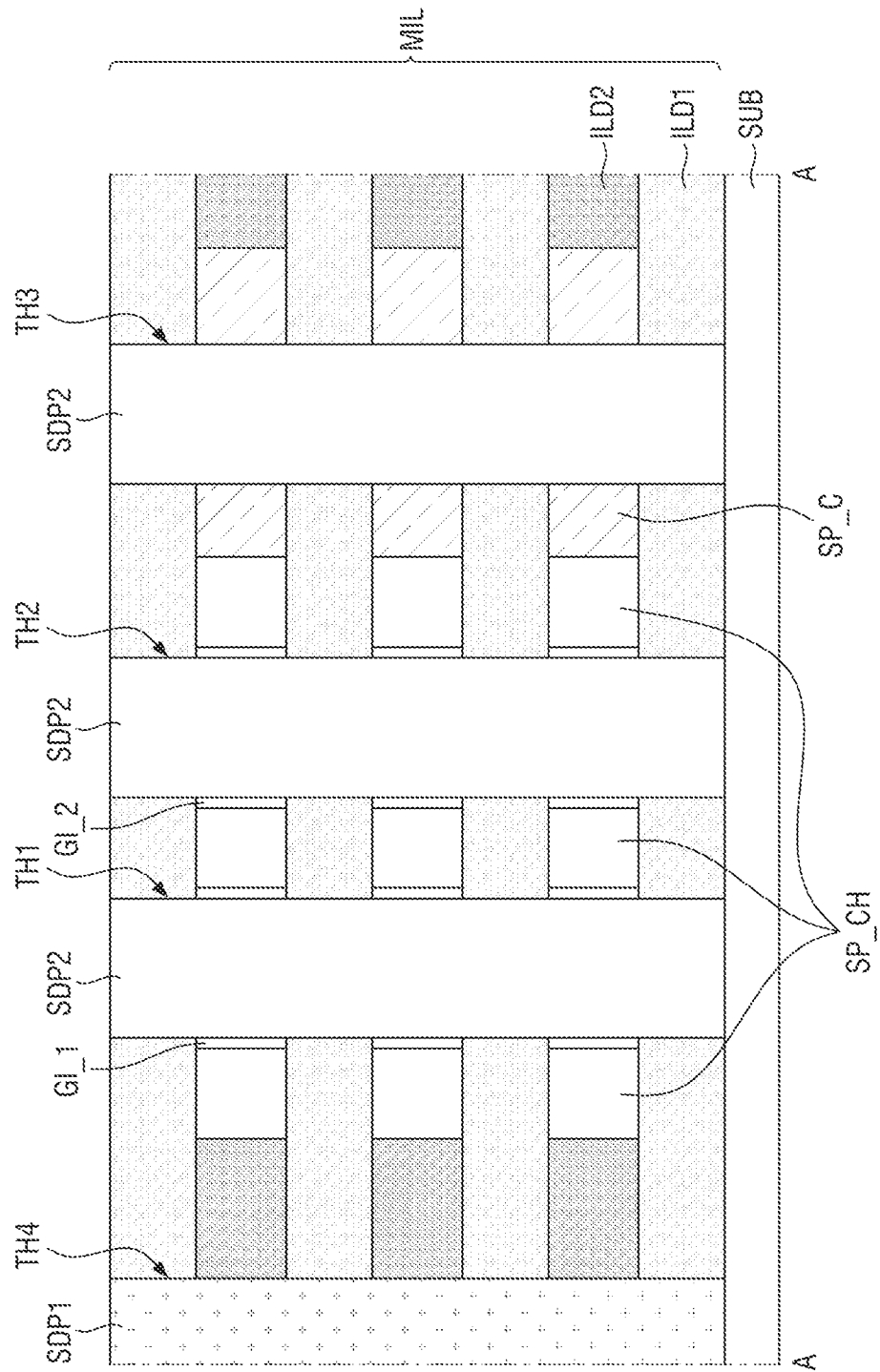

Referring to FIG. 44, the second impurity region SP_C which fills the source recess SO_R is formed. Next, a second sacrificial pattern SDP2 may be formed in the third hole TH3.

Figure 45:
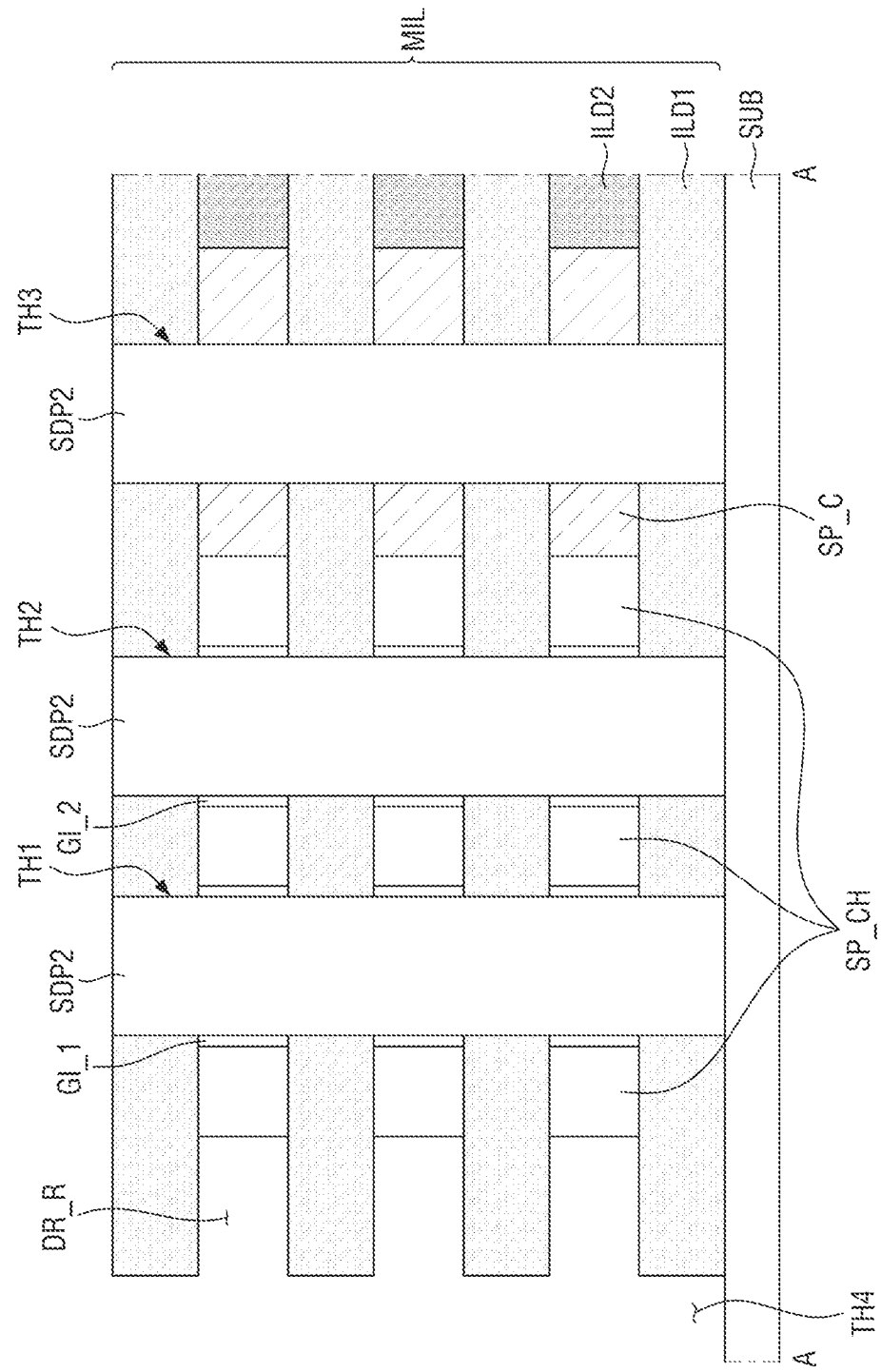

Referring to FIG. 45, the first sacrificial pattern SDP1 which fills the fourth hole TH4 is removed. Next, the second mold insulating layer ILD2 exposed by the fourth hole TH4 may be partially etched to form a drain recess DR_R. The drain recess DR_R exposes the channel region SP_CH.

Figure 46:
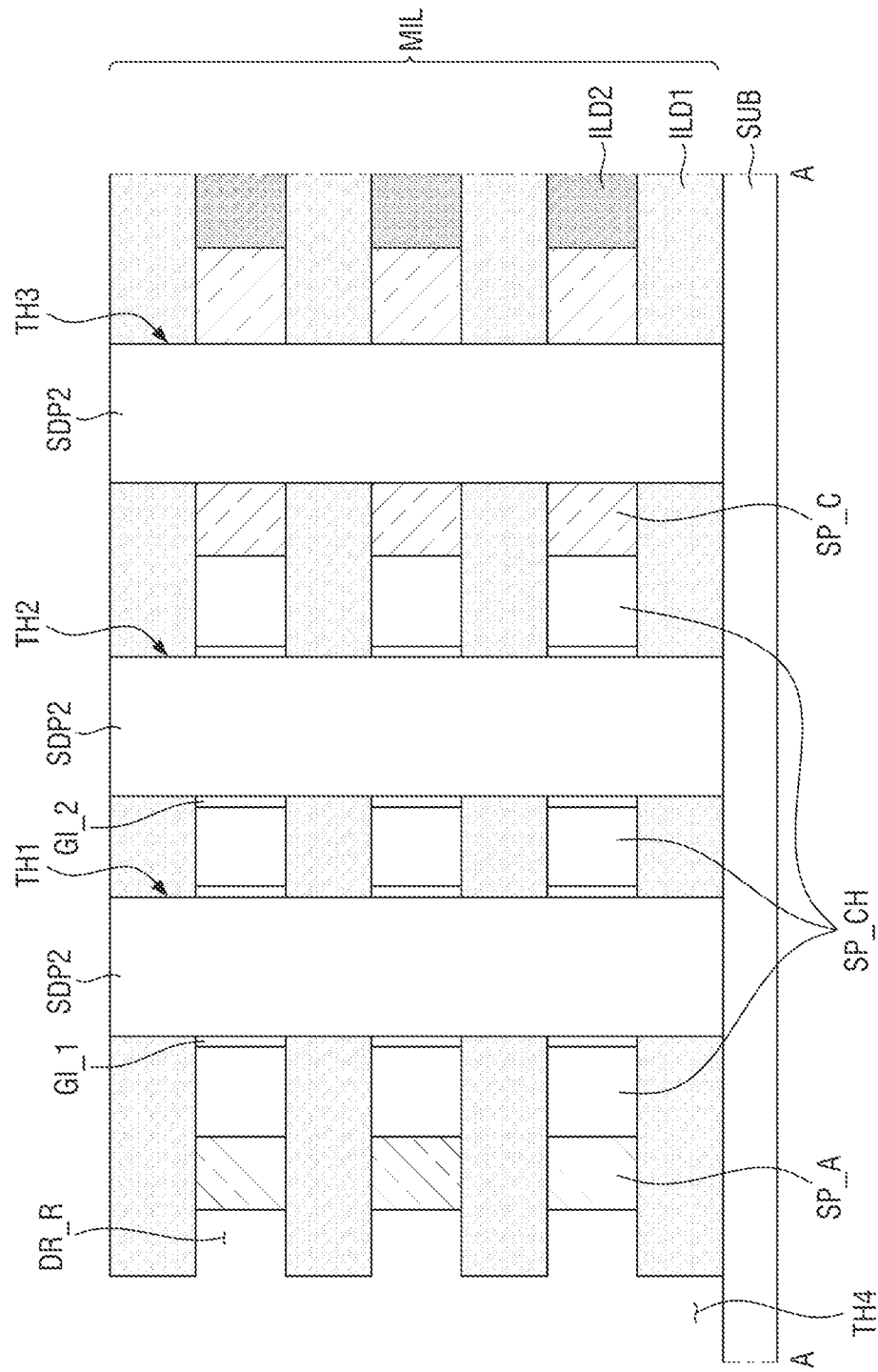

Referring to FIG. 46, the first impurity region SP_A that partially fills the drain recess DR_R is formed. The first impurity region SP_A may be formed with an ion implantation process; however, example embodiments are not limited thereto.

Figure 47:
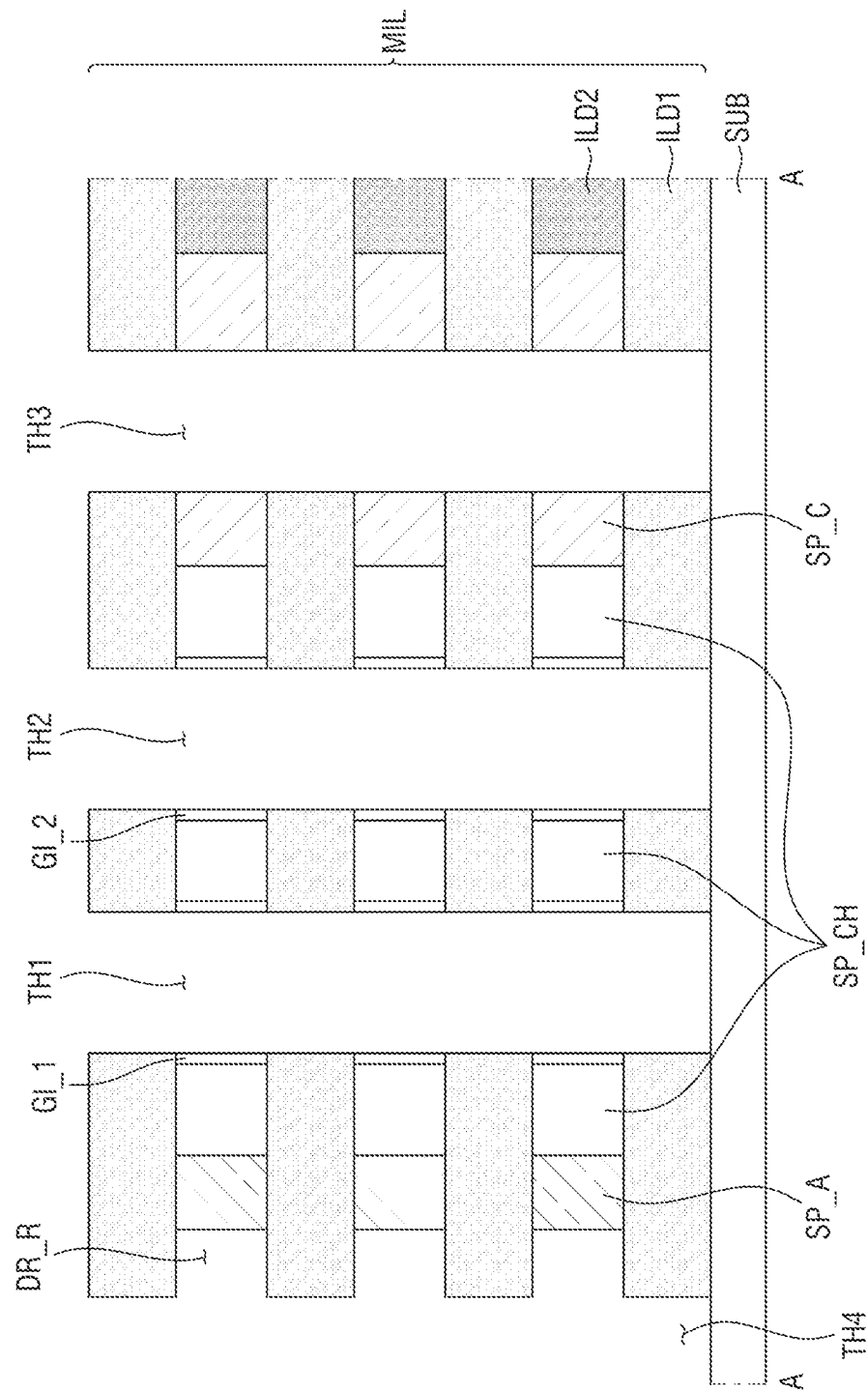

Referring to FIG. 47, the second sacrificial pattern SDP2 in the first to third holes TH1, TH2 and TH3 is removed.

Figure 48:
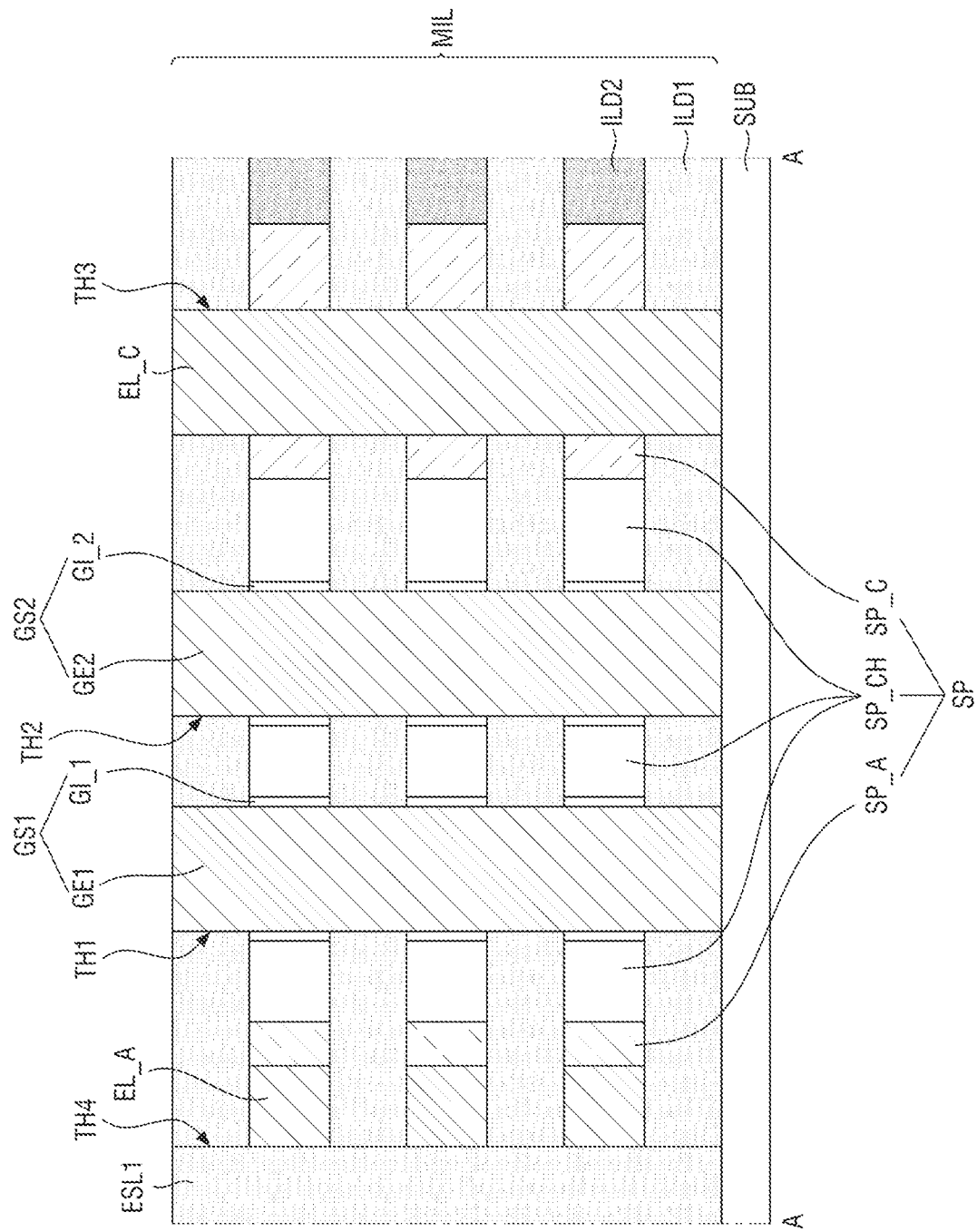

Referring to FIG. 48, the first conductive connection line EL_A that fills the rest of the drain recess DR_R is formed. The first and second gate electrodes GE1 and GE2 are formed in the first and second holes TH1 and TH2. The second conductive connection line EL_C is formed in the third hole TH3. Next, a first electrode separation pattern ESL1 may be formed in the fourth hole TH4.

Unlike the shown configuration, the formation order of the first impurity region SP_A, the channel region SP_CH and the second impurity region SP_C may vary.

FIGS. 49A to 57B are intermediate stage diagrams for explaining a method for fabricating a semiconductor memory device according to some example embodiments.

Referring to FIGS. 49A and 49B, a pre-mold structure MIL_1 may be formed on the substrate SUB. The pre-mold structure MIL_1 may include a plurality of sacrificial insulating layers ILD_SC and second mold insulating layers ILD2 which are vertically stacked. A fifth hole TH5 and a sixth hole TH6 penetrating the pre-mold structure MIL_1 are formed. The fifth hole TH5 may have a shape in which a plurality of circles is combined. The sixth hole TH6 may have a line form extending long in the second direction D2.

Figure 50A:
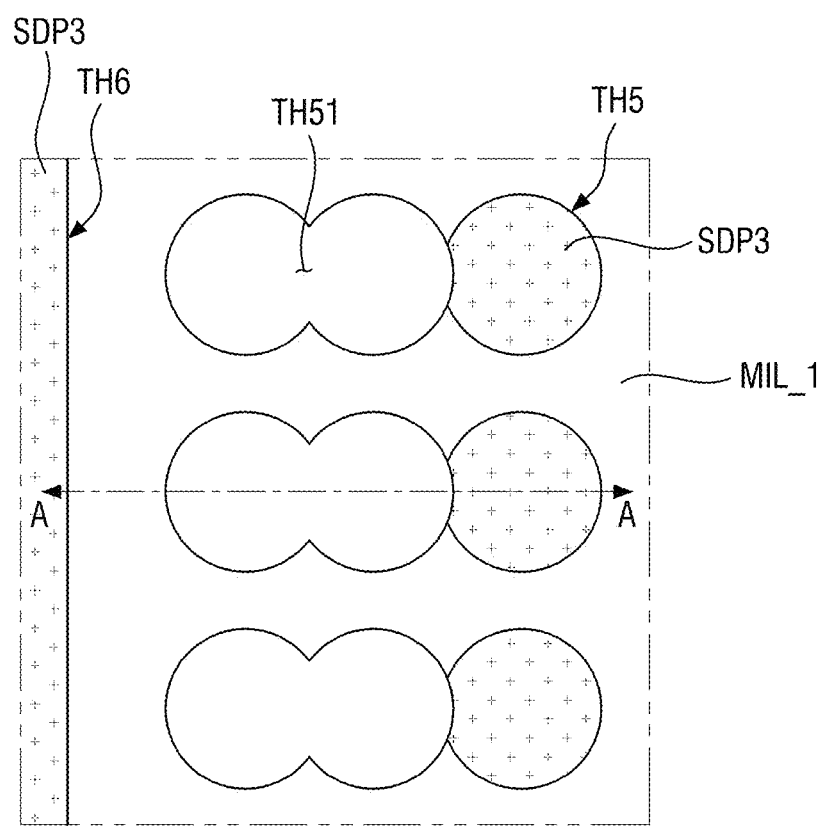
Figure 50B:
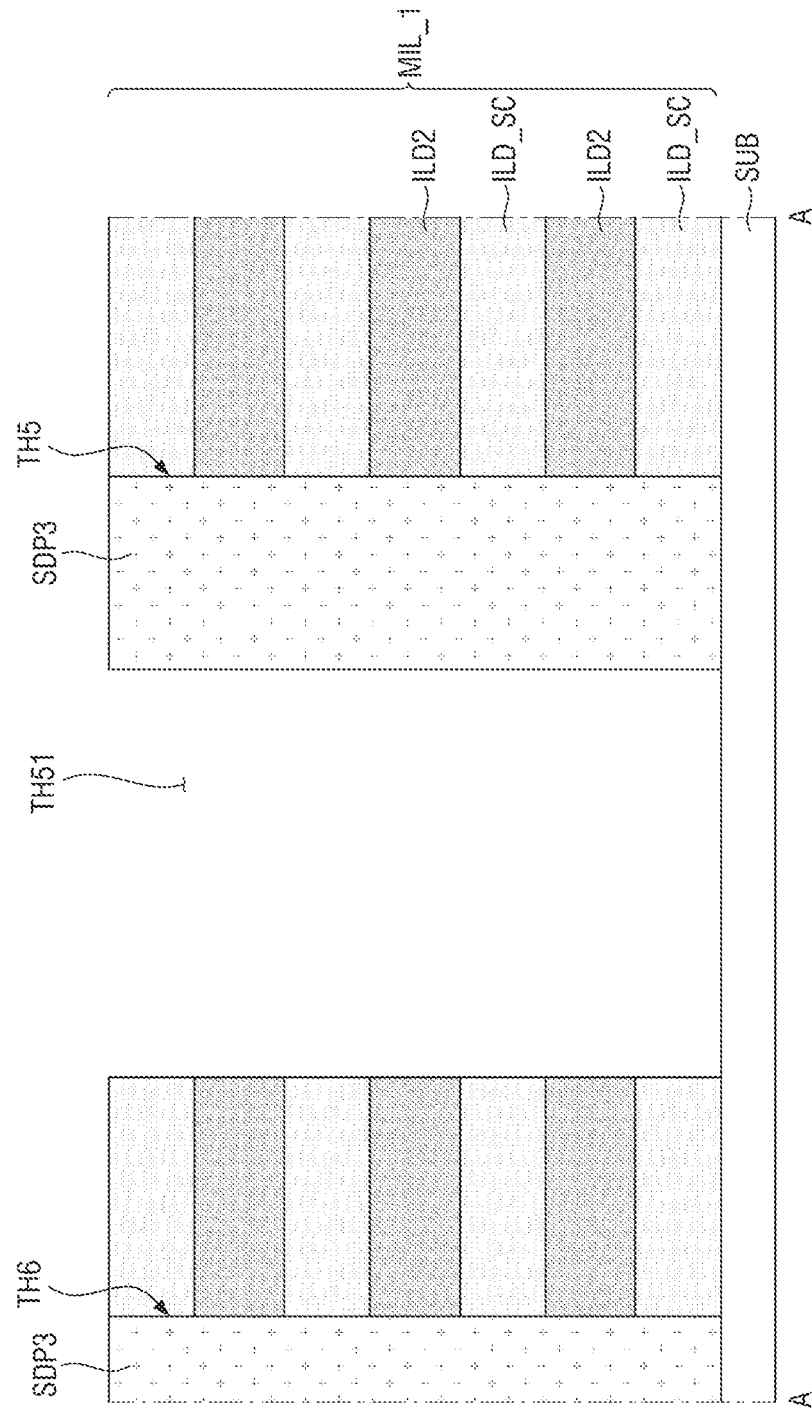

Referring to FIGS. 50A and 50B, a third sacrificial pattern SDP3 which fills a part of the fifth hole TH5 is formed. A third sacrificial pattern SDP3 in the fifth hole TH5 is formed, and a fifth_1 hole TH51 may be defined. The third sacrificial pattern SDP3 is also formed in the sixth hole TH6.

Figure 51A:
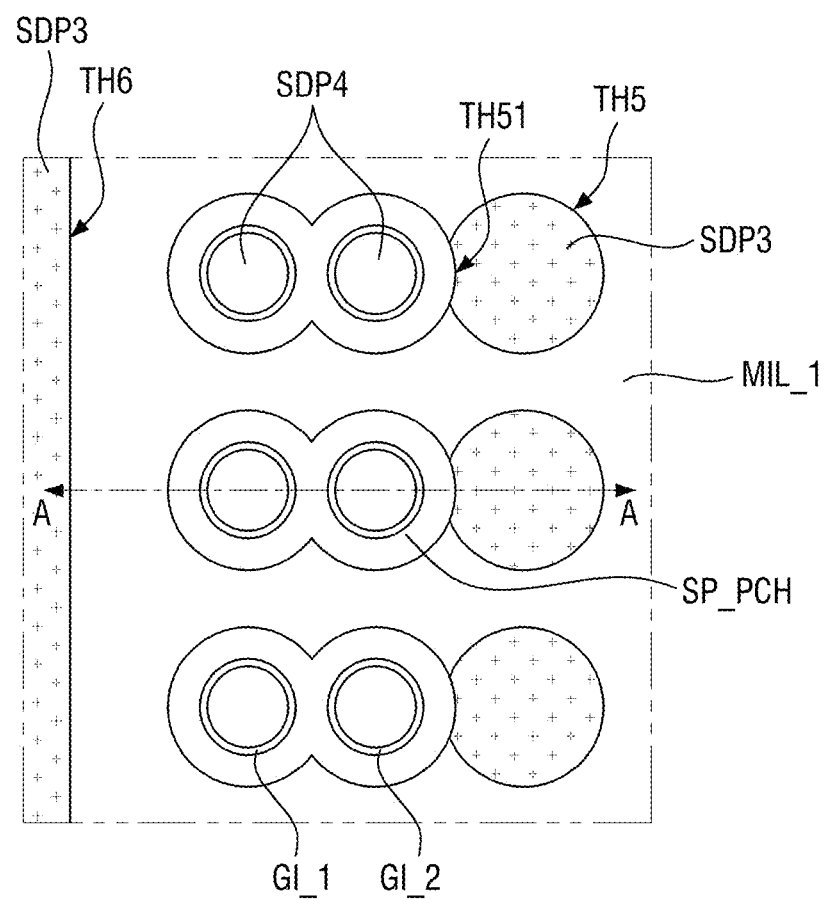
Figure 51B:
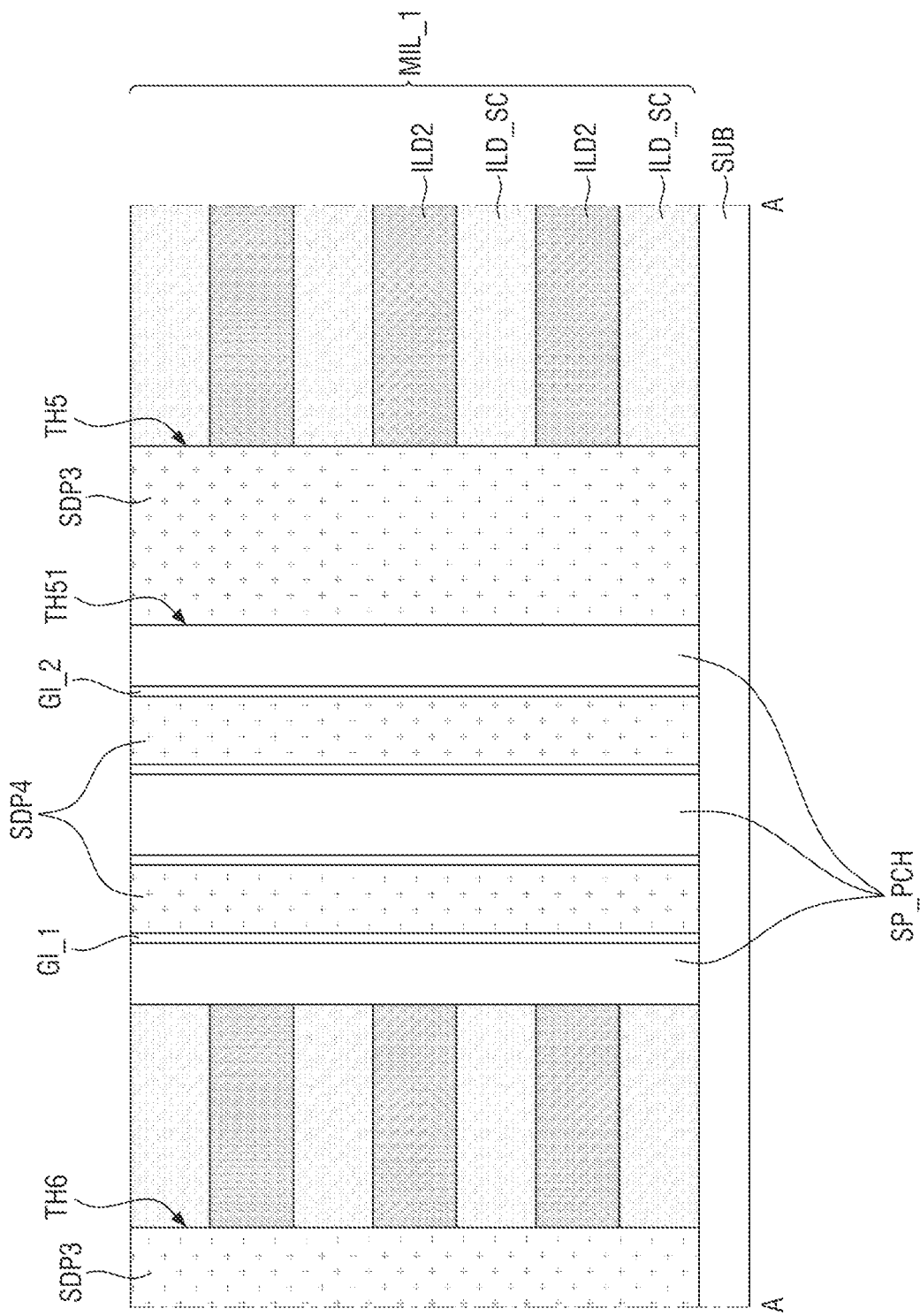

Referring to FIGS. 51A and 51B, a pre-channel region SP_PCH is formed in the fifth hole TH51. From a viewpoint of a plan view, the pre-channel region SP_PCH may have a shape in which a closed loop is connected. First and second gate insulating films GI_1 and GI_2 may be formed on the inner sidewall of the pre-channel region SP_PCH. Subsequently, a fourth sacrificial pattern SDP4 that fills a space defined by the first and second gate insulating films GI_1 and GI_2 is formed.

Figure 52B:
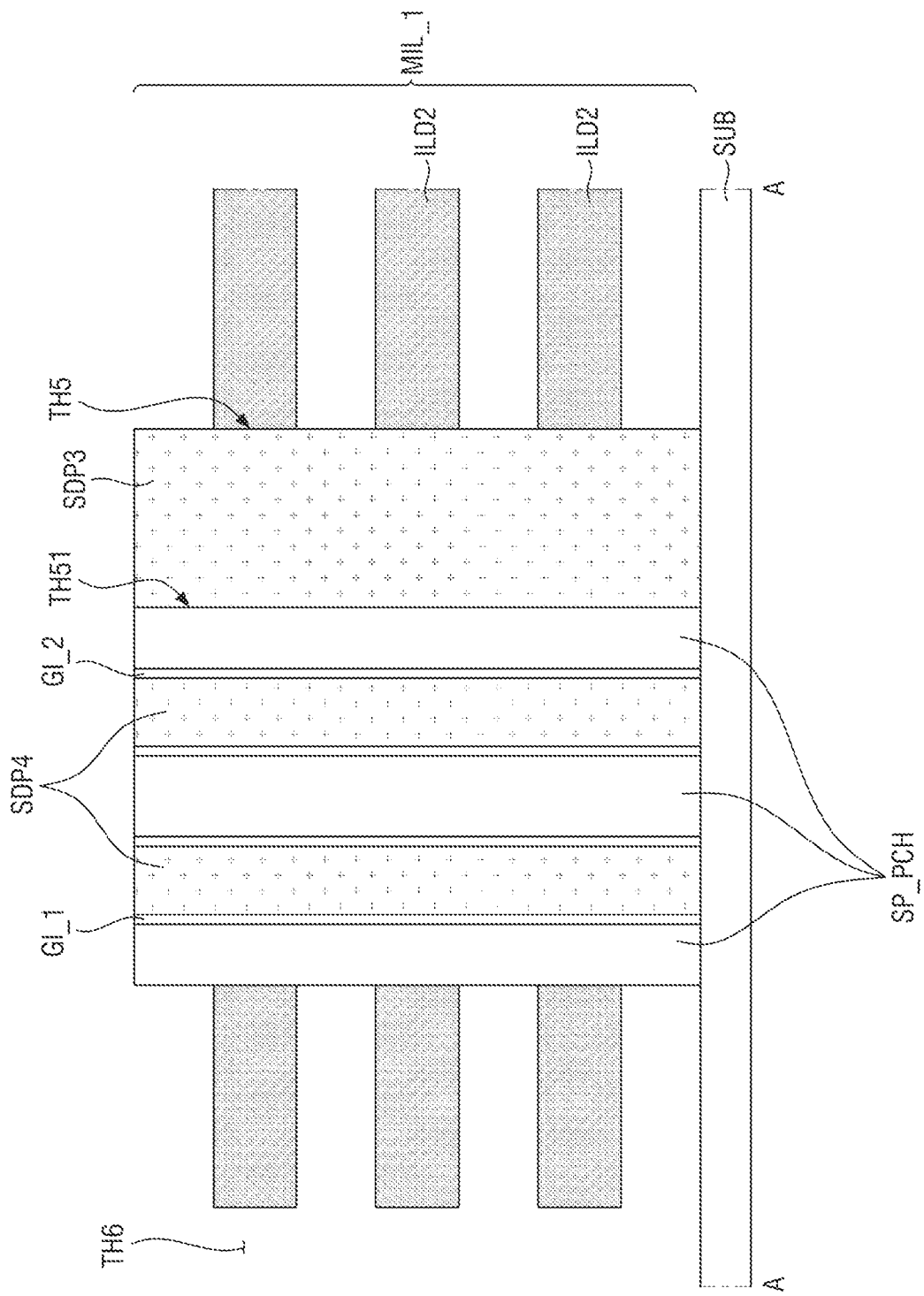

Referring to FIGS. 52A and 52B, the third sacrificial pattern SDP3 in the sixth hole TH6 is removed. Subsequently, the sacrificial insulating layer ILD_SC may be removed, using the sixth hole TH6. The sacrificial insulating layer ILD_SC may be removed to expose the pre-channel region SP_PCH between the second mold insulating layer ILD2.

Figure 53A:
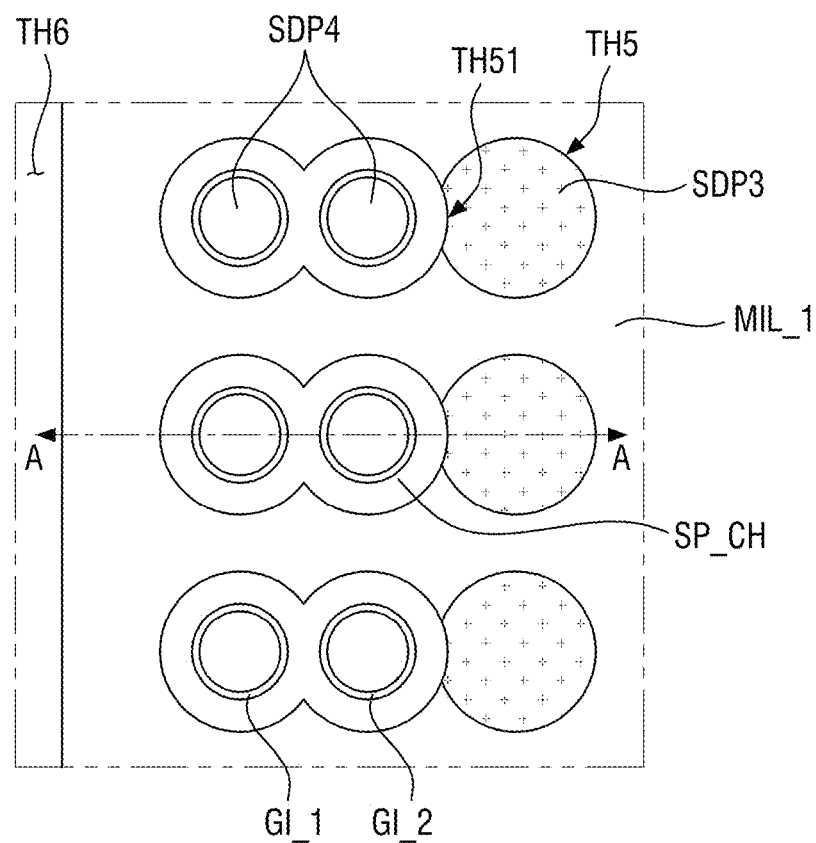
Figure 53B:
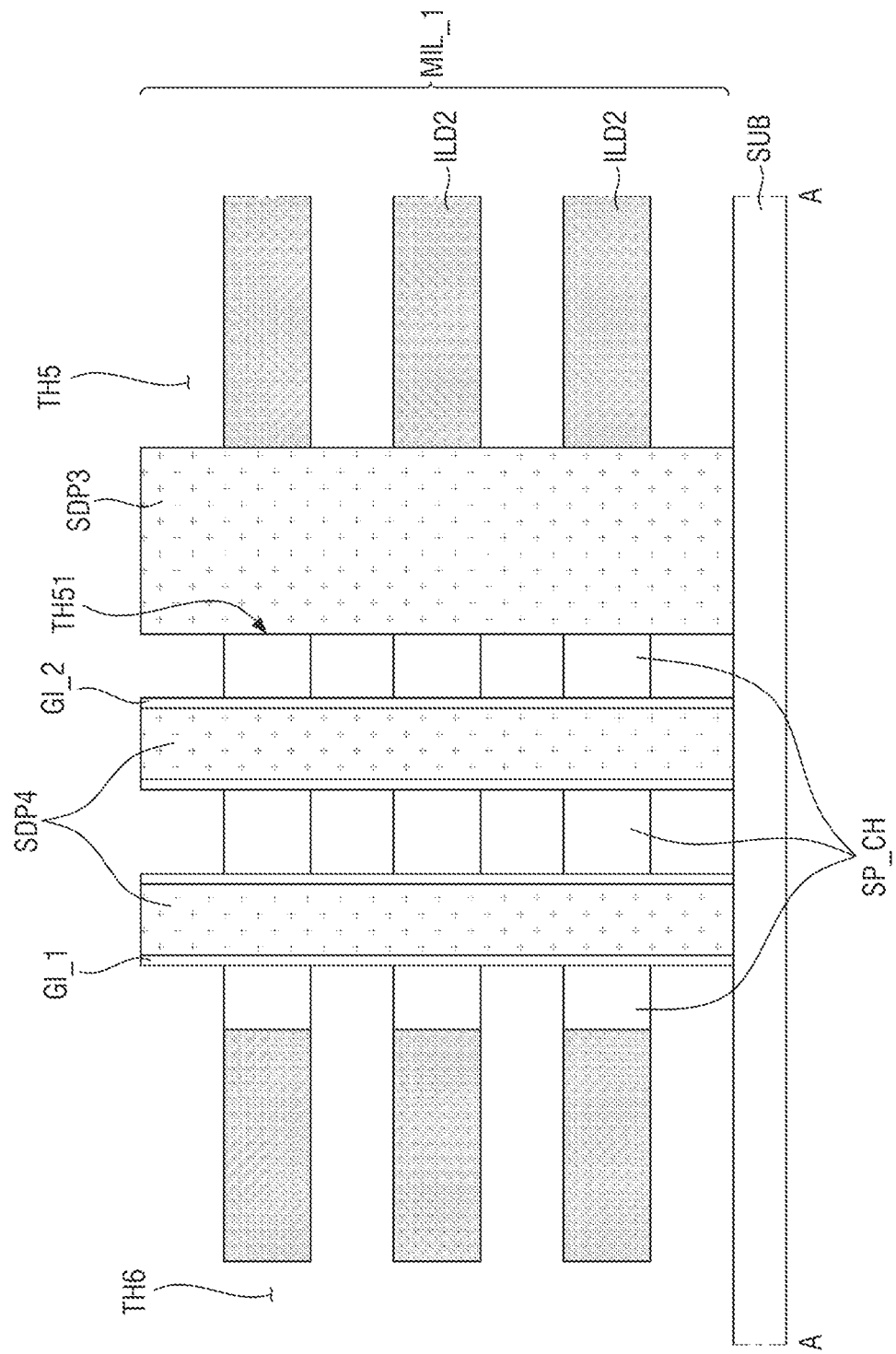

Referring to FIGS. 53A and 53B, the channel region SP_CH may be formed by removing the pre-channel region SP_PCH exposed between the second mold insulating layers ILD2. Unlike the shown configuration, the first and second gate insulating films GI_1 and GI_2 exposed between the second mold insulating layers ILD2 may be removed.

Figure 54A:
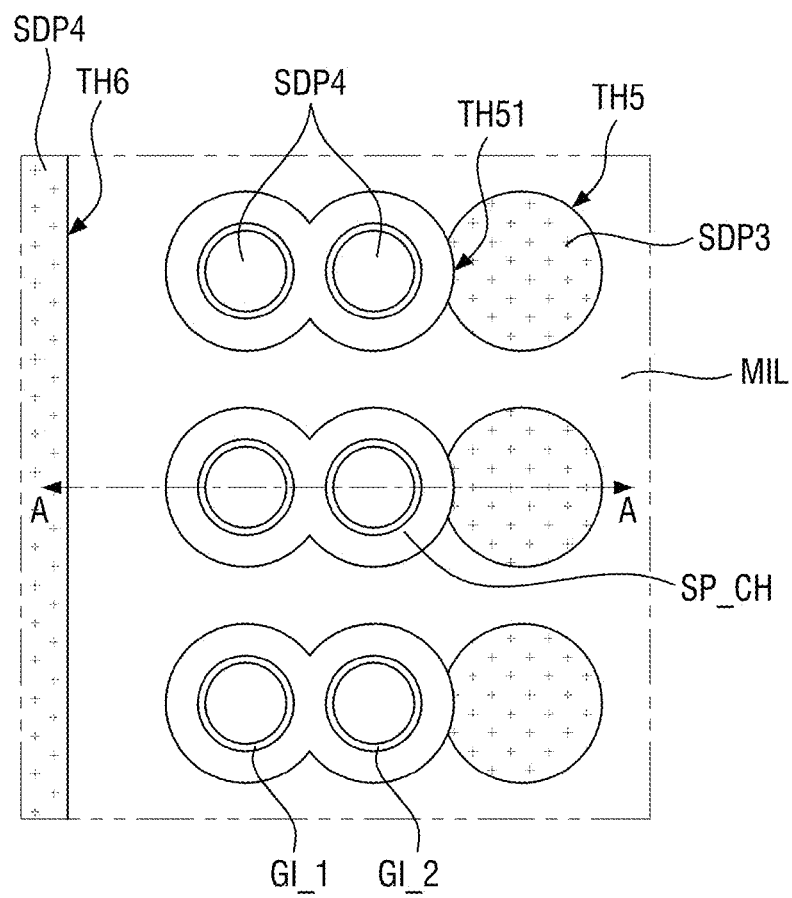
Figure 54B:
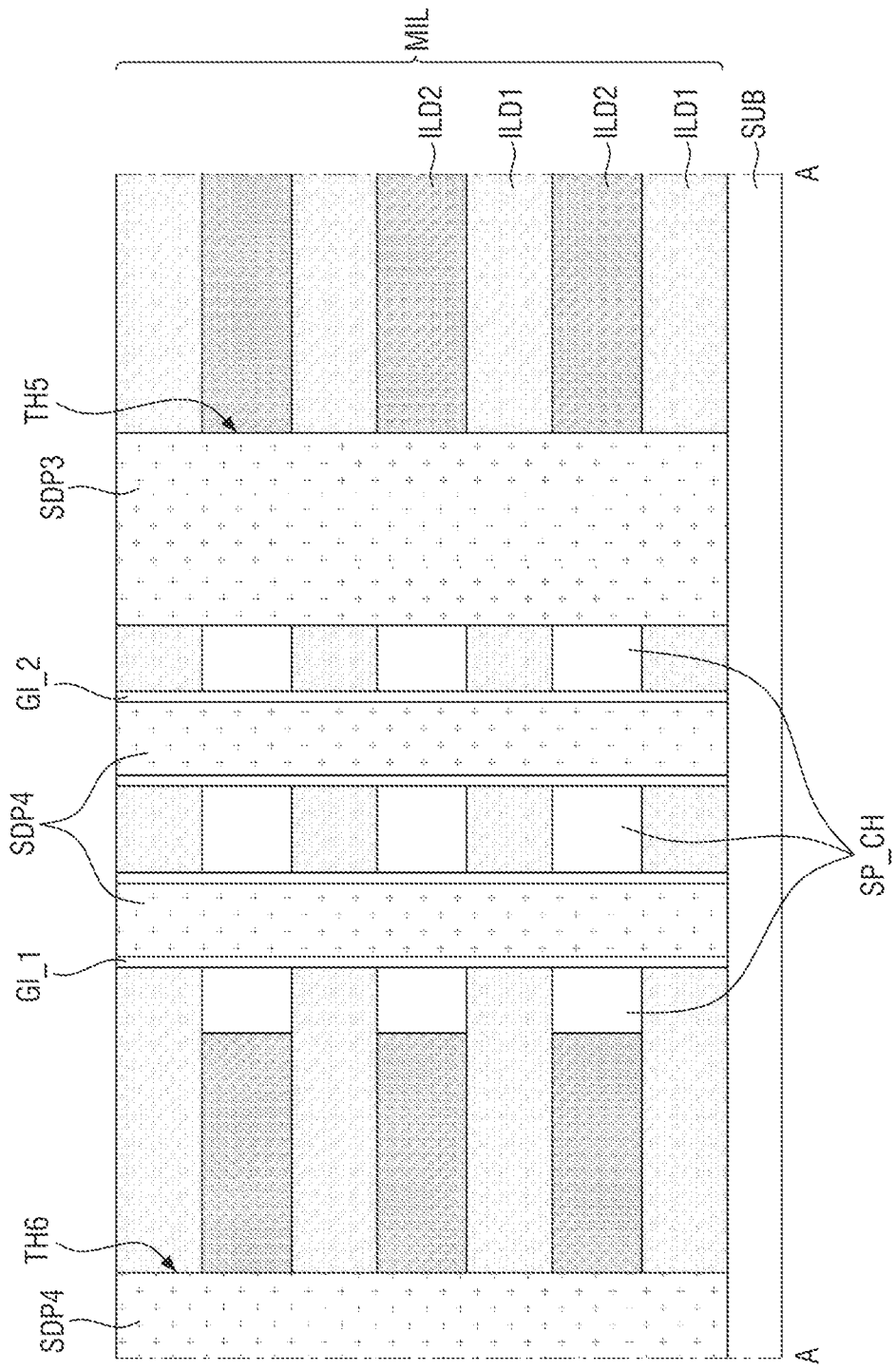

Referring to FIGS. 54A and 54B, the first mold insulating layer ILD1 may be formed between the second mold insulating layers ILD2. The first mold insulating layer ILD1 may fill the space from which the sacrificial insulating layer ILD_SC is removed. Next, a fourth sacrificial pattern SDP4 is formed in the sixth hole TH6.

Figure 55B:
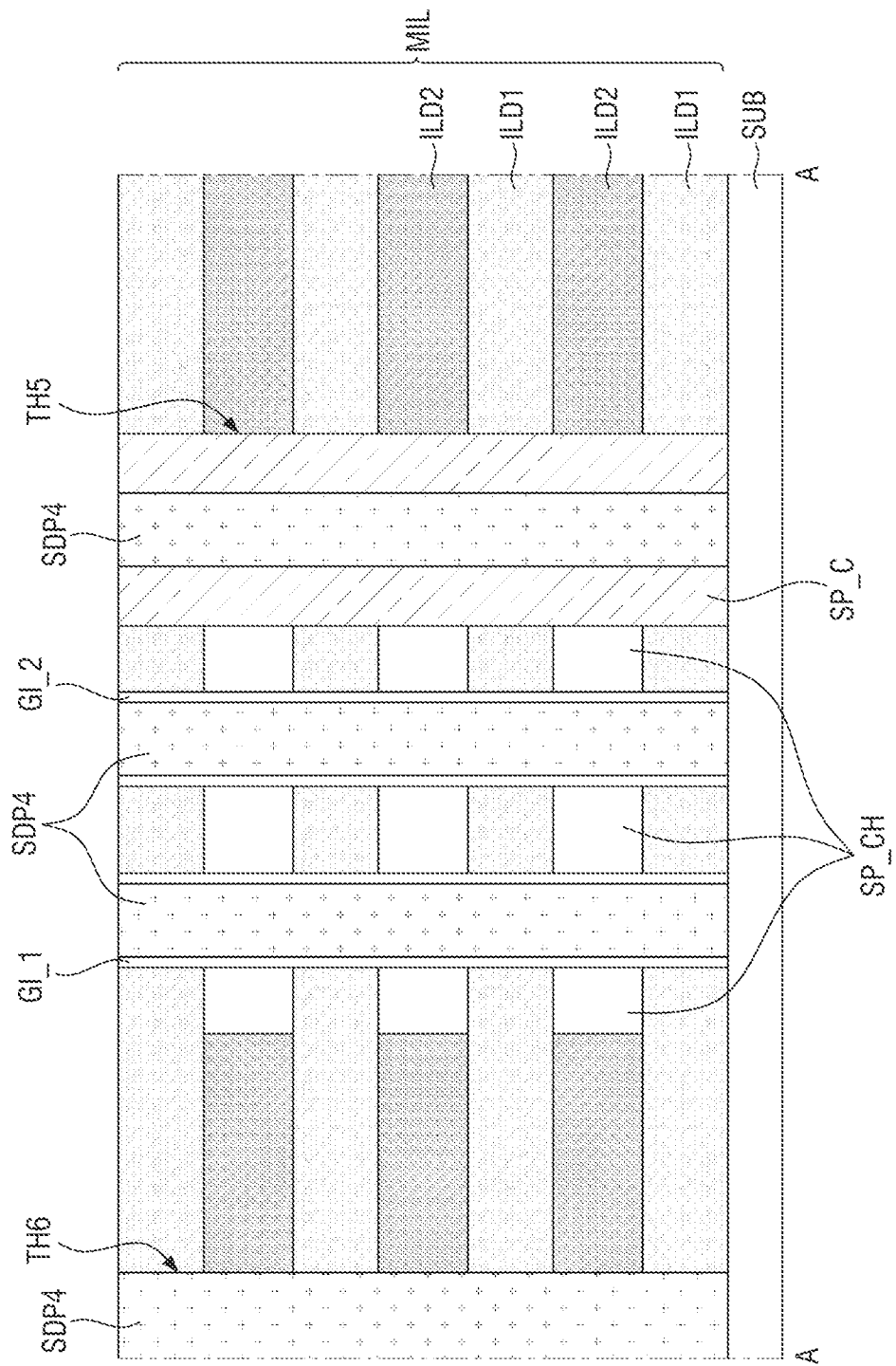

Referring to FIG. 55A and FIG. 55B, the third sacrificial pattern SDP3 in the fifth hole TH5 is removed. A second impurity region SP_C may be formed in the fifth hole TH5 from which the third sacrificial pattern SDP3 is removed. In a viewpoint of a plan view, the second impurity region SP_C may have a closed loop shape. Next, a fourth sacrificial pattern SDP4 that fills the space defined by the second impurity region SP_C is formed.

Figure 56B:
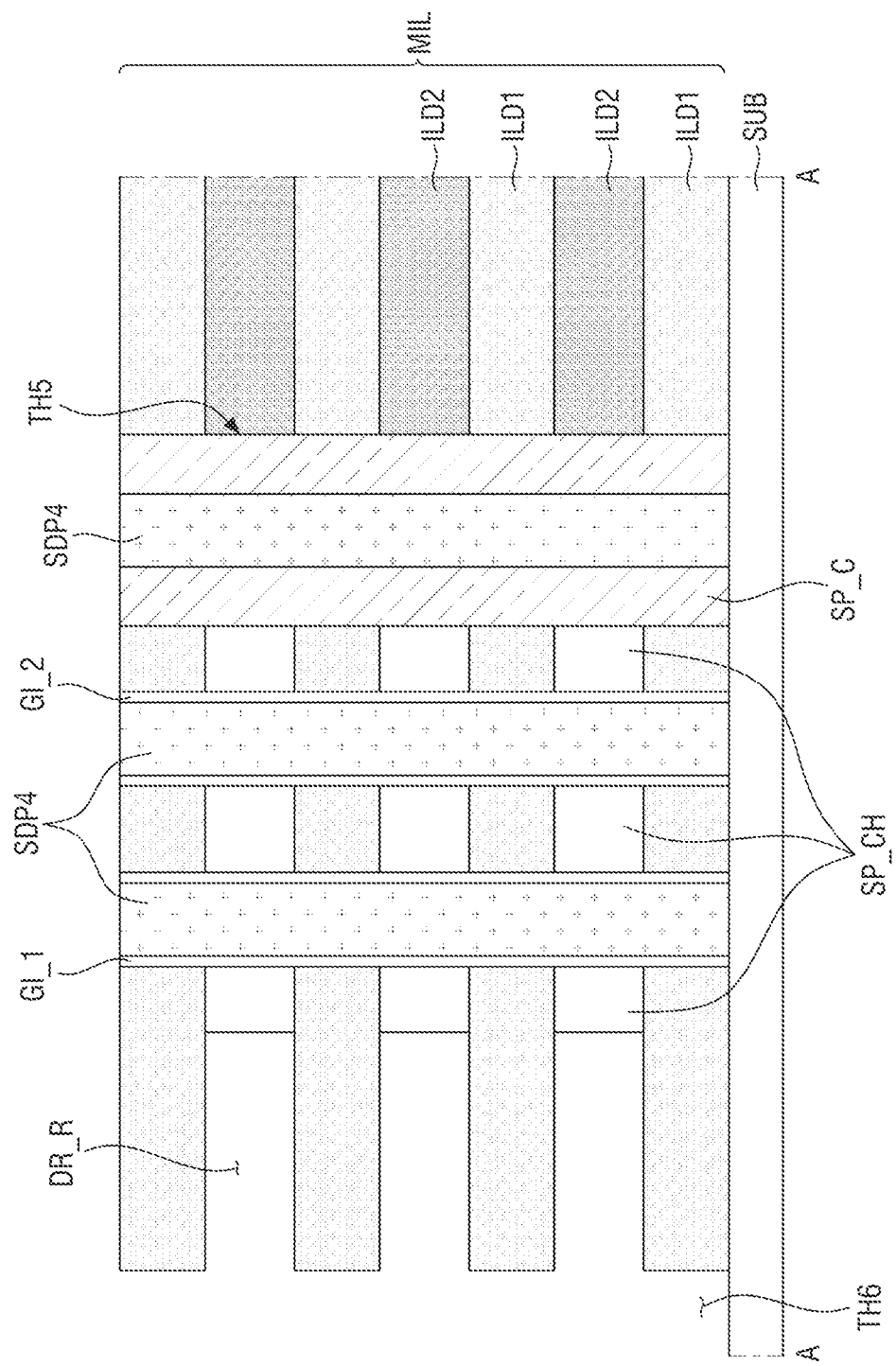

Referring to FIGS. 56A and 56B, the fourth sacrificial pattern SDP4 in the sixth hole TH6 is removed. The drain recess DR_R is formed by removing the second mold insulating layer ILD2 exposed by the sixth hole TH6. The channel pattern SP_CH is exposed by the drain recess DR_R.

Figure 57A:
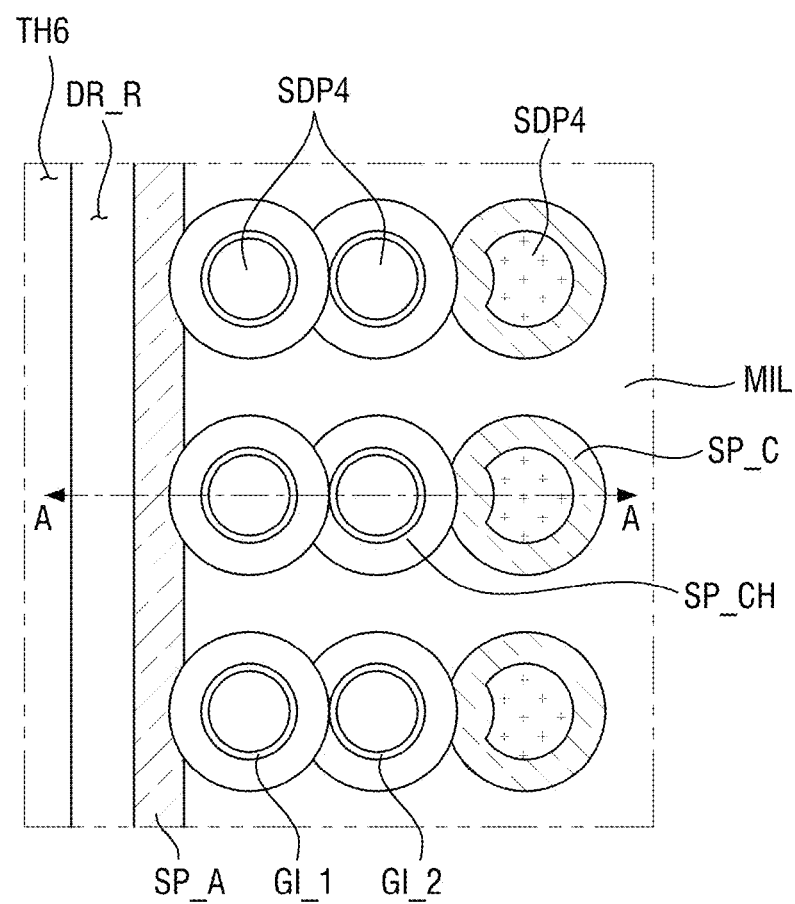
Figure 57B:
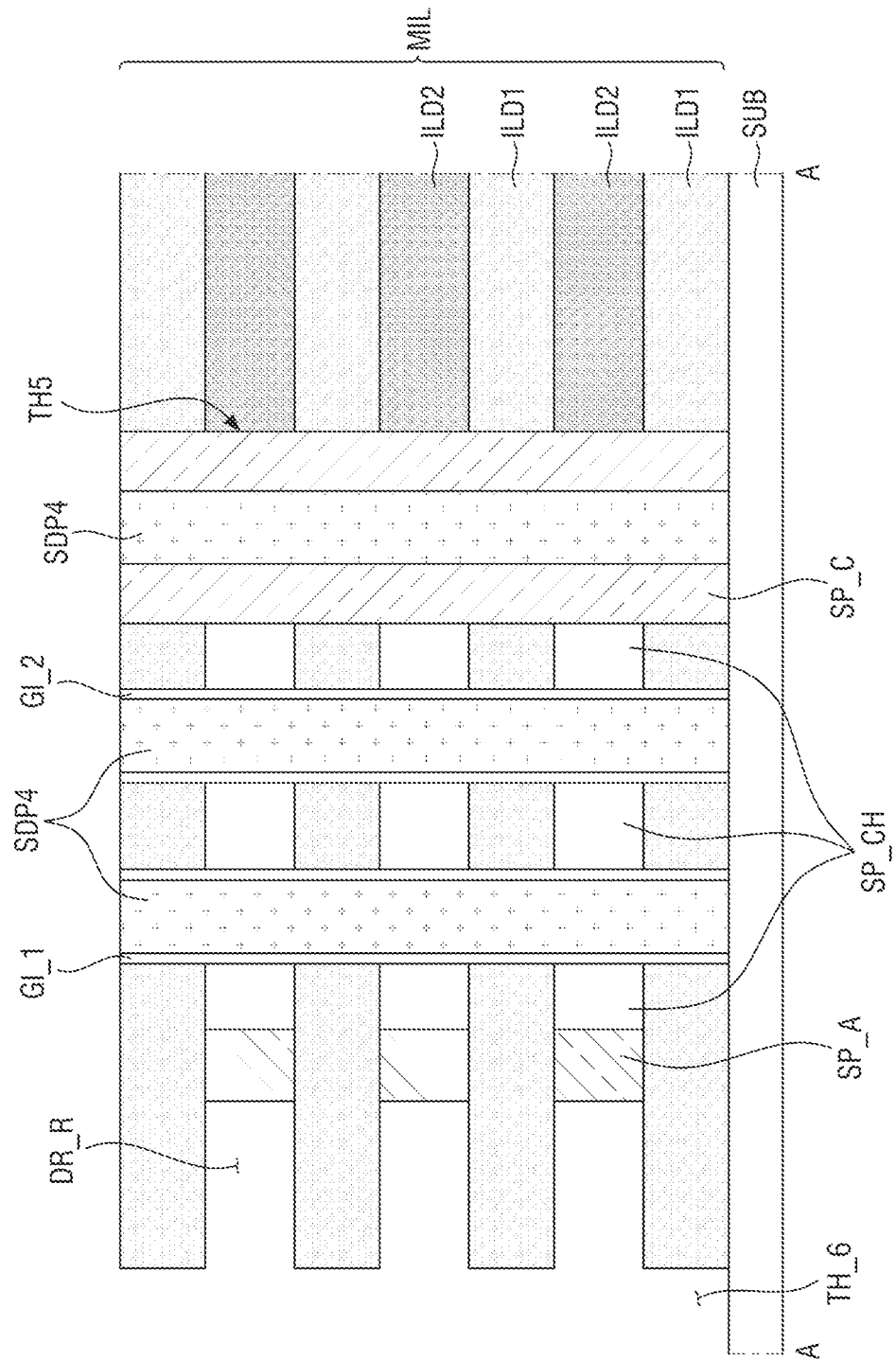

Referring to FIGS. 57A and 57B, the first impurity region SP_A that fills a part of the drain recess DR_R is formed. The first impurity region SP_A is in contact with the channel region SP_CH.

In FIG. 16, after removing the fourth sacrificial pattern SDP4 surrounded by the channel region SP_CH and the second impurity region SP_C, the first and second gate electrodes GE1 and GE2, and the first and second conductive connection lines EL_A and EL_C are formed.

FIGS. 58 to 63 are intermediate stage diagrams for explaining a method for fabricating a semiconductor memory device according to some example embodiments.

Referring to FIG. 58, an element separation layer DTI extending in the fourth direction D4 is formed in the substrate SUB.

Figure 59A:
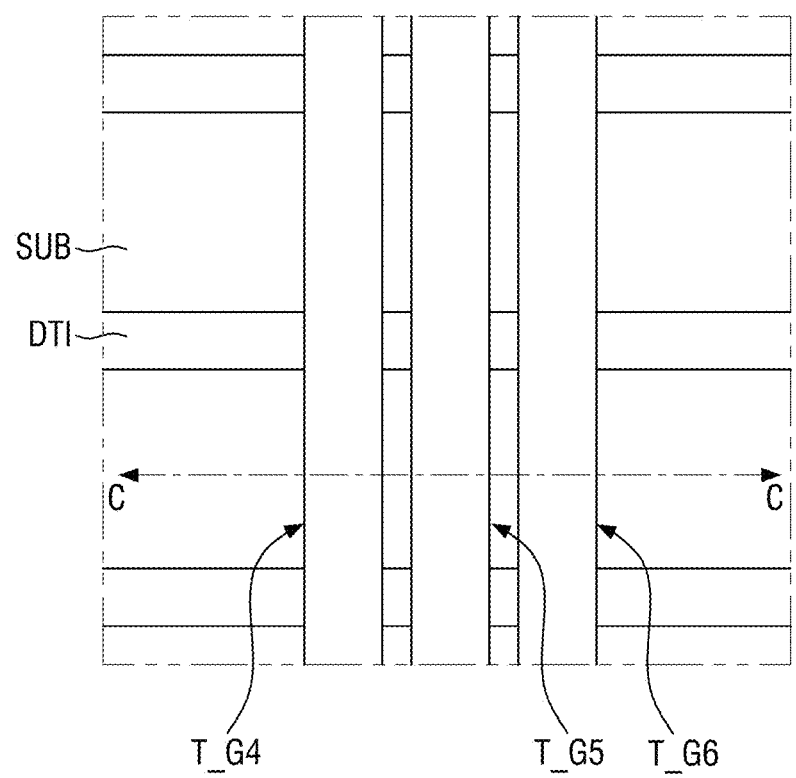
Figure 59B:
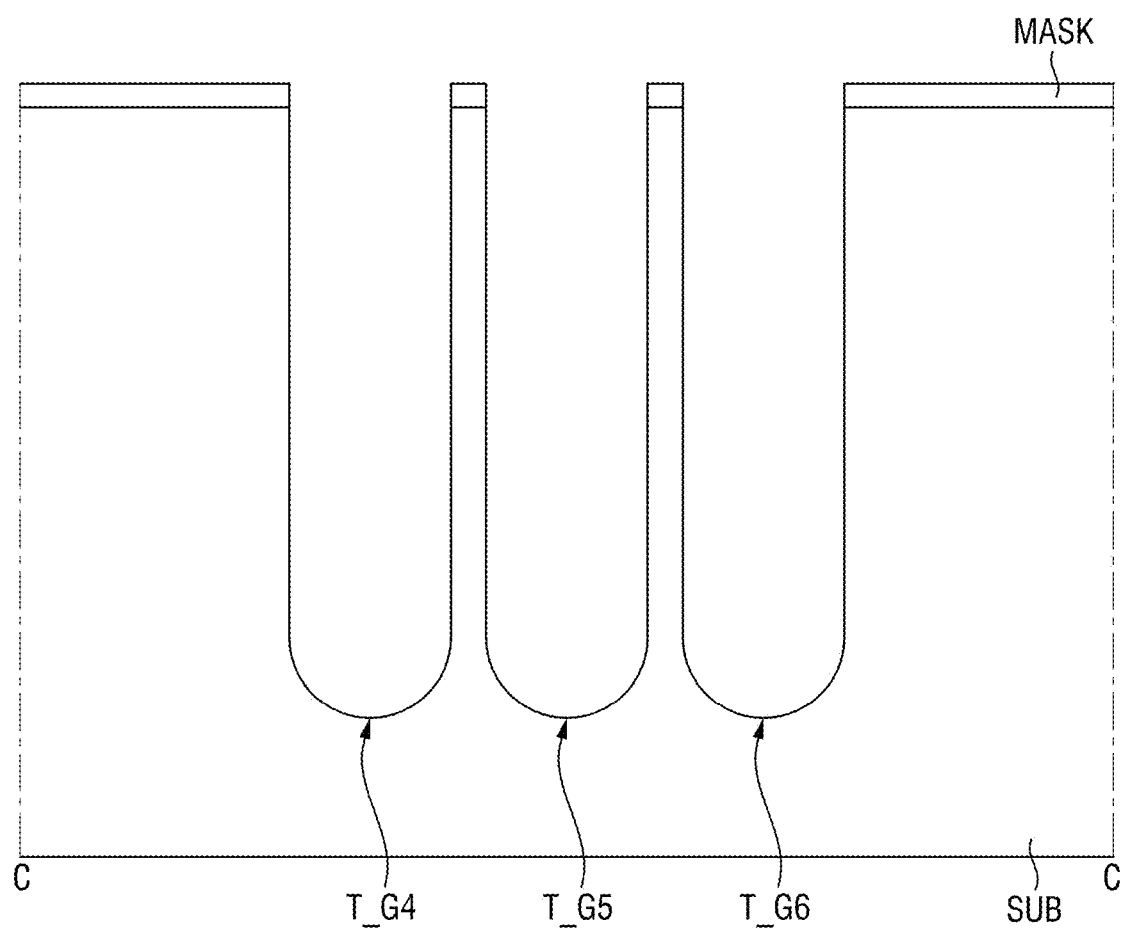

Referring to FIGS. 59A and 59B, fourth to sixth gate trenches T_G4, T_G5 and T_G6 are formed in the substrate SUB, using a mask MASK formed on the substrate SUB. The fourth to sixth gate trenches T_G4, T_G5 and T_G6 may extend in the fifth direction D5, respectively. The fourth to sixth gate trenches T_G4, T_G5 and T_G6 may also be formed in the element separation layer DTI.

Figure 60:
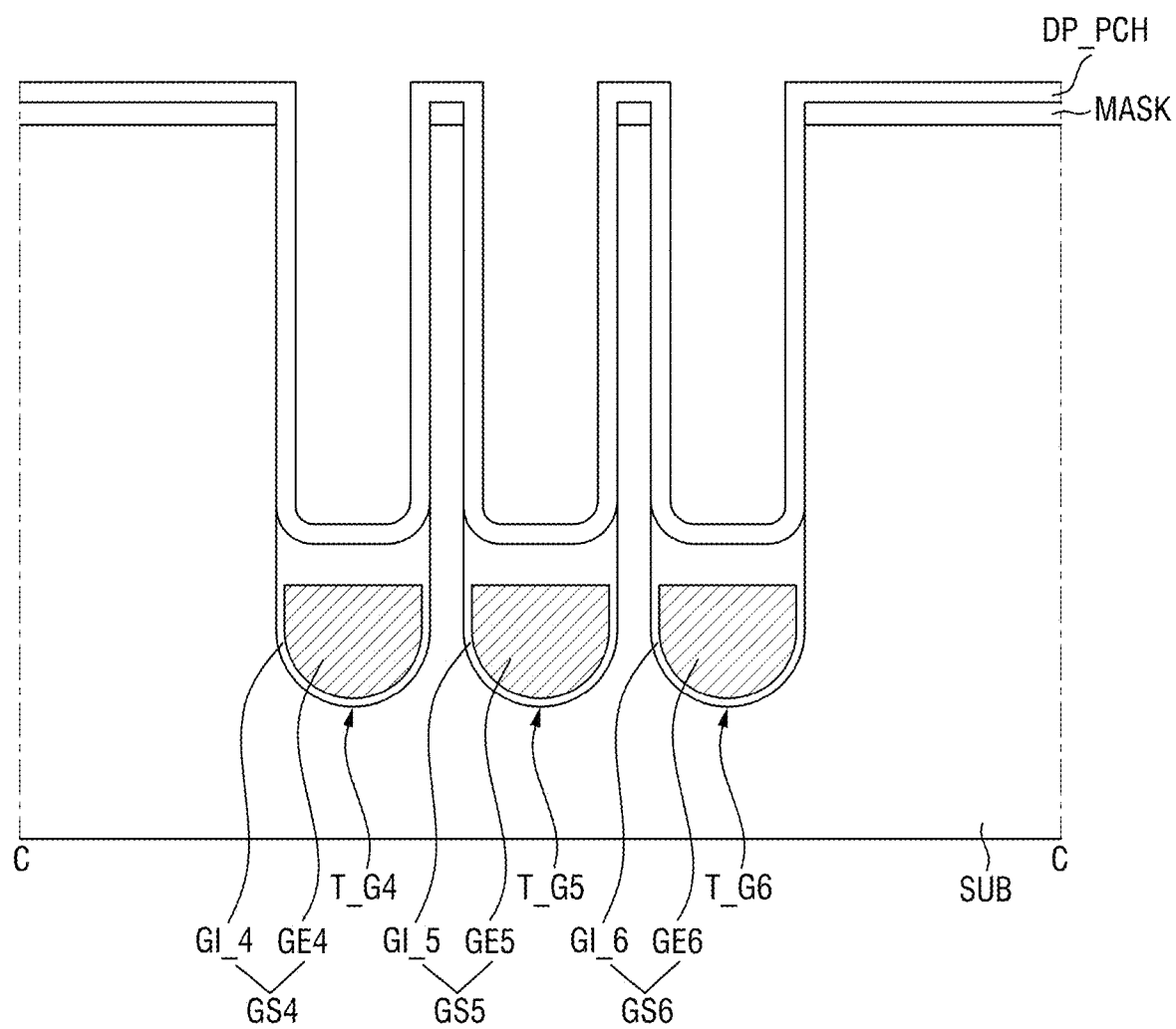

Referring to FIG. 60, fourth to sixth gate structures GS4, GS5 and GS6 may be formed in the fourth to sixth gate trenches T_G4, T_G5 and T_G6. Fourth to sixth gate electrodes GE4, GE5 and GE6 may be formed on the fourth to sixth gate insulating films GI_4, GI_5 and GI_6. Subsequently, some of the fourth to sixth gate insulating films GI_4, GI_5 and GI_6, and some of the fourth to sixth gate electrodes GE4, GE5 and GE6 are removed. Subsequently, fourth to sixth gate insulating films GI_4, GI_5 and GI_6 may be additionally formed on the exposed fourth to sixth gate electrodes GE4, GE5 and GE6.

The fourth gate structure GS4 fills a part of the fourth gate trench T_G4. The fifth gate structure GS5 fills apart of the fifth gate trench T_G5. The sixth gate structure GS6 fills a part of the sixth gate trench T_G6. Next, a pre-semiconductor film DP_PCH extending along the side walls of the fourth to sixth gate trenches T_G4, T_G5 and T_G6 and the top surfaces of the fourth to sixth gate structures GS4, GS5 and GS6 is formed.

Figure 61:
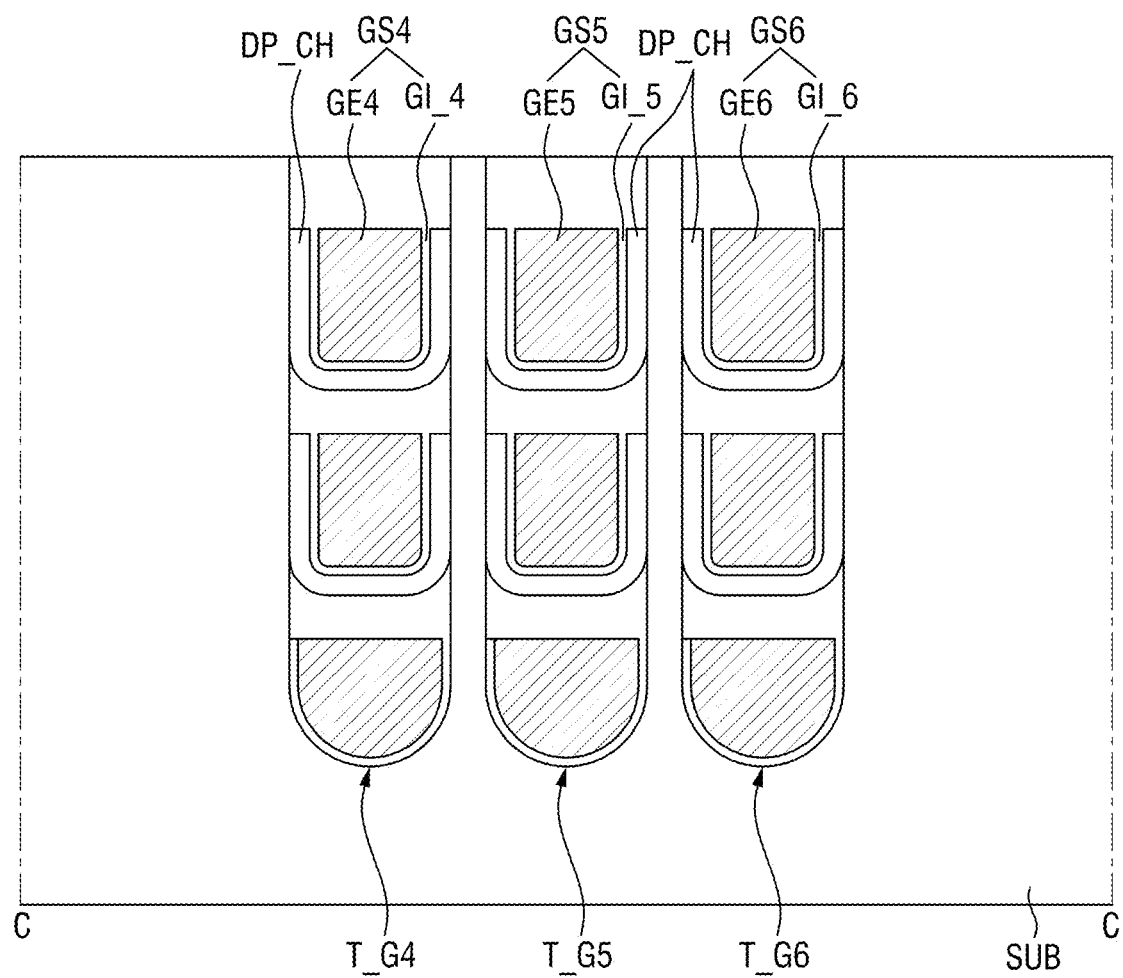

Referring to FIG. 61, the fourth to sixth gate insulating films GI_4, GI_5 and GI_6 and the fourth to sixth gate electrodes GE4, GE5 and GE6 may be formed on the pre-semiconductor film DP_PCH. Subsequently, some of the pre-semiconductor film DP_PCH, the fourth to sixth gate insulating films GI_4, GI_5 and GI_6, and the fourth to sixth gate electrodes GE4, GE5 and GE6 may be removed. Fourth to sixth gate insulating films GI_4, GI_5 and GI_6 may be additionally formed on the exposed fourth to sixth gate electrodes GE4, GE5 and GE6. By repeating the aforementioned process, the fourth to sixth gate structures GS4, GS5 and GS6 stacked in the third direction D3, and the deposited semiconductor film DP_CH may be formed in the fourth to sixth gate trenches T_G4, T_G5 and T_G6. Subsequently, the mask MASK on the substrate SUB may be removed.

Figure 62:
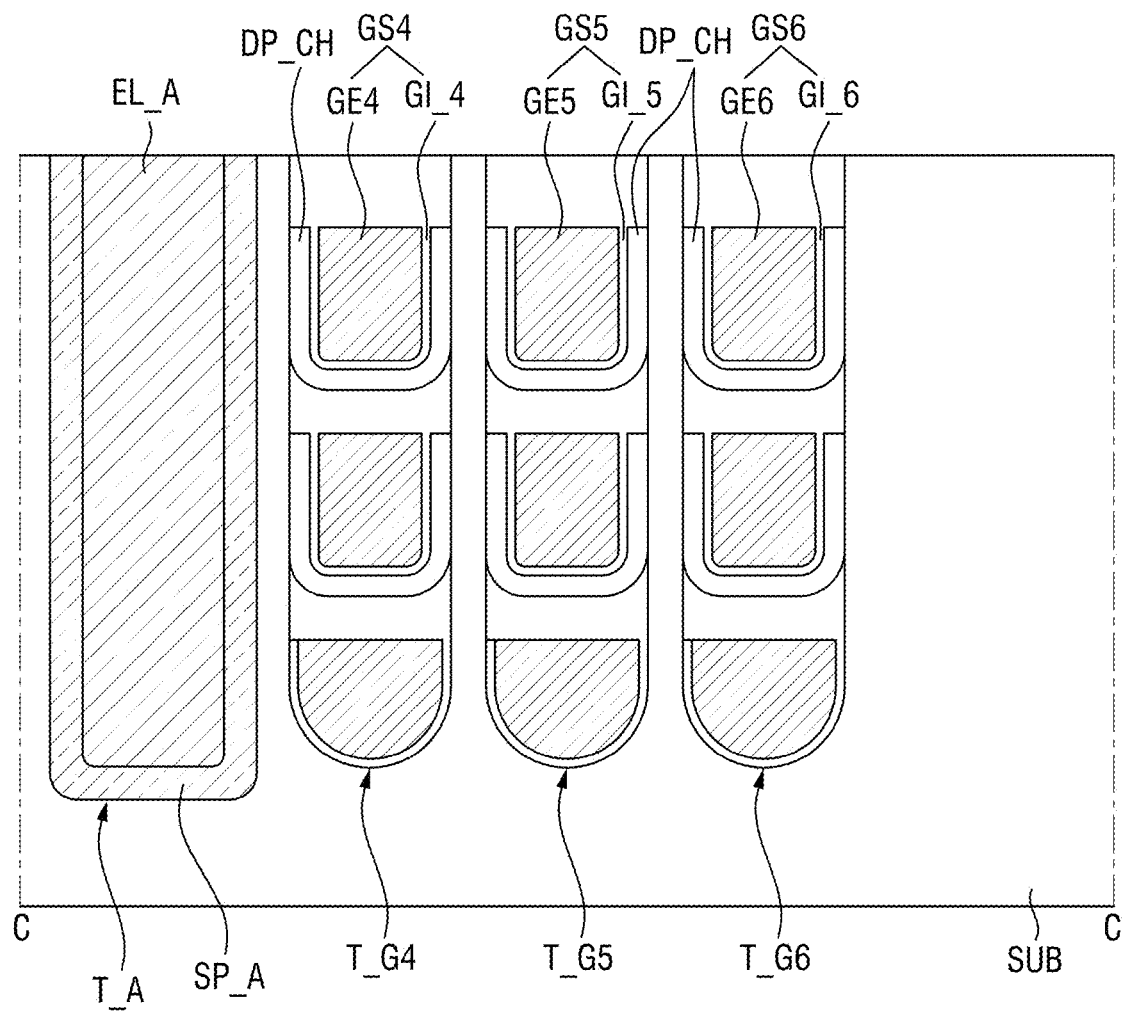

Referring to FIG. 62, the anode hole T_A is formed in the substrate SUB. The first impurity region SP_A is formed along the sidewall and bottom surface of the anode hole T_A. A first conductive connection line EL_A that fills the anode hole T_A is formed on the first impurity region SP_A.

Figure 63:
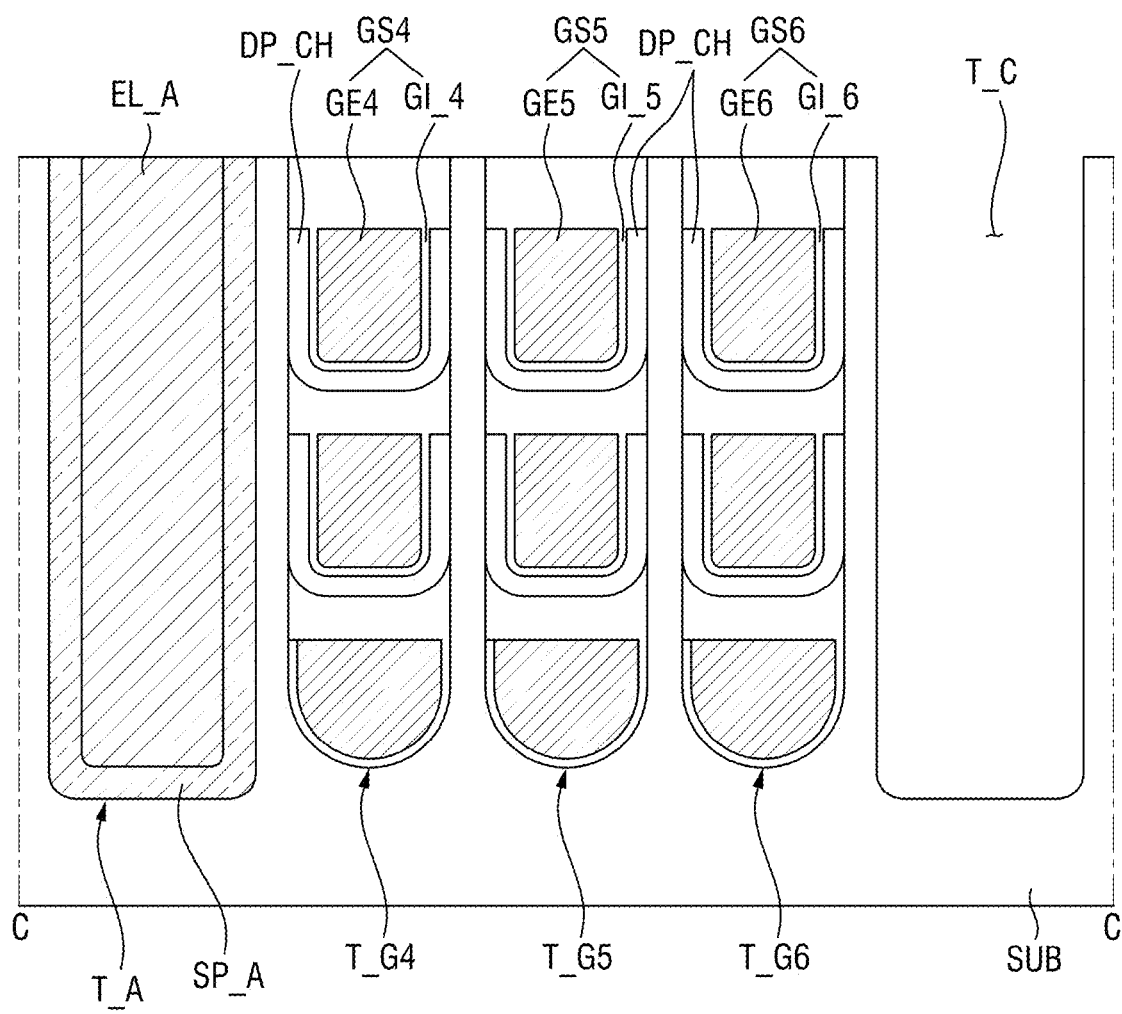

Referring to FIG. 63, a cathode trench T_C is formed in the substrate SUB.

Next, the second impurity region SP_C is formed along the sidewall and bottom surface of the cathode trench T_C. A second conductive connection line EL_C that fills the cathode trench T_C is formed on the second impurity region SP_C.

In concluding the detailed description, those skilled in the art will appreciate that many variations and modifications may be made to the preferred embodiments without substantially departing from the principles of example embodiments. Therefore, the disclosed preferred embodiments of the disclosure are used in a generic and descriptive sense only and not for purposes of limitation.

What is claimed is:

1. A semiconductor memory device comprising:
   a first semiconductor pattern including a first impurity region, a second impurity region and a channel region, the first impurity region spaced apart from a substrate in a first direction and having a first conductivity type, the second impurity region having a second conductivity type different from the first conductivity type, and the channel region between the first impurity region and the second impurity region;
   a first conductive connection line connected to the first impurity region and extending in a second direction different from the first direction; and
   a first gate structure extending in the first direction and including a first gate electrode and a first gate insulating film,
   wherein the first gate electrode penetrates the channel region, and
   the first gate insulating film is between the first gate electrode and the first semiconductor pattern.

2. The semiconductor memory device of claim 1, further comprising:
   a second gate structure penetrating the channel region and including a second gate electrode and a second gate insulating film.

3. The semiconductor memory device of claim 2, further comprising:
   a third gate structure penetrating the channel region and including a third gate electrode and a third gate insulating film.

4. The semiconductor memory device of claim 1, further comprising:
   a second conductive connection line penetrating the second impurity region,
   the second conductive connection line contacting the first semiconductor pattern.

5. The semiconductor memory device of claim 1, further comprising:
   a conductive plate electrode connected to the second impurity region,
   the conductive plate electrode contacting one end of the first semiconductor pattern.

6. The semiconductor memory device of claim 1, further comprising:
   a second semiconductor pattern spaced apart from the first semiconductor pattern in the second direction and connected to the first conductive connection line,
   the second semiconductor pattern contacting the second impurity region and the channel region, the contacting of the second impurity region and the channel region being through the first impurity region.

7. The semiconductor memory device of claim 1, further comprising:
   a second semiconductor pattern spaced apart from the first semiconductor pattern in the second direction and connected to the first conductive connection line; and
   an air gap between the first semiconductor pattern and the second semiconductor pattern.

8. The semiconductor memory device of claim 1, further comprising:
   a shielding pattern extending along the channel region and the second impurity region in a third direction different from the first direction and the second direction,
   the shielding pattern including a conductive material.

9. The semiconductor memory device of claim 8, wherein the shielding pattern is electrically connected to the second impurity region.

10. The semiconductor memory device of claim 1, wherein
    the channel region includes a first base portion having the second conductivity type, and a second base portion having the first conductivity type,
    the first base portion is between the first impurity region and the second base portion,
    a concentration of impurities of the first base portion is less than a concentration of impurities of the second impurity region, and
    a concentration of impurities of the second base portion is less than a concentration of impurities of the first impurity region.

11. A semiconductor memory device comprising:
    a semiconductor pattern includes a first impurity region, a second impurity region and a channel region, the first impurity region spaced apart from a substrate in a first direction and having a first conductivity type, the second impurity region having a second conductivity type different from the first conductivity type, and the channel region between the first impurity region and the second impurity region;
    a first conductive connection line connected to the first impurity region and extending in a second direction different from the first direction; and
    a second conductive connection electrode extending in the first direction, penetrating the second impurity region, and contacting the semiconductor pattern.

12. The semiconductor memory device of claim 11, further comprising:
    one or more gate structures penetrating the channel region and including a gate electrode and a gate insulating film.

13. The semiconductor memory device of claim 12, wherein
    the channel region includes a first base portion having the second conductivity type, and a second base portion having the first conductivity type,
    the first base portion is between the first impurity region and the second base portion,
    a concentration of impurities of the first base portion is less than a concentration of impurities of the second impurity region, and
    a concentration of impurities of the second base portion is less than a concentration of impurities of the first impurity region.

14. The semiconductor memory device of claim 12, wherein the channel region includes an undoped semiconductor material.

15. The semiconductor memory device of claim 11, wherein
the channel region includes a first base portion having the second conductivity type, and a second base portion having the first conductivity type,
the first base portion is between the first impurity region and the second base portion,
a concentration of impurities of the first base portion is less than a concentration of impurities of the second impurity region,
a concentration of impurities of the second base portion is less than a concentration of impurities of the first impurity region,
the semiconductor memory device does not include a gate electrode penetrating the channel region.

16. A semiconductor memory device comprising:
a peripheral circuit region on a substrate; and
a cell array region stacked on the peripheral circuit region in a first direction,
wherein the peripheral circuit region includes a peripheral circuit configured to control the cell array region,
wherein the cell array region includes:
a plurality of semiconductor patterns stacked on the substrate in the first direction, each of the plurality of semiconductor patterns includes a first impurity region having a first conductivity type, a second impurity region having a second conductivity type different from the first conductivity type, and a channel region between the first impurity region and the second impurity region,
a first conductive connection line connected to the first impurity region and extending in a second direction different from the first direction, and
a first gate structure extending in the first direction and including a gate electrode and a gate insulating film,
wherein each of the first conductive connection line and the gate electrode of the first gate structure is in contact with the peripheral circuit of the peripheral circuit region, and
wherein the gate electrode of the first gate structure penetrates the channel region of each of the plurality of semiconductor patterns.

17. The semiconductor memory device of claim 16, further comprising:
a second conductive connection line penetrating the second impurity region,
the second conductive connection line contacting the semiconductor pattern.

18. The semiconductor memory device of claim 16, further comprising:
a conductive plate electrode connected to the second impurity region,
the conductive plate electrode contacting one end of the semiconductor pattern.

19. The semiconductor memory device of claim 16, wherein the peripheral circuit region is between the substrate and the cell array region.

20. The semiconductor memory device of claim 16, wherein the cell array region is between the substrate and the peripheral circuit region.

* * * * *